US008854033B2

(12) United States Patent
Shiraki et al.

(10) Patent No.: US 8,854,033 B2
(45) Date of Patent: Oct. 7, 2014

(54) CURRENT SENSOR, INVERTER CIRCUIT, AND SEMICONDUCTOR DEVICE HAVING THE SAME

(75) Inventors: Satoshi Shiraki, Toyohashi (JP); Norihito Tokura, Okazaki (JP); Shigeki Takahashi, Okazaki (JP); Masahiro Yamamoto, Kasugai (JP); Akira Yamada, Nukata-gun (JP); Hiroyasu Kudo, Ichinomiya (JP); Youichi Ashida, Nukata-gun (JP); Akio Nakagawa, Chigasaki (JP)

(73) Assignee: DENSO CORPORATION, Kariya (JP)

( * ) Notice: Subject to any disclaimer, the term of this patent is extended or adjusted under 35 U.S.C. 154(b) by 299 days.

(21) Appl. No.: 13/150,764

(22) Filed: Jun. 1, 2011

(65) Prior Publication Data

US 2011/0298446 A1     Dec. 8, 2011

(30) Foreign Application Priority Data

Jun. 4, 2010  (JP) ................................. 2010-129319
Jan. 27, 2011 (JP) ................................. 2011-15345
Feb. 10, 2011 (JP) ................................. 2011-27411

(51) Int. Cl.
*G01R 1/20* (2006.01)

(52) U.S. Cl.
USPC 324/126; 257/48; 257/E29.166; 257/E29.197; 324/207.13; 324/207.2; 324/207.21; 324/207.22; 324/242

(58) Field of Classification Search
USPC .................. 324/126, 207.13, 207.2, 207.21, 324/207.22, 242, 243, 260; 257/48, 257/E29.166, E29.197
See application file for complete search history.

(56) References Cited

U.S. PATENT DOCUMENTS

| | | | |
|---|---|---|---|
| 5,253,156 A | 10/1993 | Sakurai et al. | |
| 5,375,028 A | 12/1994 | Fukunaga | |
| 5,491,357 A * | 2/1996 | Zambrano | 257/337 |
| 5,886,515 A | 3/1999 | Kelly | |
| 5,942,886 A | 8/1999 | Kelly | |
| 6,642,599 B1 | 11/2003 | Watabe et al. | |

(Continued)

FOREIGN PATENT DOCUMENTS

| | | |
|---|---|---|
| JP | B2-6-85620 | 4/1990 |
| JP | H07-058326 A | 3/1995 |

(Continued)

OTHER PUBLICATIONS

Office Action mailed Aug. 28, 2013 in the corresponding CN application No. 201110154131.1 (English translation).
Office Action mailed Jan. 7, 2014 in the corresponding JP application No. 2010-129319 (English translation).

(Continued)

*Primary Examiner* — Huy Q Phan
*Assistant Examiner* — Temilade S Rhodes-Vivour
(74) *Attorney, Agent, or Firm* — Posz Law Group, PLC

(57) ABSTRACT

A semiconductor device having a lateral semiconductor element includes a semiconductor substrate, a first electrode on the substrate, a second electrode on the substrate, and an isolation structure located in the substrate to divide the substrate into a first island and a second island electrically insulated from the first island. The lateral semiconductor element includes a main cell located in the first island and a sense cell located in the second island. The main cell causes a first current to flow between the first electrode and the second electrode so that the first current flows in a lateral direction along the surface of the substrate. The first current is detected by detecting a second current flowing though the sense cell.

28 Claims, 32 Drawing Sheets

(56) References Cited

U.S. PATENT DOCUMENTS

| | | |
|---|---|---|
| 2003/0227730 A1 | 12/2003 | Iimura et al. |
| 2008/0203533 A1* | 8/2008 | Kaneko et al. ............ 257/566 |
| 2008/0246426 A1 | 10/2008 | Aoki et al. |
| 2009/0057832 A1* | 3/2009 | Kouno ...................... 257/577 |
| 2010/0230766 A1* | 9/2010 | Elian et al. ................ 257/414 |
| 2010/0301412 A1* | 12/2010 | Parthasarathy et al. ...... 257/337 |
| 2011/0089931 A1* | 4/2011 | Podlisk et al. ............. 324/126 |
| 2011/0210329 A1* | 9/2011 | Chen ........................... 257/48 |
| 2011/0210956 A1* | 9/2011 | Girdhar et al. ............. 345/212 |
| 2012/0306012 A1 | 12/2012 | Parthasarathy et al. |
| 2013/0207192 A1 | 8/2013 | Parthasarathy et al. |

FOREIGN PATENT DOCUMENTS

| | | |
|---|---|---|
| JP | 2000-134955 A | 5/2000 |
| JP | A-2004-64860 | 2/2004 |
| JP | A-2007-37215 | 2/2007 |
| JP | 2010-109344 A | 5/2010 |

OTHER PUBLICATIONS

Office Action mailed Jul. 7, 2014 issued in corresponding JP patent application No. 2011-015345 (and English translation).

Office Action mailed Apr. 8, 2014 issued in corresponding JP patent application No. 2011-027411 (and English translation).

* cited by examiner

POSITIVE   ZERO

ZERO   NEGATIVE

ZERO   ZERO

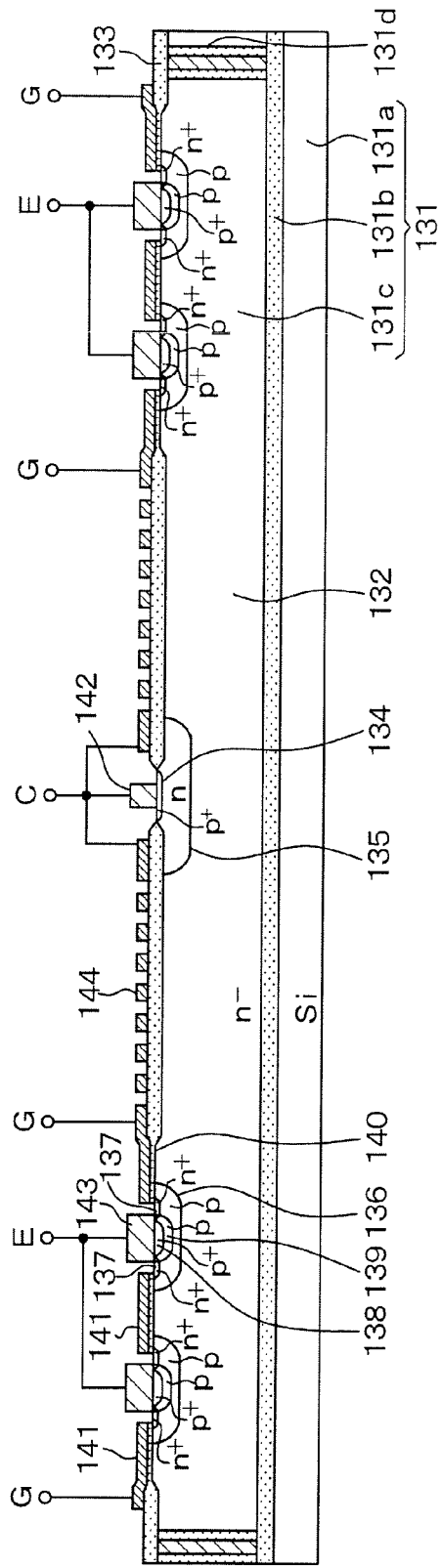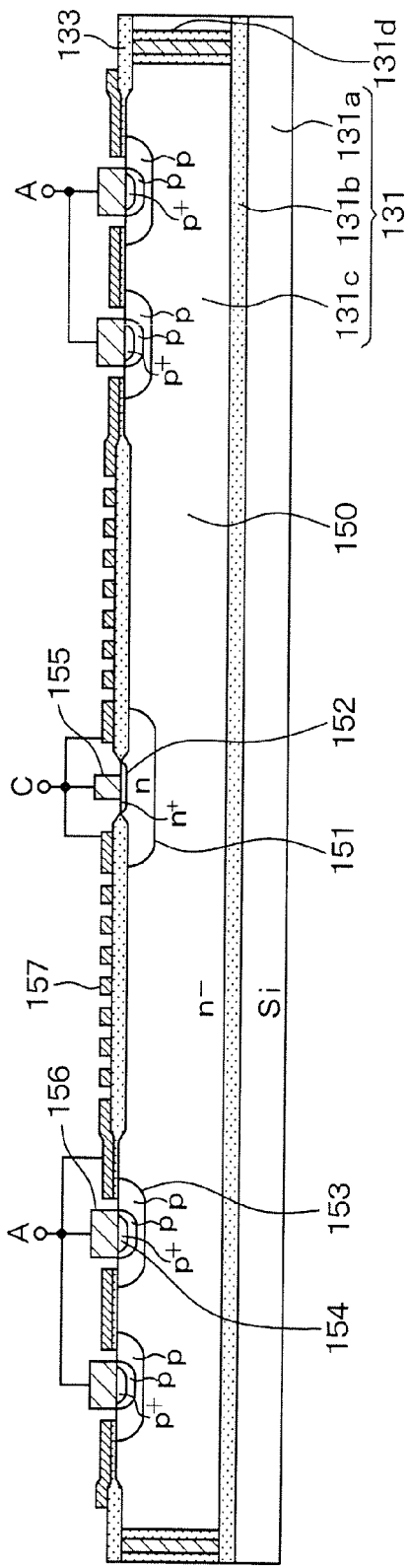

POSITIVE    ZERO

ZERO    NEGATIVE

ZERO    ZERO

CURRENT SENSOR, INVERTER CIRCUIT, AND SEMICONDUCTOR DEVICE HAVING THE SAME

CROSS REFERENCE TO RELATED APPLICATION

This application is based on and claims priority to Japanese Patent Application No. 2010-129319 filed on Jun. 4, 2010, No. 2011-15345 filed on Jan. 27, 2011, and No. 2011-27411 filed on Feb. 10, 2011, the contents of which are incorporated herein by reference.

FIELD OF THE INVENTION

The present invention relates to a semiconductor device having a main cell and a sense cell for detecting an electric current flowing through the main cell.

BACKGROUND OF THE INVENTION

U.S. Pat. No. 5,253,156 corresponding to JP-A-8-34709 discloses a semiconductor integrated circuit including a main cell having a lateral insulated gate bipolar transistor (IGBT) and a current detector (hereafter referred to as "sense cell") for detecting an electric current flowing through an emitter of the IGBT. The sense cell has a lateral IGBT with the same structure as the lateral IGBT of the main cell except the length of the emitter. The IGBTs are coupled in a current mirror configuration so that an electric current flowing through the emitter of the IGBT of the sense cell becomes smaller than the electric current flowing through the emitter of the IGBT of the main cell by a predetermined ratio that depends on the ratio between the lengths of the emitters. Thus, the current flowing through the main cell can be detected based on the current flowing through the sense cell.

However, when the semiconductor integrated circuit disclosed in U.S. Pat. No. 5,253,156 is used to form a circuit shown in FIG. 14, the following disadvantages may occur.

In the circuit shown in FIG. 14, an electric current flowing through a main cell 1000 is detected based on an electric current flowing through a sense cell 1001, and the electric current flowing through the sense cell 1001 is detected based on a voltage across a resistor Rs. When a resistance of the resistor Rs is increased to increase the voltage, an emitter potential of the sense cell 1001 is increased. Accordingly, a potential of a p-type body layer, which is electrically connected to an emitter electrode, is increased. As a result, a PN junction between the p-type body layer and an n⁻-type drift layer is forward biased, an output (i.e., the voltage across the resistor Rs) becomes unstable. In order to stabilize the output voltage, it is preferable that the output voltage should be limited up to 0.3 volts (V). Further, when a high voltage (e.g., from 200V to 600V) is applied to a collector, the output voltage can have an error due to a coupling with the high voltage.

Such a problem can occur in a semiconductor element other than an IGBT.

By the way, such a circuit shown in FIG. 14 is used to form an inverter circuit. For example, US 2009/0057832 corresponding to JP-A-2009-268054 discloses a method for detecting a current in the inverter circuit by using a shunt resistor. The method disclosed in US 2008/0246426 is directed to detect a value of the current, not a direction of the current. It is preferable to detect not only the value of the current, but also the direction of the current in order to perform sensorless sinusoidal control of the current as disclosed in US 2008/0246426 corresponding to JP 4396762.

SUMMARY OF THE INVENTION

In view of the above, it is an object of the present invention to provide a semiconductor device having an inverter circuit and a current sensor for detecting value and direction of an electric current.

According to a first aspect of the present invention, a semiconductor device with a lateral semiconductor element includes a semiconductor substrate, a first electrode on a surface of the substrate, a second electrode on the surface of the substrate, and an isolation structure located in the substrate to divide the substrate into a first island and a second island. The first and second islands are electrically insulated from the each other by the isolation structure. The lateral semiconductor element includes a main cell located in the first island and a sense cell located in the second island. The main cell causes a first current to flow between the first electrode and the second electrode so that the first current flows in a lateral direction along the surface of the substrate. The first current is detected by detecting a second current flowing though the sense cell.

According to a second aspect of the present invention, a semiconductor device with a lateral IGBT for controlling supply of an electric current to a load includes a semiconductor substrate having a first conductivity-type drift layer, a second conductivity-type collector region located in a surface portion of the drift layer and having a longitudinal direction, a second conductivity-type channel layer located in the surface portion of the drift layer and having a straight portion extending parallel to the collector region, and an emitter region located in a surface portion of the channel layer and terminated inside the collector region. The emitter region has a straight portion extending in the longitudinal direction. The semiconductor device further includes a gate insulating layer located on a channel region of the channel layer. The channel region is located between the emitter region and the drift layer. The semiconductor device further includes a gate electrode located on the gate insulating layer, a first electrode electrically connected to the collector region, and a second electrode electrically connected to the emitter region and the channel layer. The emitter region is divided to form a main cell and a sense cell, each of which has the lateral IGBT. The lateral IGBT of the main cell is configured to control the supply of the electric current to the load. The lateral IGBT of the sense cell is identical in structure to the lateral IGBT of the main cell and configured as a current detector. The main cell is located on each side of the sense cell so that the sense cell is located in the main cell in the longitudinal direction.

According to a third aspect of the present invention, a current sensor for detecting an electric current in a current path connected to a load includes a power element located in the current path and turned ON and OFF to control the electric current. The electric current flows through the power element in a forward direction, when the power element is turned ON. The current sensor further includes a freewheeling diode located in the current path and connected in antiparallel with the power element. The electric current flows through the freewheeling diode in a backward direction, when the power element is turned OFF from ON. The current sensor further includes a first sense cell connected to the power element in such a manner that the electric current flowing through the first sense cell is in proportional to the electric current flowing through the power element. The current sensor further includes a first sense resistor connected in series with the first sense cell. The current sensor further includes a second sense cell connected to the freewheeling diode in such a manner that the electric current flowing through the second sense cell is in proportional to the electric current flowing through the freewheeling diode. The current sensor further includes a second sense resistor connected in series with the second sense cell.

BRIEF DESCRIPTION OF THE DRAWINGS

The above and other objects, features, and advantages will become more apparent from the following description and drawings in which like reference numerals depict like elements. In the drawings:

FIG. 24A is a diagram illustrating a cross-sectional view taken along the line XXIVA-XXIVA in FIG. 23, and FIG. 24B is a diagram illustrating a cross-sectional view taken along the line XXIVB-XXIVB in FIG. 23;

DETAILED DESCRIPTION OF THE PREFERRED EMBODIMENTS

First Embodiment

A semiconductor device having a lateral insulated gate bipolar transistor (IGBT) according to a first embodiment of the present invention is described below with reference to FIGS. 1 and 2.

Figure 1:
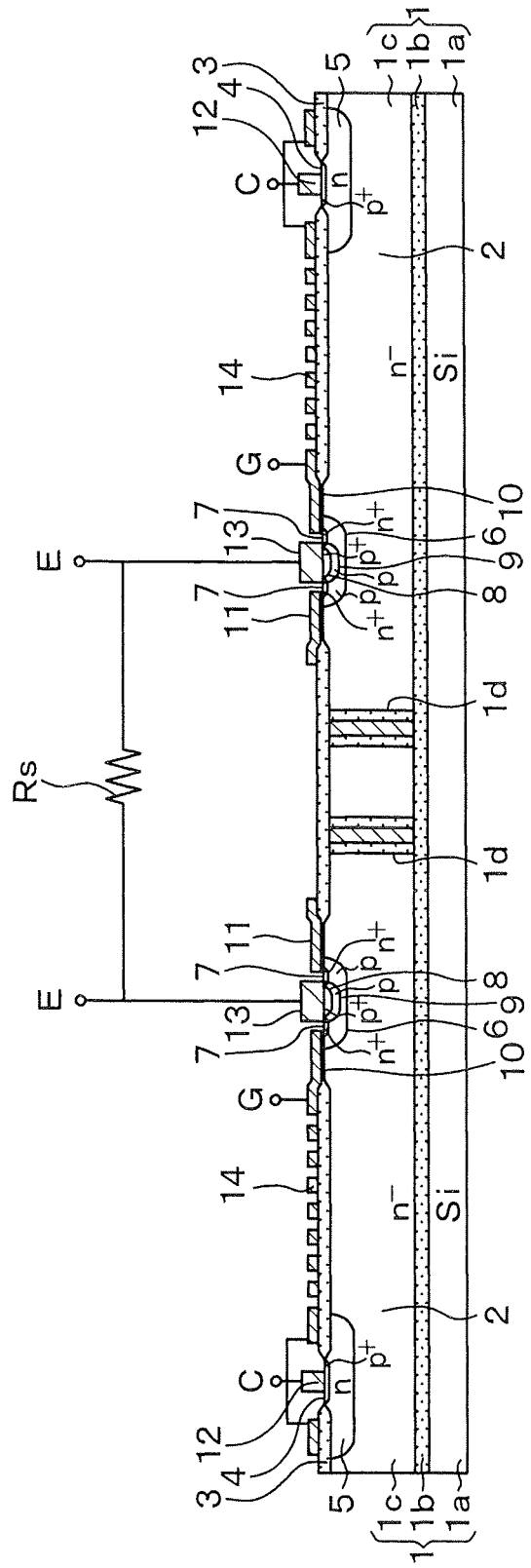
FIG. 1 is a diagram illustrating a cross-sectional view taken along the line I-I in FIG. 2.
Figure 2:
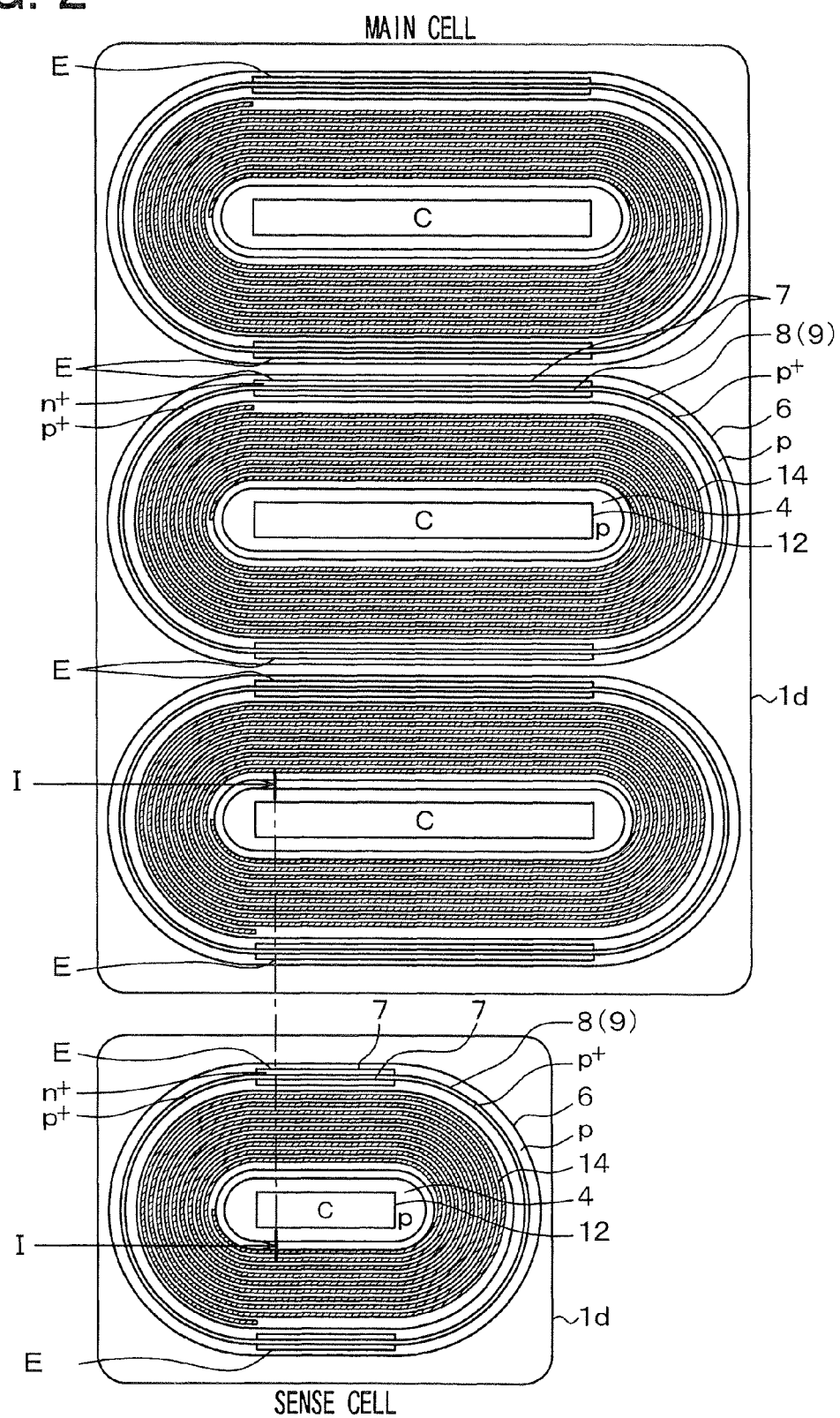
FIG. 2 is a diagram illustrating a top view of a semiconductor device according to a first embodiment of the present invention.

FIG. 1 is a cross-sectional view taken along the line I-I in FIG. 2, and FIG. 2 is a top view of the semiconductor device. Although FIG. 2 is not a cross-sectional view, FIG. 2 is partially hatched for ease of understanding.

According to the first embodiment, as shown in FIG. 1, the lateral IGBT is formed by using a silicon-on-insulator (SOI) substrate 1. A main cell and a sense cell are formed in the SOI substrate 1. The main cell has a lateral IGBT that is turned ON and OFF to supply an electric current to an electrical load (not shown) such as a motor. The sense cell has a lateral IGBT for detecting an electric current flowing through the main cell. The IGBT of the sense cell has the same structure as the IGBT of the main cell.

The SOI substrate 1 includes a supporting substrate $1a$, a buried oxide (BOX) layer $1b$ on the supporting substrate $1a$, and an active layer $1c$ on the BOX layer $1b$. For example, the supporting substrate $1a$ can be a silicon substrate. According to the first embodiment, the active layer $1c$ serves as an $n^-$-type drift layer 2. Each part of the lateral IGBTs of the main cell and the sense cell is formed in a surface portion of the drift layer 2.

The thickness of the BOX layer $1b$, and the thickness and the impurity concentration of the active layer $1c$ (i.e., drift layer 2) are not limited to specific values and can vary depending on the intended use of the semiconductor device. For example, in order to achieve high breakdown voltage, it is preferable that the thickness of the BOX layer $1b$ be 4 micrometers (μm) or more. In order to ensure a breakdown voltage of 600V or more, it is preferable that the thickness of the BOX layer 1b be 5 μm or more. In order to ensure the breakdown voltage of 600V or more, it is preferable that the active layer 1c have the n-type impurity concentration of from $1\times10^{14}$ cm$^{-3}$ to $1.2\times10^{15}$ cm$^{-3}$, if the thickness of the active layer 1c is 15 μm or less. In order to ensure the breakdown voltage of 600V or more, it is preferable that the active layer is have the n-type impurity concentration of from $1\times10^{14}$ cm$^{-3}$ to $8\times10^{14}$ cm$^{-3}$, if the thickness of the active layer 1c is 20 μm.

Trench structures 1d are formed in the active layer 1c is to divide the active layer is into multiple islands that are electrically isolated from each other. The main cell and the sense cell are located in different islands and thus electrically insulated from each other. For example, the trench structure 1d can be formed by forming a trench extending through the active layer 1c is to the BOX layer 1b, by forming an oxide layer on an inner surface of the trench by thermal oxidation, and then by filling the trench with polysilicon or the like.

A LOCOS (LOCal Oxidation of Silicon) oxide layer 3 is formed on a surface of the drift layer 2. The parts of the lateral IGBT are electrically insulated from each other by the LOCOS oxide layer 3. A p$^+$-type collector region 4 is formed in the surface portion of the drift layer 2 and exposed outside the LOCOS oxide layer 3. The collector region 4 has a longitudinal direction parallel to a surface of the SOI substrate 1. The collector region 4 is surrounded by an n-type buffer layer 5. The buffer layer 5 has an impurity concentration greater than that of the drift layer 2.

A p-channel well layer 6, an n$^+$-type emitter region 7, a p$^+$-type contact layer 8, and a p-type body layer 9 are formed in the surface portion of the drift layer 2 and exposed outside the LOCOS oxide layer 3. The well layer 6, the emitter region 7, the contact layer 8, and the body layer 9 are arranged around the collector region 4.

A surface portion of the well layer 6 serves as a channel region. For example, the well layer 6 can have a thickness of 2 μm or less and a width of 6 μm or less. As shown in FIG. 2, the well layer 6 has a straight portion extending in the longitudinal direction of the collector region 4 (and a collector electrode 12, which is described later). The well layer 6 is arranged circularly around the collector region 4 so that the collector region 4 can be singly surrounded by the well layer 6.

The emitter region 7 is formed in a surface portion of the well layer 6 and terminated inside the well layer 6. The emitter region 7 extends in the longitudinal direction of the collector region 4. According to the first embodiment, as shown in FIG. 2, one emitter region 7 is located on each side of the contact layer 8 (and the body layer 9). The emitter region 7 has a straight shape and is located parallel to the collector region 4 except ends (i.e., rounded portions) of the collector region 4 in the longitudinal direction.

The contact layer 8 fixes the well layer 6 to an emitter potential and has an impurity concentration greater than that of the well layer 6. As shown in FIG. 2, the contact layer 8 has a straight portion extending in the longitudinal direction of the collector region 4 (and the collector electrode 12). The contact layer 8 is arranged circularly around the collector region 4 so that the collector region 4 can be singly surrounded by the contact layer 8.

The body layer 9 reduces a voltage drop caused by a Hall current flowing from a collector to an emitter. The body layer 9 has a straight portion extending in the longitudinal direction of the collector region 4 (and the collector electrode 12). The body layer 9 is arranged circularly around the collector region 4 so that the collector region 4 can be singly surrounded by the body layer 9. The body layer 9 reduces or prevents operation of a parasitic npn transistor, which is constructed with the emitter region 7, the well layer 6, and, the drift layer 2. Thus, turn-off time can be improved. In this way, the well layer 6, the contact layer 8, and the body layer 9 are concentrically arranged around the collector region 4.

In each cell, as shown in FIG. 2, the well layer 6, the emitter region 7, the contact layer 8, and the body layer 9 are arranged on each side of the collector region 4. The cells are located adjacent to each other so that two sets of the well layer 6, the emitter region 7, the contact layer 8, and the body layer 9 can be located between the collector regions 4 of adjacent cells.

A gate electrode 11 is located on a surface of the well layer 6 through a gate insulating layer 10. For example, the gate electrode 11 can be made of doped polysilicon. The surface portion of the well layer 6 becomes the channel region by applying a voltage to the gate electrode 11.

A collector electrode 12 is located on and electrically connected to the collector region 4. An emitter electrode 13 is located on and electrically connected to the emitter region 7 and the contact layer 8.

Further, according to the first embodiment, a resistor layer 14 serving as a field plate is formed on the LOCOS oxide layer 3 between the collector and the gate. For example, the resistor layer 14 can be made of doped polysilicon. The resistor layer 14 serves to maintain a uniform potential gradient between the collector and the gate. Specifically, as shown in FIG. 2, the resistor layer 14 has a spiral shape and is wound around the collector electrode 12. The resistor layer 14 is electrically connected at one end to the collector electrode 12 and at the other end to the gate electrode 11. The potential of the resistor layer 14 gradually decreases with the distance from the collector electrode 12 due to a voltage drop caused by an internal resistance of the resistor layer 14. Thus, the potential gradient in the resistor layer 14 can be maintained uniform. Accordingly, the potential gradient in the drift layer 2, which is located below the resistor layer 14 across the LOCOS oxide layer 3, can be maintained uniform. Thus, electric field concentration resulting from non-uniform potential gradient is reduced so that a breakdown voltage can be improved. Further, impact ionization is reduced so that an increase in turn-off time can be reduced.

As shown in FIG. 2, multiple lateral IGBTs, each of which has an ellipse shape when viewed from the top, are arranged side by side in a width direction, perpendicular to the longitudinal direction, of the collector region 4. In an example of FIG. 2, the outermost lateral IGBT is configured as the sense cell, and the other lateral IGBTs are configured as the main cell. The main cell and the sense cell are located in the different islands that are electrically isolated by the trench structures 1d. Thus, the main cell and the sense cell are electrically isolated from each other.

The lateral IGBT according to the first embodiment operates as follows. When a predetermined voltage is applied to the gate electrode 11, the channel region appears in the surface portion of the well layer 6, which is located below the gate electrode 11 between the emitter region 7 and the drift layer 2. Electrons flow from the emitter electrode 13 and the emitter region 7 into the drift layer 2 through the channel region. Accordingly, holes flow into the drift layer 2 through the collector electrode 12 and the collector region 4. Thus, conductivity modulation occurs in the drift layer 2 so that a large current can flow between the emitter and the collector. In this way, the lateral IGBT operates.

According to the first embodiment, the IGBTs of the main cell and the sense cell are identical in structure and coupled in a current mirror configuration so that an electric current flowing through the emitter of the IGBT of the sense cell becomes smaller than the electric current flowing through the emitter of the IGBT of the main cell by a predetermined ratio that depends on a ratio between areas of the IGBTs (specifically, a ratio between the lengths of the emitters). Thus, the current flowing through the main cell can be detected based on the current flowing through the sense cell. The electric current flowing through the sense cell is detected by detecting a voltage across the sense resistor Rs connected between the emitters of the main cell and the sense cell.

Assuming that the lateral IGBT is used as a high breakdown voltage device in which a high voltage of 100V or more is applied to its collector, a collector potential changes between 0V and 100V during switching operation. Due to coupling with the high voltage, noise is induced at an output terminal used for current detection. Therefore, it is difficult to accurately detect a current. When a resistance of the sense resistor Rs is increased to increase the voltage across the sense resistor Rs, a PN junction formed between the body layer 9 and the drift layer 2 is forward biased. As a result, a parasitic transistor operates so that an output (i.e., the voltage across the resistor Rs) becomes unstable. Further, since the potential of the resistor layer 14 changes during the switching operation, the resistor layer 14 can act as a source of noise. Therefore, it is difficult to accurately detect the current.

In order to overcome the above problem, according to the first embodiment, the main cell and the sense cell are electrically insulated from each other by the trench structure 1d. In such an approach, even when the high voltage of 100V or more is applied to the collector of the main cell, noise induced at the output terminal can be reduced or prevented. Further, even when the emitter potential of the sense cell rises due to the current flowing through the sense resistor Rs, the parasitic transistor is inoperative because of the electrical insulation between the main cell and the sense cell. For the same reason, it is less likely that the resistor layer 14 acts as a source of noise. Therefore, the current flowing through the main cell can be accurately detected, even when the lateral IGBT is used as a high breakdown voltage device.

It is noted that noise resistance can be improved by increasing the amount of current flowing through the sense cell. For example, when the area of the sense cell is from one-fifth to one-hundredth of the area of the main cell, the amount of current flowing though the sense cell becomes large enough to ensure a high noise resistance.

Second Embodiment

A semiconductor device according to a second embodiment of the present invention is described below with reference to FIGS. 3 and 4. A difference between the first embodiment and the second embodiment is in that a lateral freewheeling diode (FWD) is formed instead of the lateral IGBT.

Figure 3:
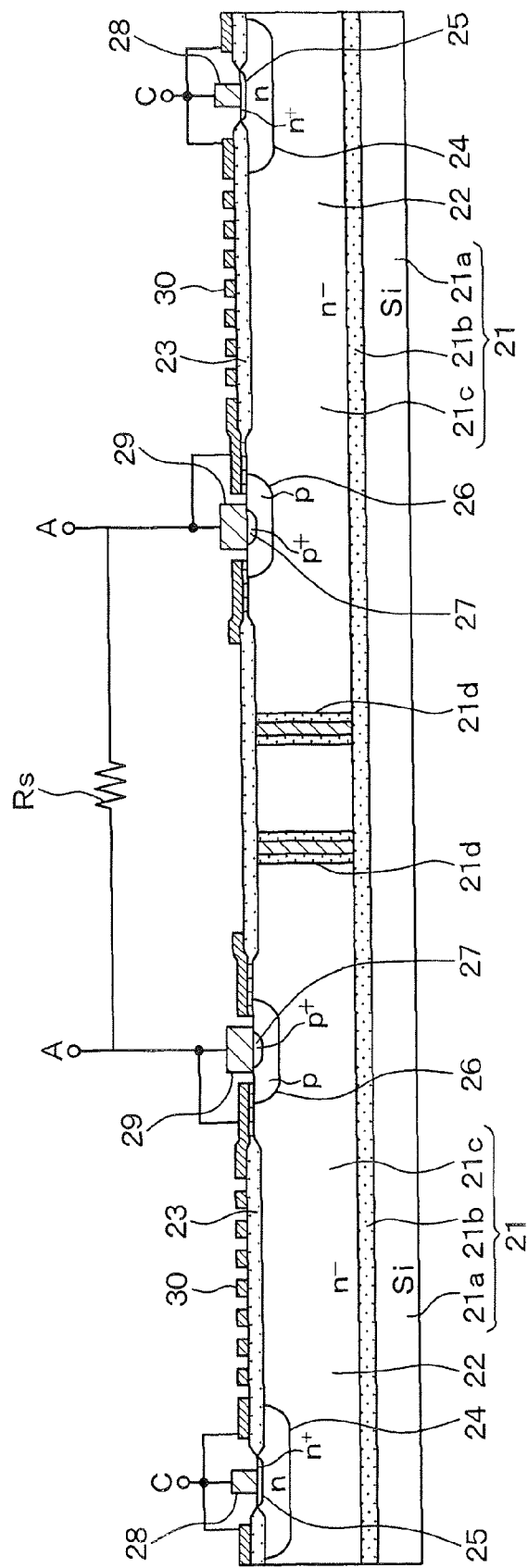
FIG. 3 is a diagram illustrating a cross-sectional view taken along the line III-III in FIG. 4.
Figure 4:
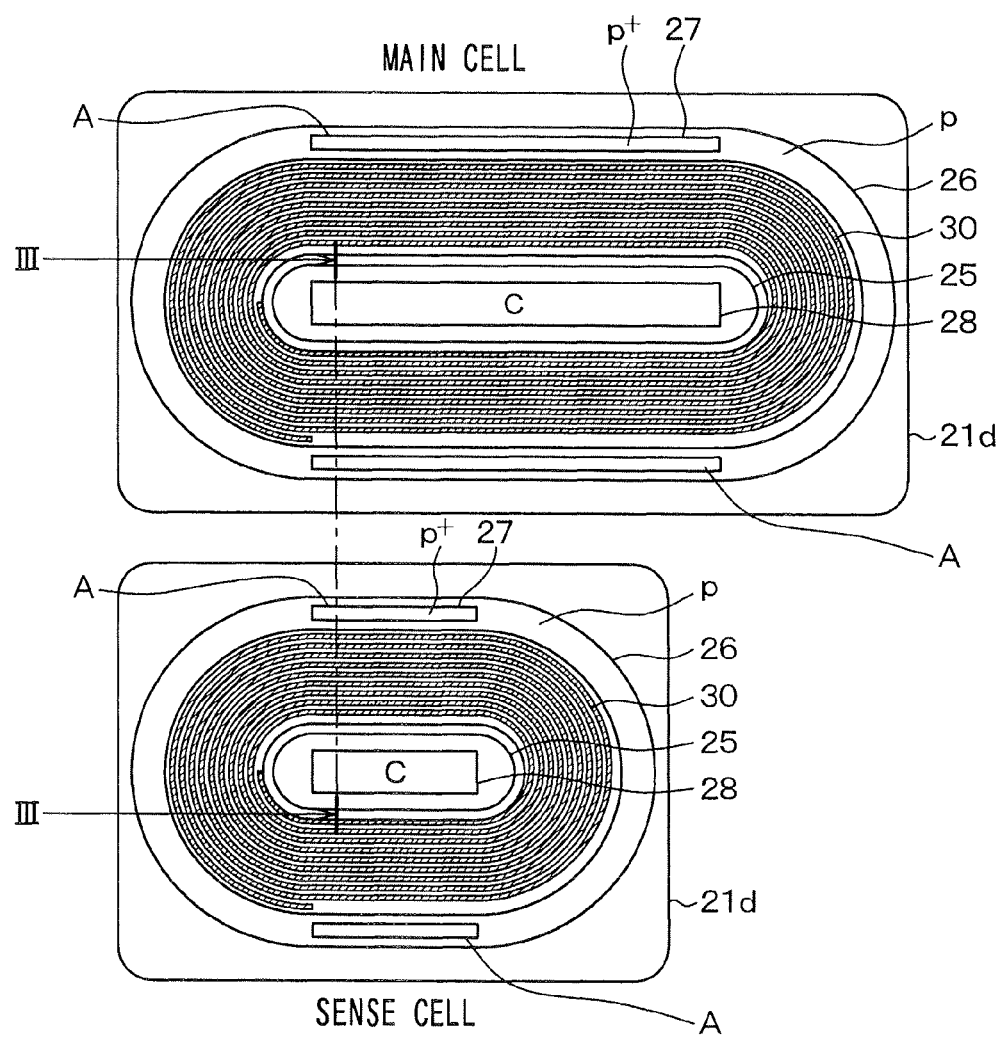
FIG. 4 is a diagram illustrating a top view of a semiconductor device according to a second embodiment of the present invention.

FIG. 3 is a cross-sectional view taken along the line III-III in FIG. 4, and FIG. 4 is a top view of the semiconductor device according to the second embodiment. Although FIG. 4 is not a cross-sectional view, FIG. 4 is partially hatched for ease of understanding.

According to the second embodiment, as shown in FIG. 3, the lateral FWD is formed by using a silicon-on-insulator (SOI) substrate 21. The SOI substrate 21 is identical in structure to the SOI substrate 1 of the first embodiment. Specifically, the SOI substrate 21 includes a supporting substrate 21a, a buried oxide (BOX) layer 21b on the supporting substrate 21a, and an active layer 21c on the BOX layer 21b. The active layer 21c serves as an n⁻-type cathode layer 22. Each part of the lateral FWD is formed in the cathode layer 22. Trench structures 21d, extending through the active layer 21c to the BOX layer 21b, are formed in the active layer 21c to divide the active layer 21c into multiple islands that are electrically isolated from each other. The trench structure 21d is identical in structure to the trench structure 1d of the first embodiment. The main cell and the sense cell are located in different islands.

As shown in FIG. 3, a LOCOS oxide layer 23 is formed on a surface of the cathode layer 22. The parts of the lateral FWD are electrically insulated from each other by the LOCOS oxide layer 23. An n⁺-type contact layer 24 and an n-type buffer layer 25 are formed in the surface portion of the cathode layer 22 and exposed outside the LOCOS oxide layer 23. The contact layer 24 and the buffer layer 25 have a longitudinal direction parallel to a surface of the SOI substrate 21. The contact layer 24 and the buffer layer 25 are surrounded by a p-type anode layer 26 and a p⁺-type contact layer 27.

A cathode electrode 28 and an anode electrode 29 are formed on the surface of the SOI substrate 21. The cathode electrode 28 is electrically connected to the contact layer 24. The anode electrode 29 is electrically connected to the contact layer 27 and the anode layer 26. Further, a resistor layer 30 is formed on the LOCOS oxide layer 23 between the anode and the cathode. For example, the resistor layer 30 can be made of doped polysilicon. The resistor layer 30 serves to maintain a uniform potential gradient between the anode and the cathode. Specifically, as shown in FIG. 4, the resistor layer 30 has a spiral shape and is wound around the cathode electrode 28. The resistor layer 30 is electrically connected at one end to the cathode electrode 28 and at the other end to the anode electrode 29. The potential of the resistor layer 30 gradually decreases with the distance from the cathode electrode 28 due to a voltage drop caused by an internal resistance of the resistor layer 30. Thus, the potential gradient in the resistor layer 30 can be maintained uniform. Accordingly, the potential gradient in the active layer 21c, which is located below the resistor layer 30 across the LOCOS oxide layer 23, can be maintained uniform.

As described above according to the second embodiment, the FWD of the main cell and the FWD of the sense cell are located on different islands that are electrically insulated from each other by the trench structure 21d. For example, the sense resistor Rs can be connected between the anodes of the main cell and the sense cell, and the cathodes of the main cell and the sense cell can be connected together. In such an approach, an electric current flowing through the main cell can be detected by detecting an electric current flowing through the sense cell based on a voltage across the sense resistor Rs.

Even when a high voltage of 100V or more is applied to the cathode of the main cell, noise induced at an output terminal used for current detection can be reduced or prevented. Further, even when an anode potential of the sense cell rises due to the current flowing through the sense resistor Rs, the parasitic transistor is inoperative because of the electrical insulation between the main cell and the sense cell. For the same reason, it is less likely that the resistor layer 30 acts as a source of noise. Therefore, the current flowing through the main cell can be accurately detected, even when the lateral FWD is used as a high breakdown voltage device.

Third Embodiment

Figure 5:
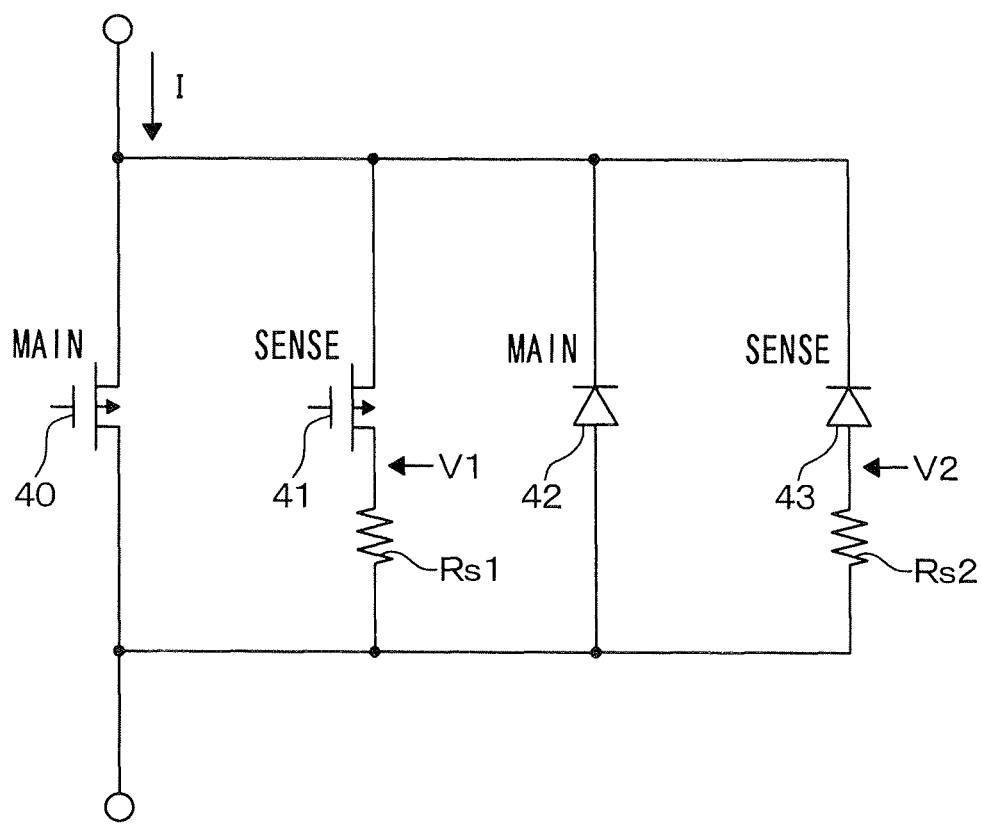
FIG. 5 is a diagram illustrating a circuit configuration of a semiconductor device according to a third embodiment of the present invention.

A semiconductor device according to a third embodiment of the present invention is described below with reference to FIG. 5. A difference of the third embodiment from the preceding embodiments is in that the semiconductor device according to the third embodiment has both a lateral IGBT and a lateral FWD. The structures of the lateral IGBT and the lateral FWD are the same as those of the first and second embodiments. FIG. 5 illustrates an example of a circuit configuration of the semiconductor device having both the lateral IGBT and the lateral FWD.

As shown FIG. 5, the lateral IGBT includes a main cell 40 and a sense cell 41, and the lateral FWD includes a main cell 42 and a sense cell 43. The sense cells 41, 43 are connected to sense resistors Rs1, Rs2, respectively. Specifically, the collector and emitter of the main cell 40 of the lateral IGBT are electrically connected to the cathode and anode of the main cell 42 of the lateral FWD, respectively. The emitter of the sense cell 41 of the lateral IGBT is connected to the sense resistor Rs1, and the anode of the sense cell 43 of the lateral FWD is connected to the sense resistor Rs2. In this way, the lateral IGBT and the lateral FWD are connected in parallel to provide a circuit for turning ON and OFF the supply of current to an electrical load connected to the circuit. For example, the circuit shown in FIG. 5 can be used for each switch of an inverter circuit for driving a three-phase motor.

The circuit shown in FIG. 5 is configured to detect the magnitude and direction of current flowing through a current path leading to the lateral IGBT or the lateral FWD. Further, the circuit detects an overcurrent condition in the current path. For example, the magnitude and direction of the current and also the overcurrent condition can be detected from output voltages V1, V2 of the sense resistors Rs1, Rs2 by using a microcomputer (not shown) or the like. The voltage applied to the gate of the lateral IGBT is controlled according to the detection result. For example, when the overcurrent condition is detected, the lateral IGBT is turned OFF so that the inverter circuit and the three-phase motor can be protected from malfunction.

A method of detecting the magnitude and direction of the current flowing through the current path leading to the lateral IGBT or the lateral FWD is described below with reference to FIGS. 6A-6C. Here, it is assumed that the circuit is used for each switch of an inverter circuit. In each switch, an electric current flows as follows.

Figure 6A:
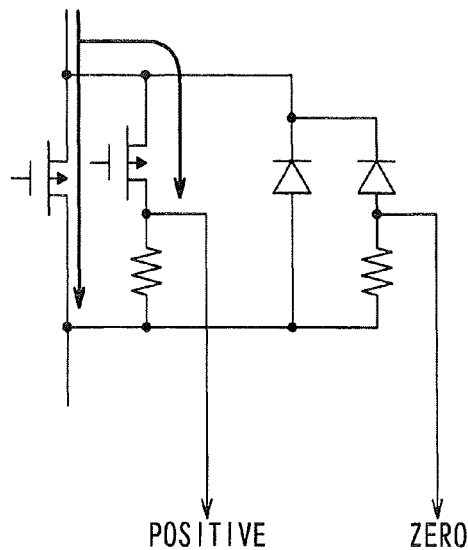
FIGS. 6A-6C are diagrams illustrating a current flow in the circuit shown in FIG. 5.

When the lateral IGBT is turned ON, the current flows from the collector to the emitter of the lateral IGBT, as shown in FIG. 6A. Therefore, no current flows through the lateral FWD.

Figure 6B:
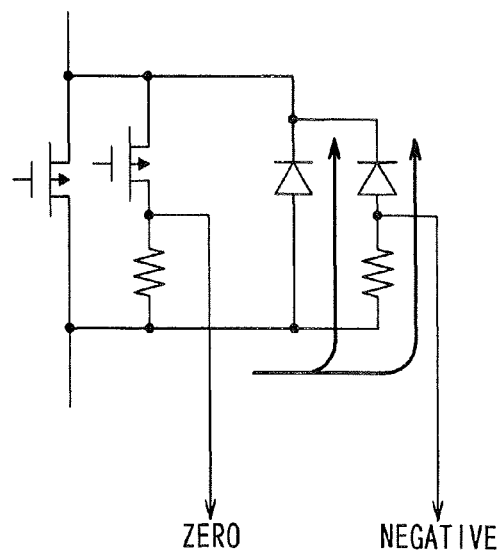

Then, when the lateral IGBT is turned OFF from ON, a reverse recovery current flows through the lateral FWD, as shown in FIG. 6B. Therefore, no current flows through the lateral IGBT, and the recovery current flows from the anode to the cathode of the lateral FWD.

Then, the recovery current becomes zero after a lapse of a certain period of time. As a result, no current flows through the lateral IGBT and the lateral FWD, as shown in FIG. 6C. Such a current flow in each switch is detected as follows.

Referring to FIGS. 5 and 6A, when the lateral IGBT of the main cell 40 is turned ON, the lateral IGBT of the sense cell 41 is turned ON so that a current can flow through the sense resistor Rs1. The output voltage V1 appearing at the node between the lateral IGBT of the sense cell 41 and the sense resistor Rs1 is calculated by subtracting an on-voltage of the lateral IGBT of the sense cell 41 from a high voltage applied by a power source such as a battery. Therefore, the output voltage V1 has a positive value. On the other hand, since no current flows through the lateral FWD, the output voltage V2 appearing at the node between the lateral FWD of the sense cell 43 and the sense resistor Rs2 becomes zero. Therefore, the magnitude (absolute value) of the current in the current path can be detected based on the output voltage V1. Further, when the output voltage V1 has a positive value, and the output voltage V2 is zero, it is detected that the current flows in a forward direction from a high voltage side to a low voltage side.

Next, referring to FIGS. 5 and 6B, when the lateral IGBT of the main cell 40 is turned OFF from ON, the lateral IGBT of the sense cell 41 is turned OFF at the same time so that no current can flow through the sense resistor Rs1. As a result, the output voltage V1 becomes zero. A reverse recovery current flows through the lateral FWDs of the main cell 42 and the sense cell 43 at the moment when the lateral IGBTs of the main cell 40 and the sense cell 41 are turned OFF. Therefore, the output voltage V2 is calculated by subtracting a voltage across the sense resistor Rs2 from a ground voltage. Therefore, the output voltage V2 has a negative value. Therefore, the magnitude (absolute value) of the current in the current path can be detected based on the output voltage V2. Further, when the output voltage V1 is zero, and the output voltage V2 has a negative value, it is detected that the current flows in a backward direction from the low voltage side to the high voltage side.

Figure 6C:
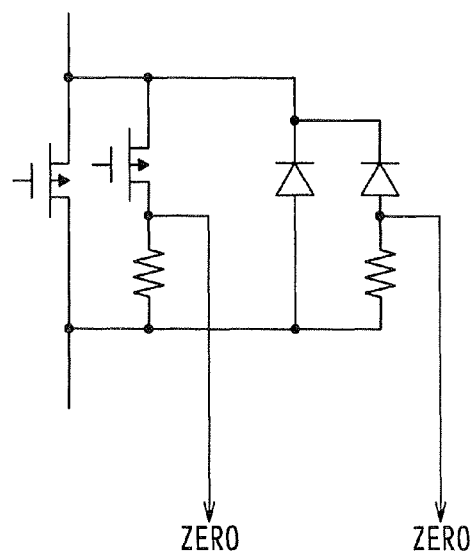

Then, referring to FIGS. 5 and 6C, when a certain period of time has been elapsed after the lateral IGBTs of the main cell 40 and the sense cell 41 are turned OFF, the flow of the recovery current stops. As a result, both the output voltage V1 and the output voltage V2 become zero. Therefore, when both the output voltage V1 and the output voltage V2 are zero, it is detected that no current flows.

Figure 7:
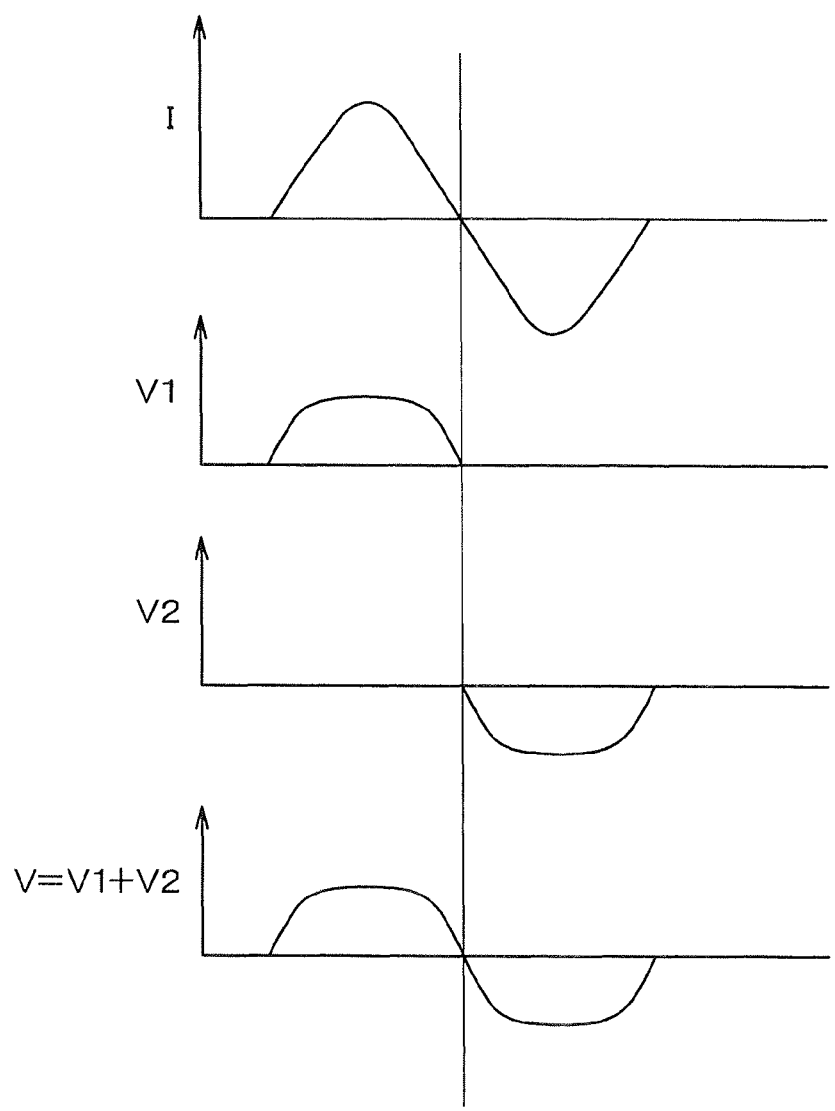
FIG. 7 is a diagram illustrating a current and a voltage in the circuit shown in FIG. 5.

FIG. 7 is a diagram illustrating waveforms of a total current I in the switch, the output voltage V1, the output voltage V2, and a total voltage V(=V1+V2). As can be seen from FIG. 7, a polarity of the output voltage V1, the output voltage V2, or the total voltage V changes at a zero crossing point of the total current I. Further, the output voltage V1, the output voltage V2, or the total voltage V increases with an increase in the total current I. Furthermore, the output voltage V1, the output voltage V2, or the total voltage V decreases with a decrease in the total current I. Therefore, the magnitude and direction of the total current I can be accurately detected.

Figure 8:
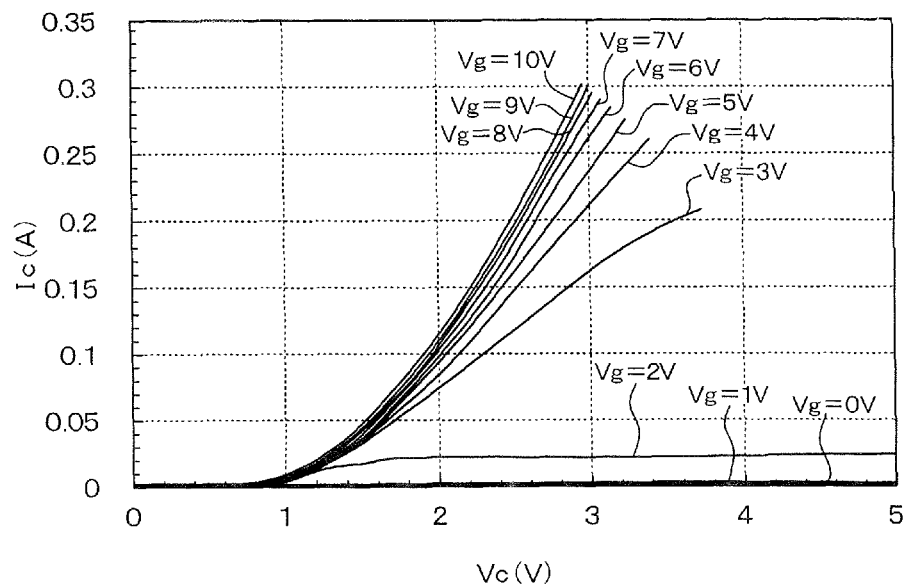
FIG. 8 is a diagram illustrating a collector current-voltage characteristic of a lateral IGBT.
Figure 9:
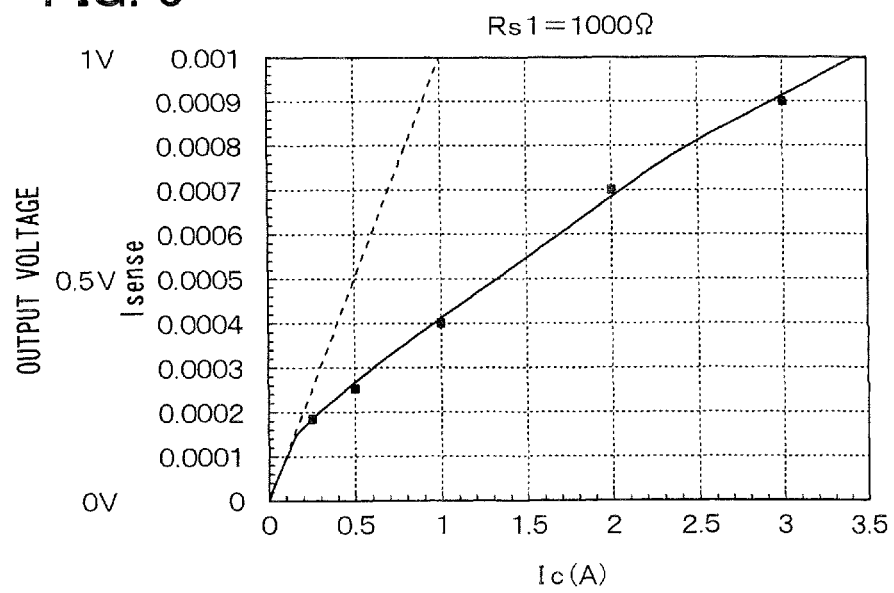
FIG. 9 is a diagram illustrating a current Isense flowing through a sense cell and an output voltage across a sense resistor with respect to a collector current.

The output voltages V1, V2 can be increased to an on-voltage of the lateral IGBT of the main cell 40 or a forward voltage Vf of the lateral FWD of the main cell 42 by increasing resistances of the sense resistors Rs1, Rs2. Here, it is assumed that the lateral IGBT has a collector current-voltage characteristic shown in FIG. 8, a mirror ratio between the main cell 40 and the sense cell 41 is 1/70, and a resistance of the sense resistor Rs1 is 1000 ohms ($\Omega$). In this case, relationships between a collector current Ic and each of an electric current Isense flowing through the sense cell 41 and the output voltage V1 can be given as shown in FIG. 9. As can be understood from FIG. 9, a slope of a graph representing the relationship between the collector current Ic and the output voltage V1 remains positive, at least until the output voltage V1 reaches 1V. For the same reasons, by suitably adjusting a mirror ratio between the main cell 42 and the sense cell 43 and a resistance of the sense resistor Rs2, a slope of a graph (not shown) representing a relationship between the current flowing through the lateral FWD and the output voltage V2 can remain positive, at least until the output voltage V2 reaches 1V. Therefore, the output voltages V1, V2 can be increased to at least 0.7V, which is a forward voltage of a p-n junction (i.e., on-voltage of the lateral IGBT or forward voltage Vf of the lateral FWD). Thus, the current can accurately detected based on the large output voltages V1, V2.

As described above, according to the third embodiment, a switch of an inverter circuit for driving a three-phase motor can be formed with the lateral IGBT of the first embodiment and the lateral FWD of the second embodiment. Thus, the magnitude and current in the switch can be accurately detected.

Fourth Embodiment

An inverter circuit according to a fourth embodiment of the present invention is described below with reference to FIG. 10. The inverter circuit is constructed with the circuit of the third embodiment.

Figure 10:
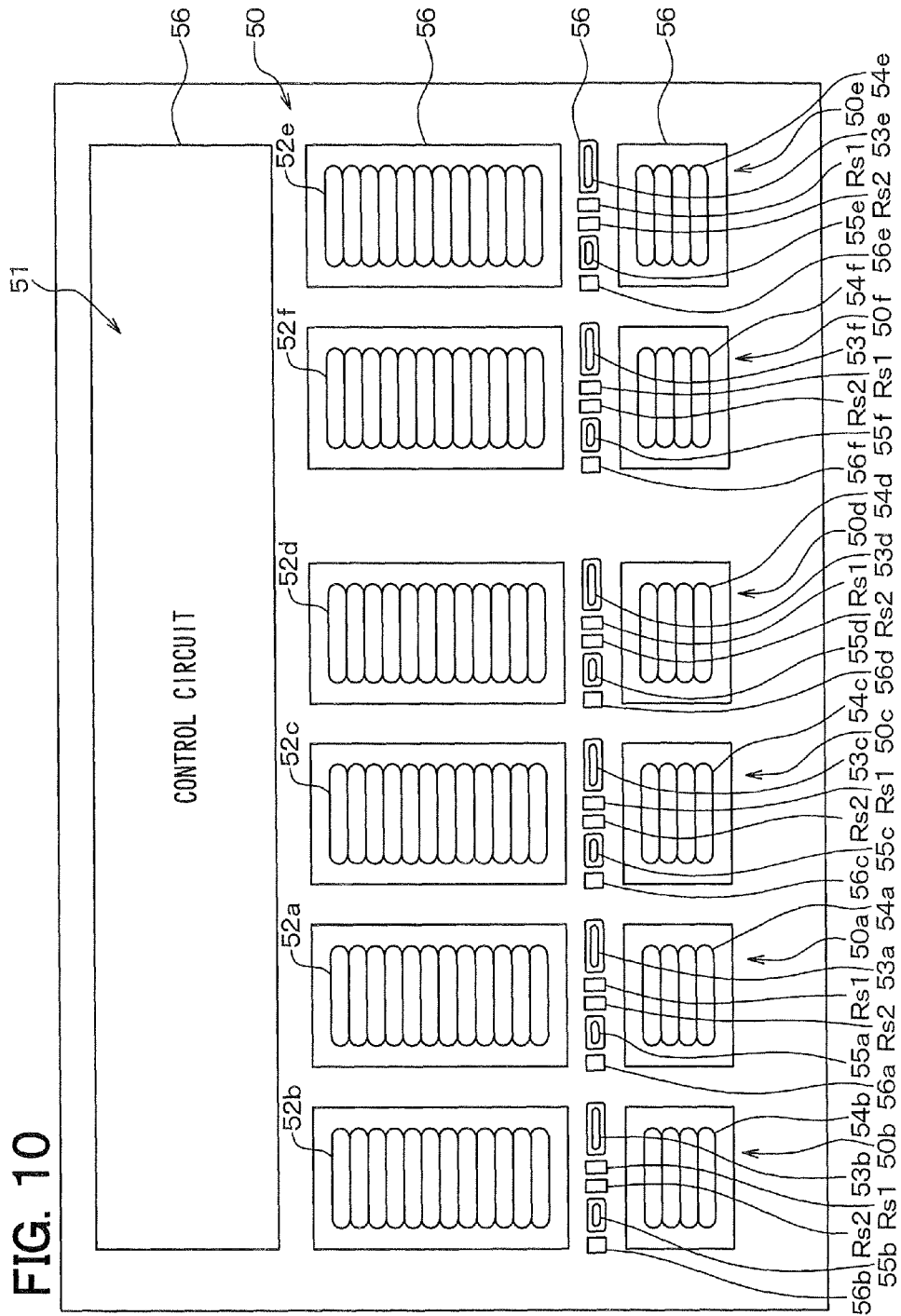
FIG. 10 is a diagram illustrating a top view of a semiconductor device according to a fourth embodiment of the present invention.

FIG. 10 is a top view of a semiconductor device having the inverter circuit. The inverter circuit drives a three-phase motor (not shown) based on a high voltage (e.g., 288 volts) supplied from a main power source (not shown) such as a battery. The inverter circuit is integrated in the semiconductor device so that the semiconductor device can be configured as one-chip inverter driver IC. Specifically, when the three-phase motor is driven, an external microcomputer (not shown) controls the inverter circuit in such a manner that an alternating current can be supplied to each phase of the three-phase motor in turn.

The inverter circuit is formed in a SOI substrate and includes an inverter output circuit 50, a control circuit 51. The inverter output circuit 50 includes three phase legs connected in parallel to each other. A u-phase leg of the inverter output circuit 50 consists of a top switch 50a and a bottom switch 50b connected in series with the top switch 50a. A v-phase leg of the inverter output circuit 50 consists of a top switch 50c and a bottom switch 50d connected in series with the top switch 50c. A w-phase leg of the inverter output circuit 50 consists of a top switch 50e and a bottom switch 50f connected in series with the top switch 50e. The control circuit 51 controls the six switches 50a-50f.

The top switches 50a, 50c, and 50e and the bottom switches 50b, 50d, and 50f are alternately arranged in the left-to-right direction of FIG. 10. Specifically, in an example shown in FIG. 10, the bottom switch 50b, the top switch 50a, the top switch 50c, the bottom switch 50d, the bottom switch 50f, and the top switch 50e are arranged in this order from the left to the right of FIG. 10. The switches 50a-50f have main cells 52a-52f, sense cells 53a-53f, main cells 54a-54f, and sense cells 55a-55f, respectively. The main cells 52a-52f and the sense cells 53a-53f are lateral IGBTs. The main cells 54a-54f and the sense cells 55a-55f are lateral FWDs. The main cells 52a-52f, the sense cells 53a-53f, the main cells 54a-54f, the sense cells 55a-55f, and the control circuit 51 are isolated from each other by trench structures 56. The trench structure 56 is identical in structure to the trench structures 1d, 21d of the first and second embodiments.

Detailed layouts of the switches 50a-50f are discussed below. Each of the switches 50a-50f is laid out in the same manner. In the discussion below, the top switch 50a is taken as an example. In the top switch 50a, multiple main cells 52a, each of which has an ellipse shape, are arranged side by side in the top-to-bottom direction of FIG. 10 to form a lateral IGBT main cell group. Likewise, multiple main cells 54a, each of which has an ellipse shape, are arranged side by side in the top-to-bottom direction of FIG. 10 to form a lateral FWD main cell group. The lateral IGBT main cell group is spaced from the lateral FWD main cell group in the top-to-bottom direction of FIG. 10. The sense cell 53a, the sense cell 55a, the sense resistors Rs1, Rs2, and a buffer circuit 56a are located between the lateral IGBT main cell group and the lateral FWD main cell group in the top-to-bottom direction of FIG. 10. The buffer circuit 56a is used to amplify the output voltages V1, V2. Further, the sense cell 53a, the sense cell 55a, the sense resistors Rs1, Rs2, and the buffer circuit 56a arranged in a line in the left-to-right direction in such a manner that the sense resistors Rs1, Rs2 are located between the sense cell 53a and the sense cell 55a.

In this way, each of the switches 50a-50f of the inverter circuit of the third embodiment is constructed with the lateral IGBT of the first embodiment and the lateral FWD of the second embodiment. In the switches 50a-50f, the main cells 52a-52f, the sense cells 53a-53f, the main cells 54a-54f, the sense cells 55a-55f, the sense resistors Rs1, Rs2, and the buffer circuits 56a-56f are arranged in the top-to-bottom direction, respectively. In such an approach, a chip size can reduced as much as possible. Accordingly, the length of wiring can be reduced as much as possible.

Further, the sense cells 53a-53f, the sense cells 55a-55f, the sense resistors Rs1, Rs2, and the buffer circuits 56a-56f are arranged in a line in the left-to-right direction, respectively. Thus, the chip size and the wiring length can be reduced efficiently. Preferably, the sense resistors Rs1, Rs2 can be located between the sense cells 53a-53f and the sense cells 55a-55f in the left-to-right direction.

Further, the sense cells 53a-53f, the sense cells 55a-55f, the sense resistors Rs1, Rs2, and the buffer circuits 56a-56f are located between the main cells 52a-52f and the main cells 54a-54f in the top-to-bottom direction, respectively. In such an approach, the chip size and the wiring length can be reduced efficiently.

Figure 11:
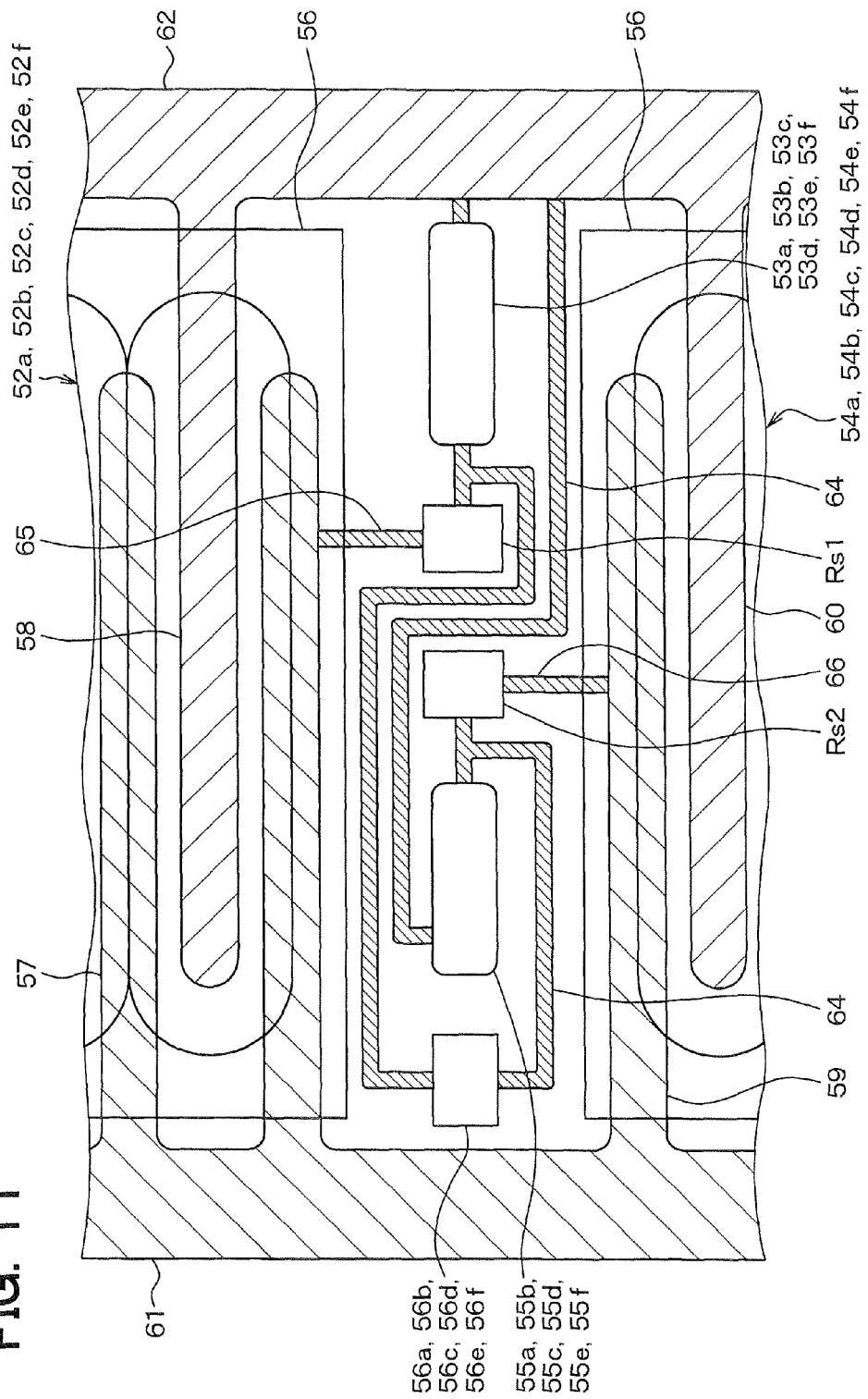
FIG. 11 is a diagram illustrating an enlarged view of FIG. 10.

FIG. 11 is a partial enlarged view of FIG. 10, showing a wiring layout in each of the switches 50a-50f. Although FIG. 11 is not a cross-sectional view, FIG. 11 is partially hatched for ease of understanding. In each of the switches 50a-50f, the wiring is laid out in the same manner. In the discussion below, the top switch 50a is taken as an example.

As shown in FIG. 11, an emitter wire 57 and a collector wire 58 for the main cells 52a extend in a direction perpendicular to a direction in which the main cells 52a are arranged. Likewise, an anode wire 59 and a cathode wire 60 for the main cells 54a extend in a direction perpendicular to a direction in which the main cells 54a are arranged. A common negative wire 61 is located on one side of the main cells 52a and extends parallel to the direction in which the main cells 52a are arranged. The common negative wire 61 is connected to the emitter wire 57 and the anode wire 59. A common positive wire 62 is located on the other side of the main cells 52a and extends parallel to the direction in which the main cells 52a are arranged. The common positive wire 62 is connected to the collector wire 58 and the cathode wire 60.

A first wire 64 is located in a space enclosed by the emitter wire 57, the collector wire 58, the anode wire 59, the cathode wire 60, the common negative wire 61, and the common positive wire 62. The sense cell 53a, the sense cell 55a, the sense resistors Rs1, Rs2, and the buffer circuit 56a are connected together by the first wire 64. A second wire 65 is located in the space and connects the sense resistor Rs1 to the emitter wire 57. Thus, the sense resistor Rs1 is connected to the common negative wire 61 through the second wire 65 and the emitter wire 57. A third wire 66 is located in the space and connects the sense resistor Rs2 to the anode wire 59. Thus, the sense resistor Rs2 is connected to the common negative wire 61 through the third wire 66 and the anode wire 59.

In each of the switches 50a-50f, the wiring is laid out in the above manner. Thus, the wiring length can be reduced as much as possible so that malfunction due to noise can be reduced. Specifically, the sense resistors Rs1, Rs2 can be electrically connected by the shortest path to the emitter wire 57 of each of the main cells 52a-52f and the anode wire 59 of each of the main cells 54a-54f. Thus, the noise is reduced so that the malfunction can be reduced. Further, since the sense cells 53a-53f and the sense cells 55a-55f are located between the main cells 52a-52f and the main cells 54a-54f, the emitter wire 57, the collector wire 58, the anode wire 59, and the cathode wire 60 can be connected by the shortest path through the common negative and positive wires 61, 62.

For example, when the control circuit 51 has a comparator, the comparator can be formed with only a complementary metal oxide semiconductor (CMOS). As compared to a comparator formed with a bipolar transistor, a comparator formed with a CMOS has a large offset voltage. Therefore, when the comparator of the control circuit 51 is formed with only a CMOS, the change in the polarity of the current can be accurately detected.

Fifth Embodiment

A fifth embodiment of the present invention is described below with reference to FIGS. 12 and 13. The fifth embodiment is similar to the first embodiment. A difference of the fifth embodiment from the first embodiment is as follows.

Figure 12:
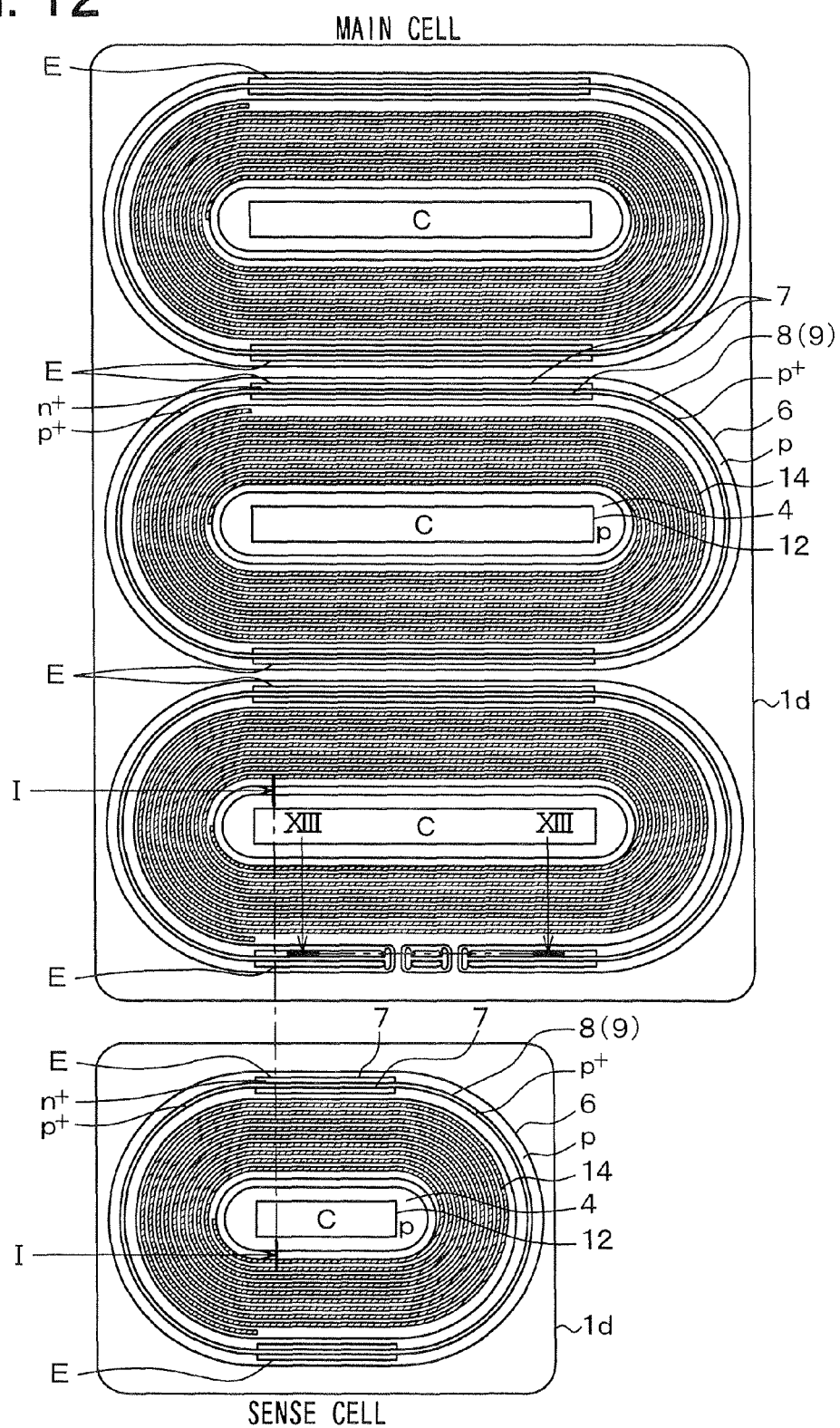
FIG. 12 is a diagram illustrating a top view of a semiconductor device according to a fifth embodiment of the present invention.

FIG. 12 is a top view of a semiconductor device according to the fifth embodiment of the present invention. FIG. 13 is a cross-sectional view taken along the line XIII-XIII in FIG. 12. It is noted that a cross-section view taken along the line I-I in FIG. 12 is the same as the cross-sectional view shown in FIG. 1.

Like the first embodiment, according to the first embodiment, the main cell and the sense cell are located in different islands that are electrically insulated from each other by the trench structures 1d.

Unlike the first embodiment, a sub-sense cell is located in the main cell island. In the main cell island, multiple main cells are arranged in a direction perpendicular to the longitudinal direction of the collector region 4. The sub-sense cell is formed with a straight portion of the emitter region 7 of the outermost main cell.

Figure 13:
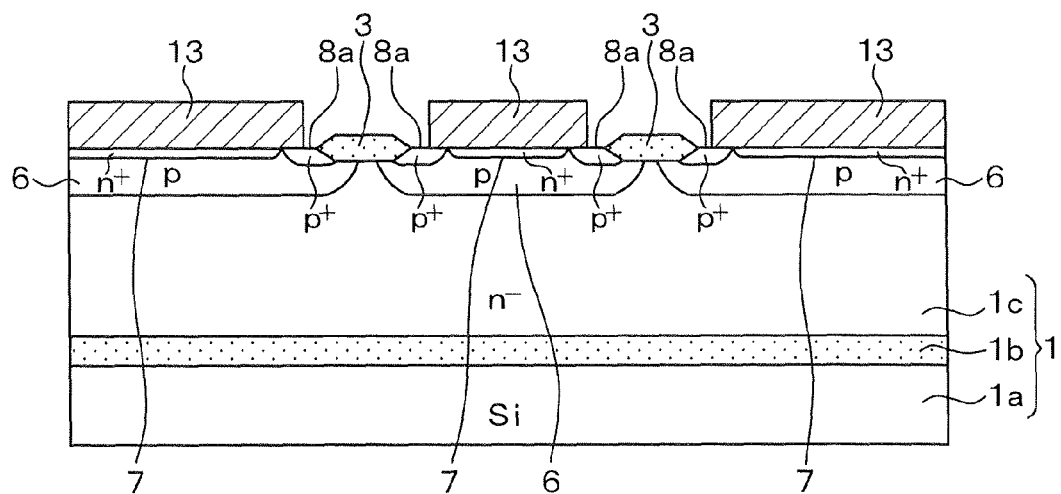
FIG. 13 is a diagram illustrating a cross-sectional view taken along the line XIII-XIII in FIG. 12.
Figure 14:
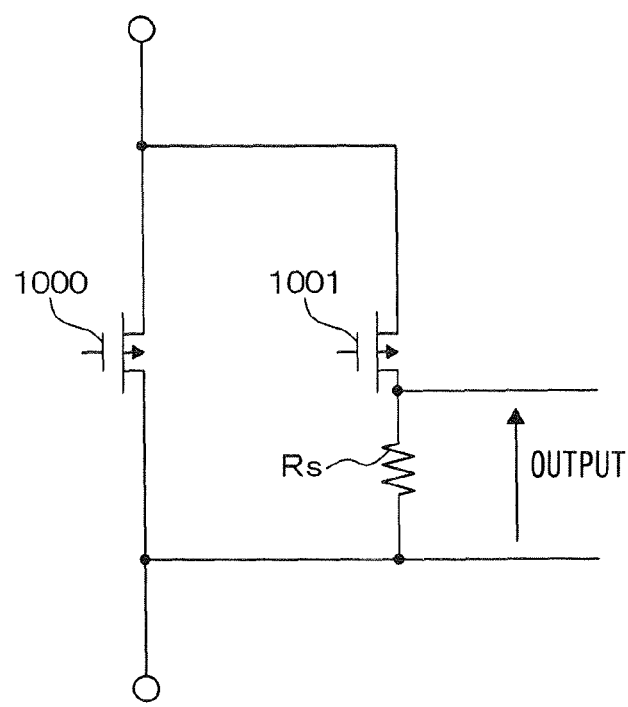
FIG. 14 is a diagram illustrating a circuit configuration of a semiconductor device according to a related art.

Specifically, as shown in FIGS. 12 and 13, the well layer 6, the emitter region 7, and the contact layer 8 are divided at two points on the straight portion of the emitter region 7 and thus separated into three regions. Although not shown in the drawing, the body layer 9 is separated at the two points in the same manner. The center region of the three regions serves as the sub-sense cell.

Thus, in the main cell island, the main cell is located on each side of the sub-sense cell, and the emitter of the sub-sense cell is located between the emitters of the main cell. The body layer 9 of the main cell is separated from the body layer 9 of the sub-sense cell to provide junction isolation for preventing a leak current therethrough.

Further, in the main cell island, a p$^+$-type isolation layer 8a is formed between the emitter region 7 of the sub-sense and the emitter region 7 of the main cell. The isolation layer 8a extends from an end of the contact layer 8 toward an end of the emitter region 7 in a direction perpendicular to the longitudinal direction of the contact layer 8. The isolation layer 8a reduces or prevents operation of a parasitic transistor, which is constructed with the emitter region 7, the body layer 9, and, the drift layer 2 in each of the main cell and the sub-sense cell.

As described above, according to the fifth embodiment, the sub-sense cell is formed in the main cell island. In such an approach, the current flowing through the main cell can be detected by using not only the sense cell in the sense cell island but also the sub-sense cell in the main cell island. Thus, both the change in polarity of the current and the absolute value of the current can be accurately detected.

Specifically, the zero-crossing point of the current is detected based on an output voltage of the sense cell in the sense cell island, and the absolute value of the current is detected by the sub-sense cell in the main cell island.

There is a possibility that the absolute value of the current flowing through the main cell not accurately correspond to the output voltage of the sense cell. A reason for this is that the emitter current density in the sense cell in the sense cell island is much different from the emitter current density in the main cell. Therefore, it is difficult to accurately detect the absolute value of the current flowing through the main cell based on the output voltage of the sense cell in the sense cell island. It is noted that the change in the polarity of the current in the main cell can be easily detected by increasing the output voltage of the sense cell.

In contrast, the absolute value of the current flowing through the main cell accurately corresponds to the output voltage of the sub-sense cell in the main cell island. A reason for this is that the sub-sense cell is located in the main cell so that the emitter current density in the sub-sense cell can approach the emitter current density in the main cell. Thus, the mirror ratio almost depends on the ratio between the lengths of the emitters of the main cell and the sub-sense cell so that the absolute value of the current flowing through the main cell can accurately correspond to the output voltage of the sub-sense cell. Therefore, the absolute value of the current flowing through the main cell can be accurately detected based on the output voltage of the sub-sense cell.

In this way, according to the fifth embodiment, both the change in the polarity of the current in the main cell and the absolute value of the current in the main cell can be accurately detected. Further, since the effective area of the sub-sense cell in the main cell island can be much smaller than the effective area of the main cell, the mirror ratio can be reduced so that the current in the sub-sense cell can be reduced. Thus, a loss in the sub-sense cell can be reduced. In contrast, the effective area of the sense cell in the sense cell island cannot be much smaller than the effective area of the main cell. However, a loss in the sense cell can be reduced by increasing the resistance of the sense resistor Rs1 to limit the current in the sense cell.

Sixth Embodiment

A lateral IGBT according to a sixth embodiment of the present invention is described below with reference to FIGS. 15A, 15B, and 16.

Figure 15A:
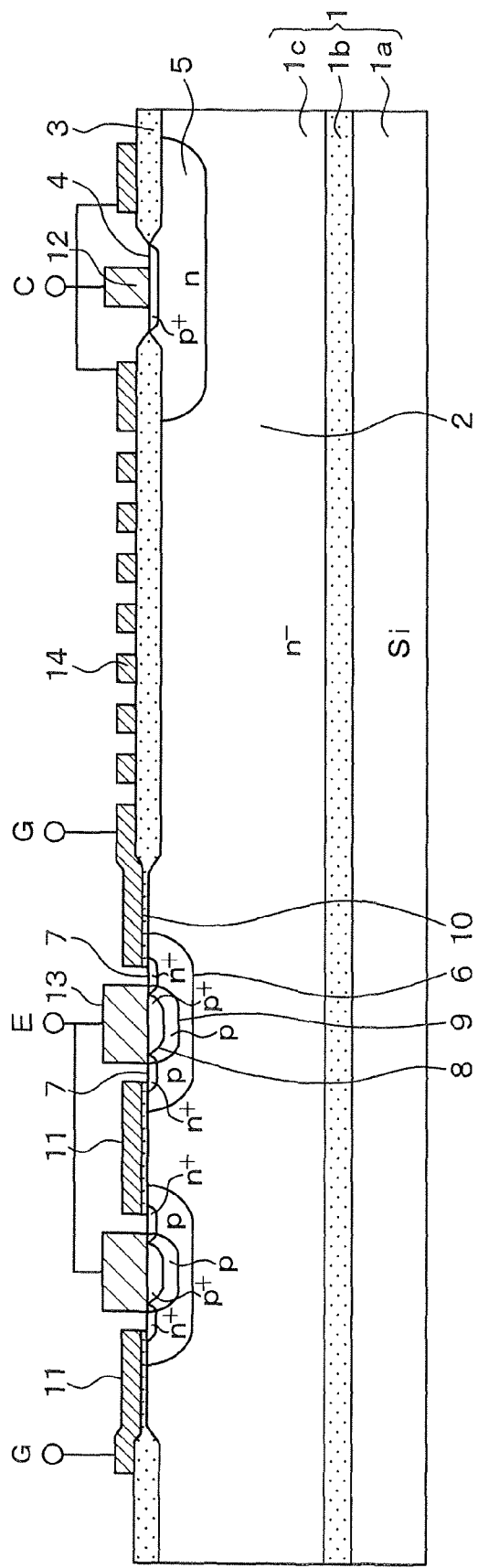
FIG. 15A is a diagram illustrating a cross-sectional view taken along the line XVA-XVA in FIG. 16.
Figure 15B:
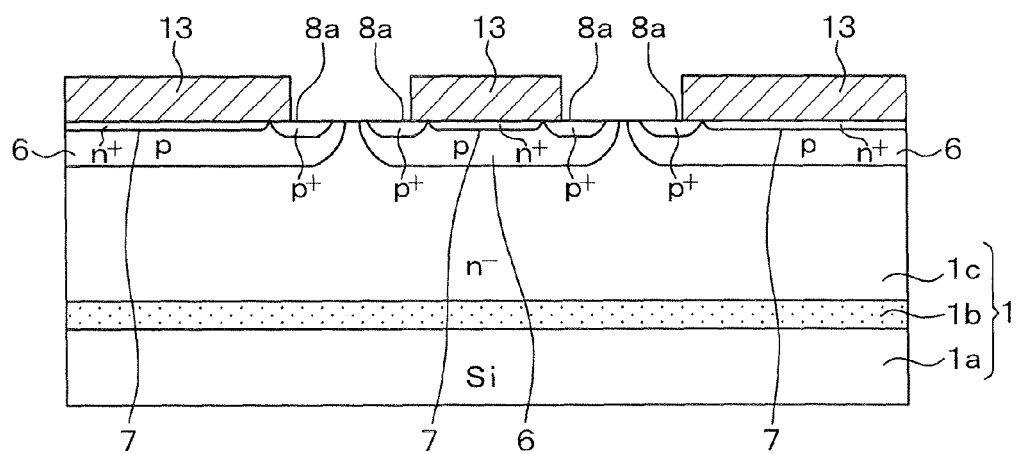
FIG. 15B is a diagram illustrating a cross-sectional view taken along the line XVB-XVB in FIG. 16.
Figure 16:
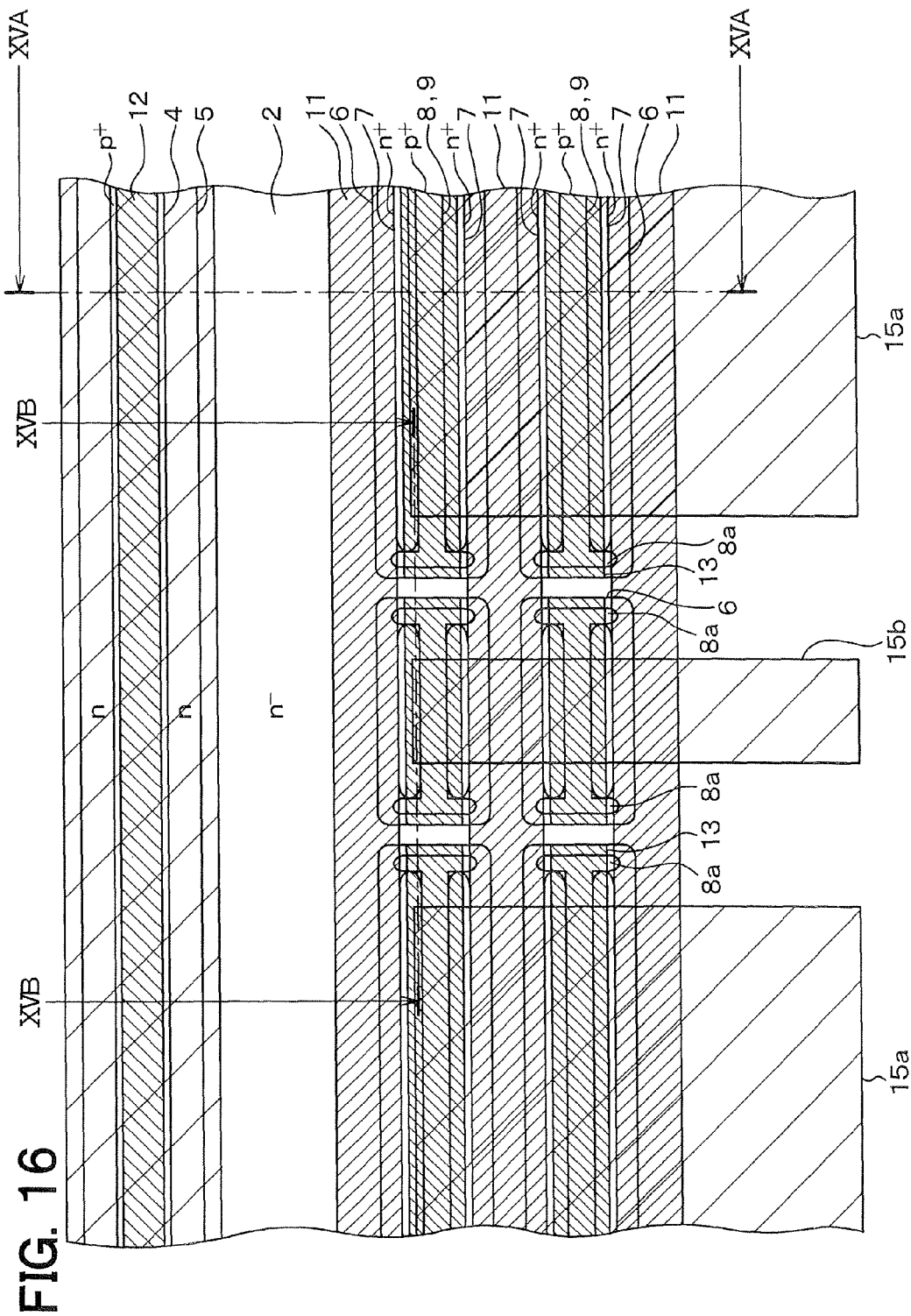
FIG. 16 is a diagram illustrating a top view of a semiconductor device according to a sixth embodiment of the present invention.

FIG. 15A is a cross-sectional view taken along the line XVA-XVA in FIG. 16, and FIG. 15B is a cross-sectional view taken along the line XVB-XVB in FIG. 16. FIG. 16 is a top view of the lateral IGBT. Although FIG. 16 is not a cross-sectional view, FIG. 16 is partially hatched for ease of understanding.

According to the sixth embodiment, as shown in FIGS. 15A and 15B, the lateral IGBT is formed by using the SOI substrate 1. A main cell and a sense cell are formed in the SOI substrate 1. The main cell has a lateral IGBT that is turned ON and OFF to supply an electric current to an electrical load (not shown) such as a motor. The sense cell has a lateral IGBT for detecting an electric current flowing through the main cell. The lateral IGBT of the sense cell has the same structure as the lateral IGBT of the main cell.

The SOI substrate 1 includes a supporting substrate 1a, a buried oxide (BOX) layer 1b on the supporting substrate 1a, and an active layer 1c on the buried oxide layer 1b. For example, the supporting substrate 1a can be a silicon substrate. According to the sixth embodiment, the active layer 1c serves as an n⁻-type drift layer 2. Each part of the lateral IGBTs of the main cell and the sense cell is formed in a surface portion of the drift layer 2.

The thickness of the BOX layer 1b, and the thickness and the impurity concentration of the active layer 1c (i.e., drift layer 2) are not limited to specific values and can vary depending on the intended use of the semiconductor device. For example, in order to achieve high breakdown voltage, it is preferable that the thickness of the BOX layer 1b be 4 micrometers (μm) or more. In order to ensure a breakdown voltage of 600V or more, it is preferable that the thickness of the BOX layer 1b be 5 μm or more. In order to ensure the breakdown voltage of 600V or more, it is preferable that the active layer 1c have the n-type impurity concentration of from $1\times10^{14}$ cm$^{-3}$ to $1.2\times10^{15}$ cm$^{-3}$, if the thickness of the active layer 1c is 15 μm or less. In order to ensure the breakdown voltage of 600V or more, it is preferable that the active layer 1c have the n-type impurity concentration of from $1\times10^{14}$ cm$^{-3}$ to $8\times10^{14}$ cm$^{-3}$, if the thickness of the active layer 1c is 20 μm.

The LOCOS oxide layer 3 is formed on a surface of the drift layer 2. The parts of the lateral IGBT are electrically insulated from each other by the LOCOS oxide layer 3. A p⁺-type collector region 4 is formed in the surface portion of the drift layer 2 and exposed outside the LOCOS oxide layer 3. The collector region 4 has a longitudinal direction parallel to a surface of the SOI substrate 1. The collector region 4 is surrounded by an n-type buffer layer 5. The buffer layer 5 has an impurity concentration greater than that of the drift layer 2.

A p-channel well layer 6, an n⁺-type emitter region 7, a p⁺-type contact layer 8, and a p-type body layer 9 are formed in the surface portion of the drift layer 2. The well layer 6, the emitter region 7, the contact layer 8, and the body layer 9 extend parallel to the collector region 4 and are exposed outside the LOCOS oxide layer 3.

A surface portion of the well layer 6 serves as a channel region. For example, the well layer 6 can have the thickness of 2 μm or less and the width of 6 μm or less. As shown in FIG. 16, the well layer 6 extends in the longitudinal direction of the collector region 4 (and a collector electrode 12, which is described later).

The emitter region 7 is formed in a surface portion of the well layer 6 and terminated inside the well layer 6. The emitter region 7 extends in the longitudinal direction of the collector region 4. According to the sixth embodiment, as shown in FIG. 16, one emitter region 7 is located on each side of the contact layer 8 (and the body layer 9).

The contact layer 8 fixes the well layer 6 to an emitter potential and has an impurity concentration greater than that of the well layer 6. As shown in FIG. 16, the contact layer 8 extends in the longitudinal direction of the collector region 4 (and the collector electrode 12).

The body layer 9 reduces a voltage drop caused by a Hall current flowing from a collector to an emitter. The longitudinal direction of the body layer 9 is parallel to the longitudinal direction of the collector region 4 (and the collector electrode 12). The body layer 9 reduces or prevents operation of a parasitic npn transistor, which is constructed with the emitter region 7, the well layer 6, and, the drift layer 2. Thus, turn-off time can be improved.

Assuming that the well layer 6, the emitter region 7, the contact layer 8, and the body layer 9 are considered as one set, two sets of these are arranged side by side in a width direction, perpendicular to the longitudinal direction, of the collector region 4. As shown in FIG. 15B and FIG. 16, each set is divided at two points near the center in the longitudinal direction and thus separated unto three regions. The center region of the three regions serves as the sense cell, and the main cell is located on each side of the sense cell. Thus, the emitter of the sense cell is located between the emitters of the main cell. The body layer 9 of the main cell is separated from the body layer 9 of the sense cell to provide junction isolation for preventing a leak current therethrough.

A p⁺-type isolation layer 8a is formed between the emitter region 7 of the sub-sense and the emitter region 7 of the main cell. The isolation layer 8a extends from an end of the contact layer 8 toward an end of the emitter region 7 in a direction perpendicular to the longitudinal direction of the contact layer 8. The isolation layer 8a reduces or prevents operation of a parasitic transistor, which is constructed with the emitter region 7, the body layer 9, and, the drift layer 2 in each of the main cell and the sense cell.

A gate electrode 11 is located on a surface of the well layer 6 through a gate insulating layer 10. For example, the gate electrode 11 can be made of doped polysilicon. The surface portion of the well layer 6 becomes the channel region by applying a voltage to the gate electrode 11.

A collector electrode 12 is located on and electrically connected to the collector region 4. An emitter electrode 13 is located on and electrically connected to the emitter region 7 and the contact layer 8. As described above, according to the sixth embodiment, two sets, each of which has the well layer 6, the emitter region 7, the contact layer 8, and the body layer 9, are arranged side by side. The emitter electrode 13 of one set is located adjacent and electrically connected to the emitter electrode 13 of the other set.

As shown in FIG. 16, a main wire 15a is electrically connected to the emitter electrode 13 of the main cell, and a sense wire 15b is electrically connected to the emitter electrode 13 of the sense cell. The main wire 15a and the sense wire 15b extend in a direction away from the collector. The main wire 15a also extends in the longitudinal direction of the emitter region 7. A collector wire 16 is electrically connected to the collector electrode 12 of each cell. The collector wire 16 extends in the longitudinal direction of the collector electrode 12. For example, the main wire 15a, the sense wire 15b, and the collector wire 16 can be made of aluminum and provided as a first wire layer of multilayer structure in which multiple wire layers are formed through interlayer dielectric films.

Since the collector wire 16, the main wire 15a, and the sense wire 15b do not cross each other, the effect of coupling current caused by potential variations in the collector can be reduced. Thus, accuracy with which the sense cell detects the current can be improved.

Next, operations of the lateral IGBT according to the sixth embodiment are described below. When a predetermined voltage is applied to the gate electrode 11, the channel region appears in the surface portion of the well layer 6, which is located below the gate electrode 11 between the emitter region 7 and the drift layer 2. Electrons flow from the emitter electrode 13 and the emitter region 7 into the drift layer 2 through the channel region. Accordingly, holes flow into the drift layer 2 through the collector electrode 12 and the collector region 4. Thus, conductivity modulation occurs in the drift layer 2 so that a large current can flow between the emitter and the collector. In this way, the lateral IGBT operates.

An advantage of the sixth embodiment is summarized below. According to the sixth embodiment, the main cell is located on each side of the sense cell so that the emitter of the sense cell can be located between the emitters of the main cell. Thus, the emitter current density in the main cell and the emitter current density in the sense cell approach each other so that a mirror ratio can approach a ratio between the lengths of the emitters of the main cell and the sense cell. Further, when the emitter current density in the main cell and the emitter current density in the sense cell approach each other, the amount of current per unit area during switching operation, where a large current flow, can be smaller in the sense cell than in the main cell. Thus, non-uniformity in current distribution is reduced so that the breakdown voltage can be improved.

Therefore, the sense cell can accurately detect the current flowing through the main cell with an improved linearity, even when the lateral IGBT is used as a high breakdown voltage device.

Seventh Embodiment

A lateral IGBT according to a seventh embodiment of the present invention is described below with reference to FIGS. 17, 18, and 19. A difference between the sixth embodiment and the seventh embodiment is as follows.

Figure 17:
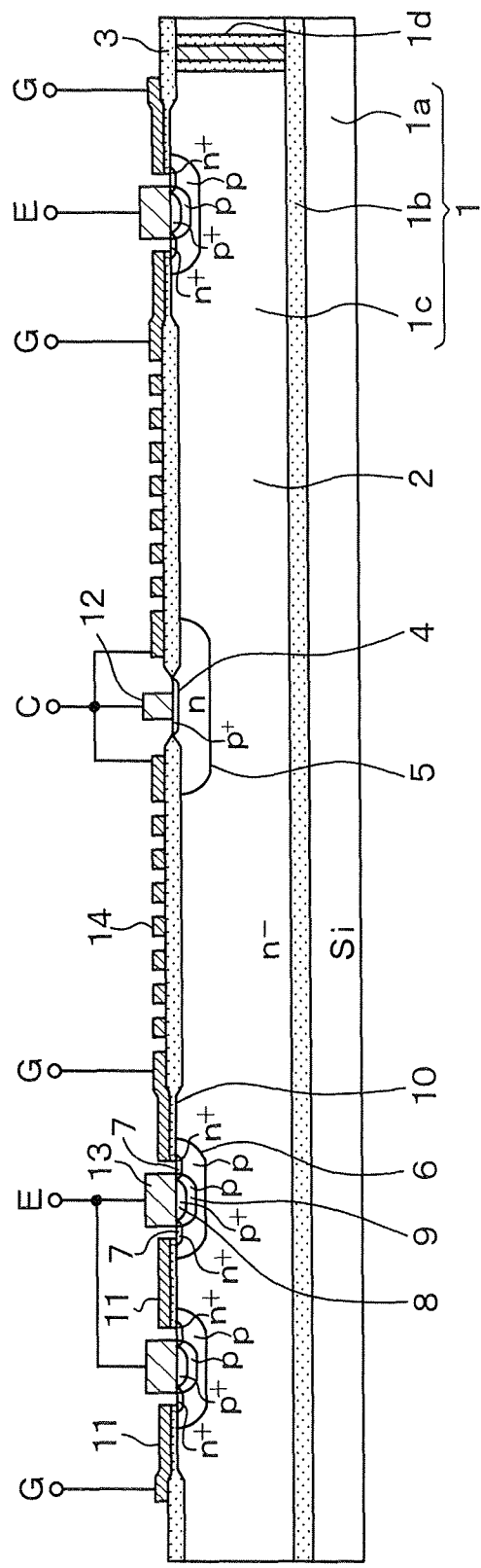
FIG. 17 is a diagram illustrating a cross-sectional view taken along the line XVII-XVII in FIG. 18.
Figure 18:
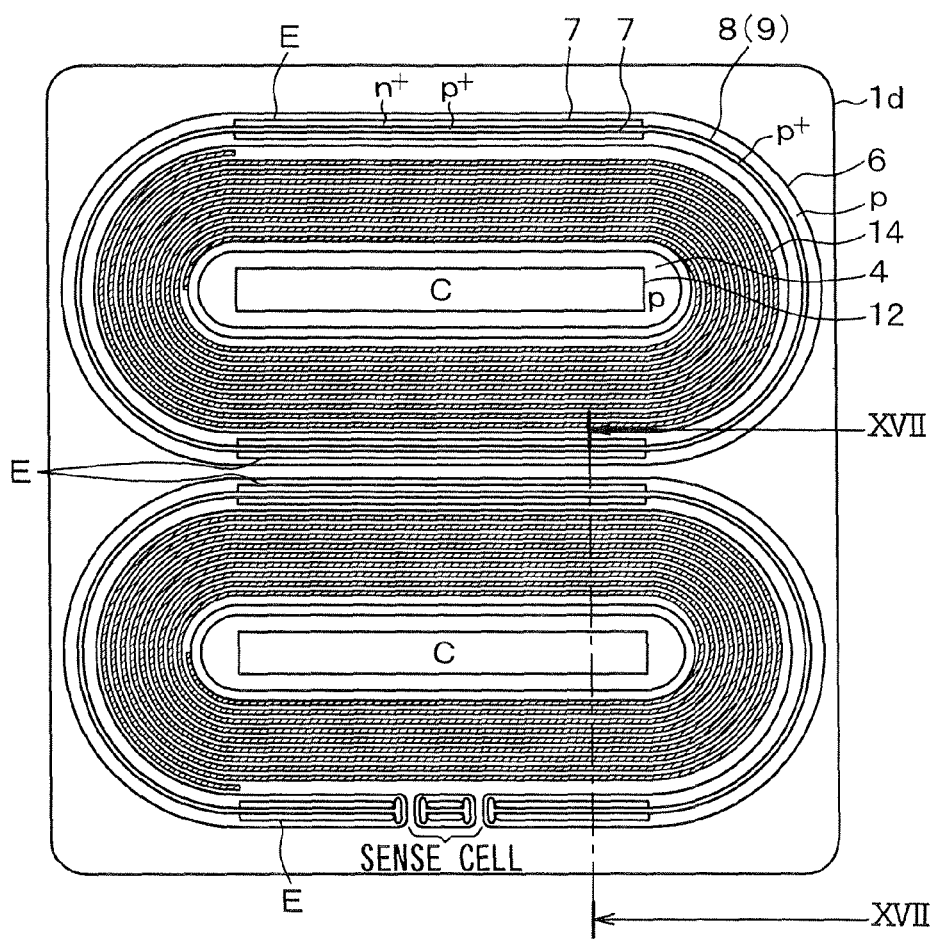
FIG. 18 is a diagram illustrating a top view of a semiconductor device according to a seventh embodiment of the present invention.
Figure 19:
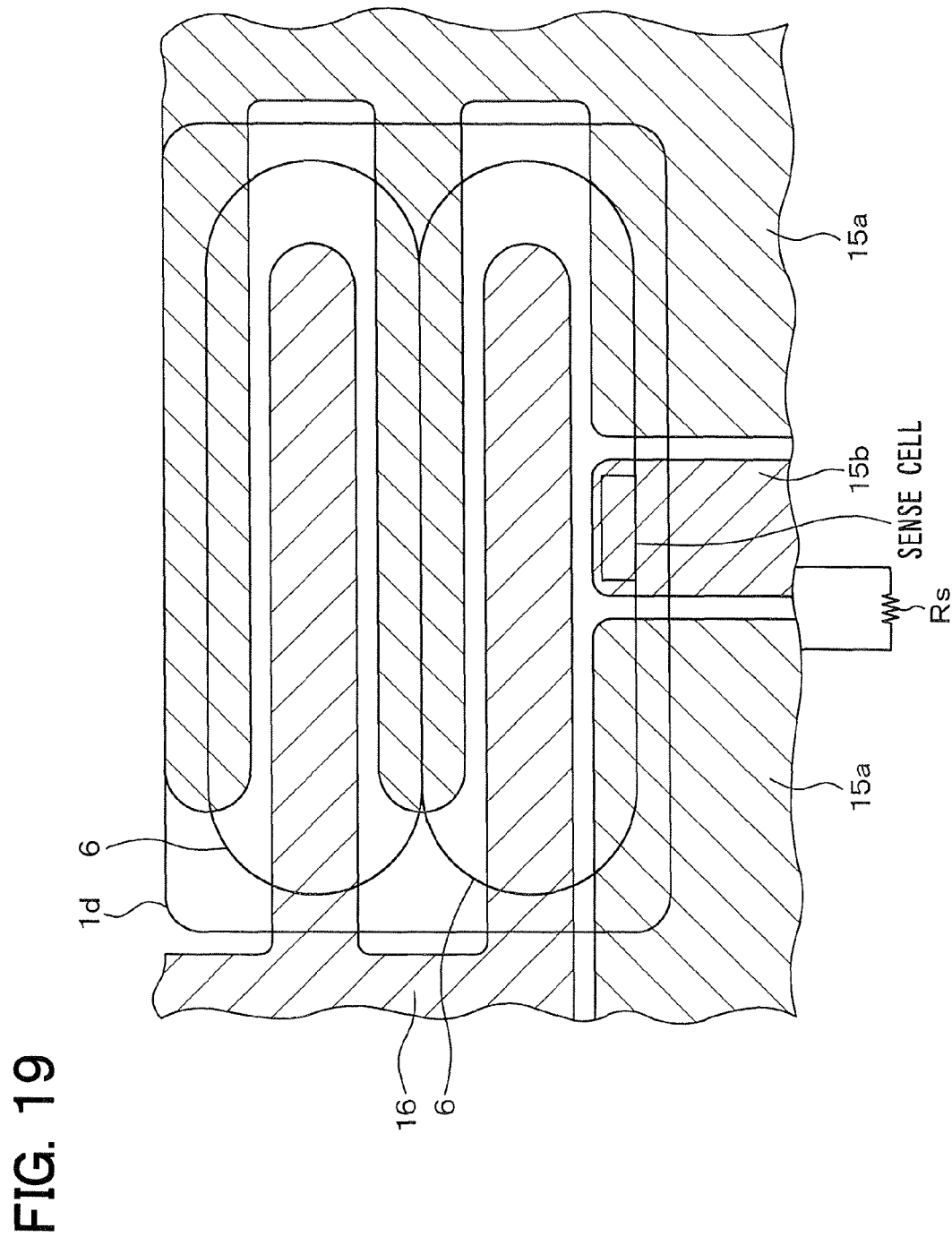
FIG. 19 is a diagram illustrating an enlarged view of FIG. 18.

FIG. 17 is a cross-sectional view taken along the line XVII-XVII in FIG. 18, FIG. 18 is a top view of the lateral IGBT according to the seventh embodiment, and FIG. 19 is a simplified enlarged view of FIG. 18, illustrating a wiring layout. In FIG. 18, only the well layer 6 and the sense cell are shown for ease of understanding.

Like the sixth embodiment, the collector region 4 has the longitudinal direction and is surrounded by the buffer layer 5. Unlike the sixth embodiment, the collector region 4 and the buffer layer 5 are located in the center of the well layer 6, the emitter region 7, the contact layer 8, and the body layer 9.

Specifically, as shown in FIG. 18, the well layer 6 is arranged circularly around the collector region 4 so that the collector region 4 can be singly surrounded by the well layer 6. The emitter region 7 is formed in the surface portion of the well layer 6 and extends in the longitudinal direction of the collector region 4. According to the seventh embodiment, as shown in FIG. 18, one emitter region 7 is located on each side of the contact layer 8 (and the body layer 9). The emitter region 7 has a straight shape and is located parallel to the collector region 4 except ends (i.e., rounded portions) of the collector region 4 in the longitudinal direction. The contact layer 8 is arranged circularly around the collector region 4 so that the collector region 4 can be singly surrounded by the contact layer 8. Likewise, the body layer 9 is arranged circularly around the collector region 4 so that the collector region 4 can be singly surrounded by the body layer 9. In this way, the well layer 6, the contact layer 8, and the body layer 9 are concentrically arranged around the collector region 4.

In each cell, as shown in FIGS. 17 and 18, the well layer 6, the emitter region 7, the contact layer 8, and the body layer 9 are arranged on each side of the collector region 4. The cells are located adjacent to each other so that two sets of the well layer 6, the emitter region 7, the contact layer 8, and the body layer 9 can be located between the collector regions 4 of adjacent cells.

Further, according to the seventh embodiment, a resistor layer 14 serving as a field plate is formed on the LOCOS oxide layer 3 between the collector and the gate. For example, the resistor layer 14 can be made of doped polysilicon. The resistor layer 14 serves to maintain a uniform potential gradient between the collector and the gate. Specifically, as shown in FIG. 18, the resistor layer 14 has a spiral shape and is wound around the collector electrode 12. The resistor layer 14 is electrically connected at one end to the collector electrode 12 and at the other end to the gate electrode 11. The potential of the resistor layer 14 gradually decreases with the distance from the collector electrode 12 due to a voltage drop caused by an internal resistance of the resistor layer 14. Thus, the potential gradient in the resistor layer 14 can be maintained uniform. Accordingly, the potential gradient in the drift layer 2, which is located below the resistor layer 14 across the LOCOS oxide layer 3, can be maintained uniform. Thus, electric field concentration resulting from non-uniform potential gradient is reduced so that the breakdown voltage can be improved. Further, impact ionization is reduced so that an increase in turn-off time can be reduced.

In and example shown in FIG. 18, multiple main cells, each of which has an ellipse shape when viewed from the top, are arranged side by side in a direction perpendicular to the longitudinal direction of the collector region 4. The sense cell is formed with a straight portion of the emitter region 7 of the outermost main cell. The main cell and the sense cell are located in the same island surrounded by the trench structure 1d.

The main cell is located on each side of the sense cell so that the emitter of the sense cell can be located between the emitters of the main cells. As shown in FIG. 19, the main wire 15a is electrically connected to the emitter electrode 13 of the main cell, and the sense wire 15b is electrically connected to the emitter electrode 13 of the sense cell. The main wire 15a and the sense wire 15b extend in a direction away from the collector. The main wire 15a also extends in the longitudinal direction of the emitter region 7. The collector wire 16 is electrically connected to the collector electrode 12 of each cell. The collector wire 16 extends in the longitudinal direction of the collector electrode 12.

Thus, like the sixth embodiment, the collector wire 16, the main wire 15a, and the sense wire 15b do not cross each other so that the effect of coupling current caused by potential variations in the collector can be reduced. Thus, accuracy with which the sense cell detects the current can be improved. Further, the wiring length can be reduced as much as possible so as to reduce noise.

Further, as shown in FIG. 19, the sense resistor Rs is located between the sense wire 15b and the main wire 15a that is located adjacent to the sense wire 15b. For example, the main wire 15a can be formed with a top layer of the SOI substrate 1. In such an approach, the sense resistor Rs can be directly connected to the main wire 15a at the shortest distance. Thus, the current can be accurately detected.

The sense resistor Rs can be formed with various types of resistors. For example, the sense resistor Rs can be a diffused resistor formed in an island that is electrically isolated from the island where the main cell and the sense cell are formed. Alternatively, the sense resistor Rs can be a polisilicon or a thin-film resistor formed on an interlayer insulation layer.

Although the resistor layer 14 serving as a field plate improves the breakdown voltage, the resistor layer 14 can act as a source of noise due to the fact that the potential of the resistor layer 14 changes during switching operation. The noise may reduce the accuracy with which the current is detected. However, since the sense wire 15b extends in the direction far away from the collector not to cross the resistor layer 14, the reduction in the accuracy can be prevented even if the resistor layer 14 acts as a source of noise.

Further, according to the seventh embodiment, the sense cell is located in almost the center of the straight portion of the emitter of the main cell in the longitudinal direction. In such an approach, the amount of holes flowing into the sense cell can almost depend on the average hole concentration in the main cell. Thus, the mirror ratio approaches the ratio between the lengths of the main cell and the sense cell so that a variation in the mirror ratio can be reduced.

In the example shown in FIG. 18, two cells are arranged side by side. Alternatively, three or more cells can be arranged side by side. Even in such a case, the sense cell is formed with a straight portion of the emitter region 7 of the outermost main cell.

Eighth Embodiment

An eighth embodiment of the present invention is described below with reference to FIG. 20. A difference of the eighth embodiment from the sixth embodiment is as follows.

Figure 20:
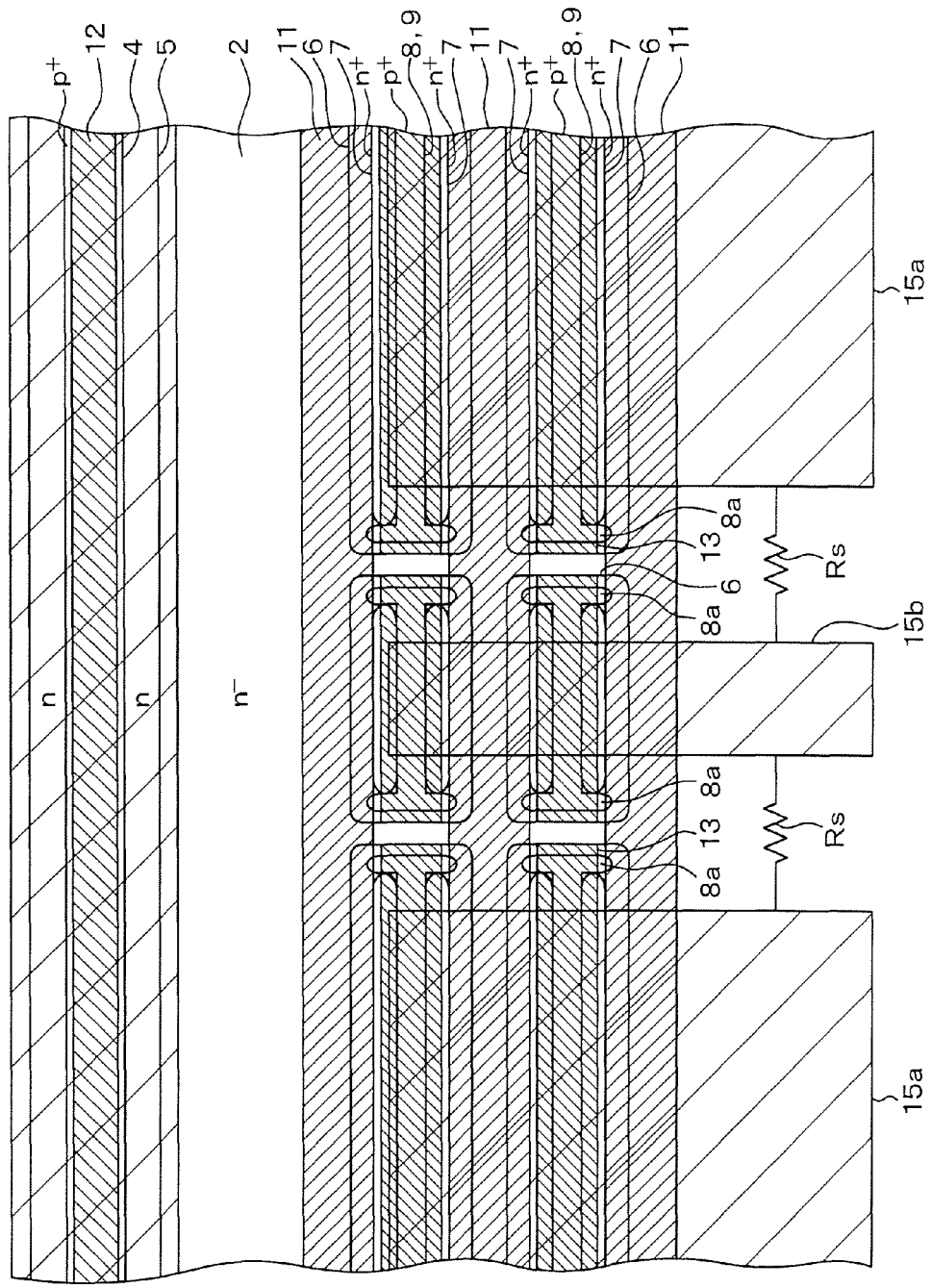
FIG. 20 is a diagram illustrating a top view of a semiconductor device according to an eighth embodiment of the present invention.

FIG. 20 is a top view of a lateral IGBT according to the eighth embodiment. As shown in FIG. 20, according to the eighth embodiment, the sense resistor Rs is located between the sense wire 15b and the main wire 15a on each side of the sense wire 15b.

In such an approach, the resistance on each side of the sense cell is balanced so that operations of the main cell on each side of the sense cell can be balanced. Thus, the current can be accurately detected by the sense cell.

Likewise, the sense resistor Rs shown in FIG. 19 can be located between the sense wire 15b and the main wire 15a on each side of the sense wire 15b.

Ninth Embodiment

An inverter circuit according to a ninth embodiment of the present invention is described below with reference to FIG. 21. The inverter circuit is constructed with the semiconductor device of the seventh embodiment. Alternatively, the inverter circuit can be constructed with the semiconductor device of the sixth embodiment or the eighth embodiment.

Figure 21:
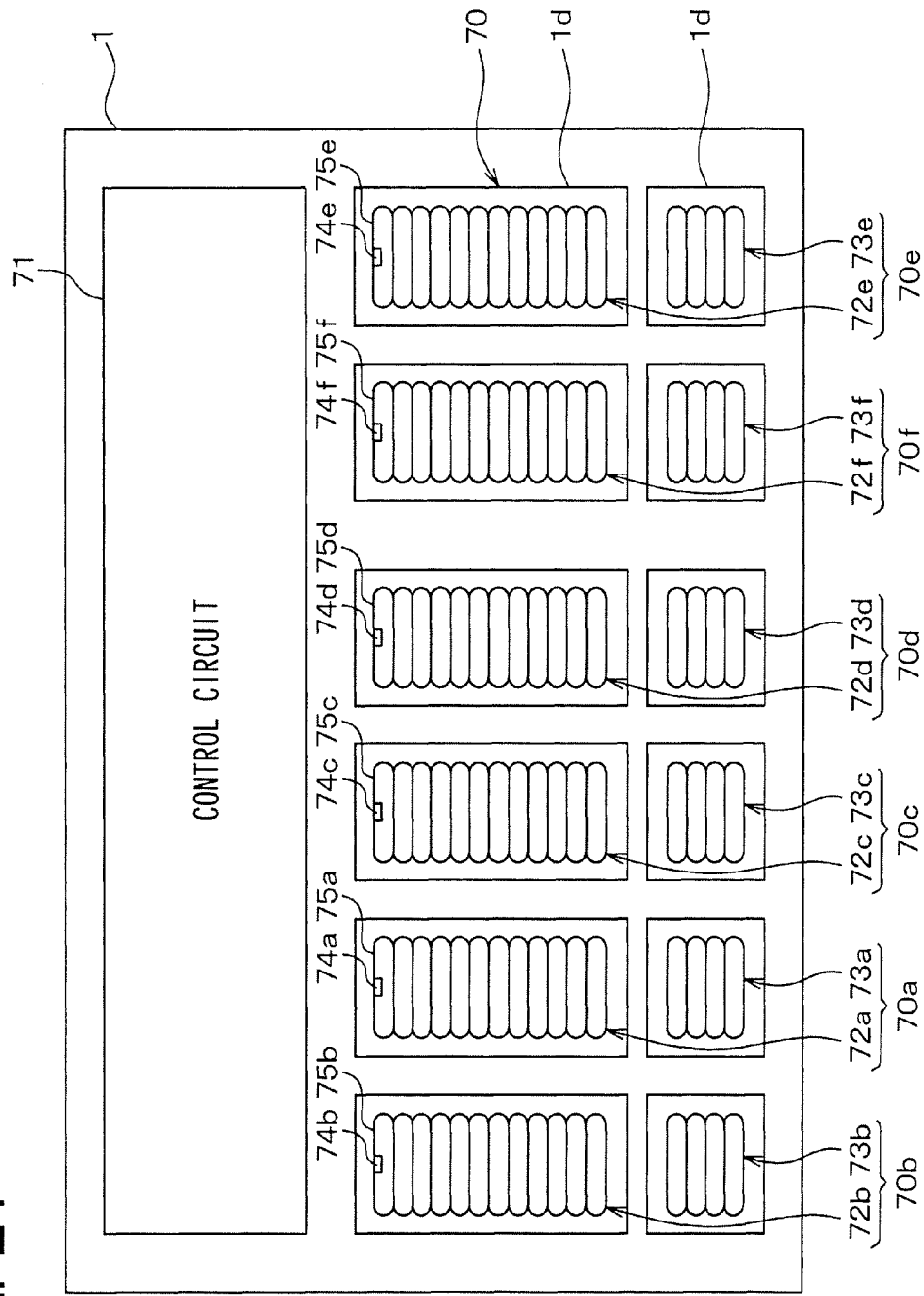
FIG. 21 is a diagram illustrating a top view of a semiconductor device according to a ninth embodiment of the present invention.

FIG. 21 is a top view of a semiconductor device having the inverter circuit. The inverter circuit drives a three-phase motor (not shown) based on a high voltage (e.g., 288 volts) supplied from a main power source (not shown) such as a battery. The inverter circuit is integrated in the semiconductor device so that the semiconductor device can be configured as one-chip inverter driver IC. Specifically, when the three-phase motor is driven, an external microcomputer (not shown) controls the inverter circuit in such a manner that an alternating current can be supplied to each phase of the three-phase motor in turn.

The inverter circuit is formed in the SOI substrate 1 and includes an inverter output circuit 70, a control circuit 71. The inverter output circuit 70 includes three phase legs connected in parallel to each other. A u-phase leg of the inverter output circuit 70 consists of a top switch 70a and a bottom switch 70b connected in series with the top switch 70a. A v-phase leg of the inverter output circuit 70 consists of a top switch 70c and a bottom switch 70d connected in series with the top switch 70c. A w-phase leg of the inverter output circuit 70 consists of a top switch 70e and a bottom switch 70f connected in series with the top switch 70e. The control circuit 71 controls the six switches 70a-70f.

The top switches 70a, 70c, and 70e and the bottom switches 70b, 70d, and 70f are alternately arranged in the left-to-right direction of FIG. 21. Specifically, in an example shown in FIG. 21, the bottom switch 70b, the top switch 70a, the top switch 70c, the bottom switch 70d, the bottom switch 70f, and the top switch 70e are arranged in this order from the left to the right of FIG. 21. The switches 70a-70f have lateral IGBTs 72a-72f and FWDs 73a-73f, respectively. The lateral IGBTs 72a-72f, the FWDs 73a-73f, and the control circuit 71 are isolated from each other by trench structures 1d.

Each of the lateral IGBTs 72a-72f has main cells 75a-75f and sense cells 74a-74f. The lateral IGBTs 72a-72f are iden-tical in structure. For example, in the lateral IGBT 72a, the main cells 75a, each of which has an ellipse shape, are arranged in the top-to-bottom direction of FIG. 21, and the sense cell 74a is located in the outermost main cell 75a that is located closest to the control circuit 71. Although not shown in FIG. 21, the sense wire of the sense cell 74a is laid out not to cross the main wire of the main cell 75a and anode and cathode wires of the lateral FWD 73a.

As described above, according to the ninth embodiment, the sense cells 74a-74f are located in the outermost main cells 75a-75f that are located closest to the control circuit 71. In such an approach, the sense wires of the sense cells 74a-74f can be laid out not to cross the main wires of the main cells 75a-75f and anode and cathode wires of the lateral FWDs 73a-73f. That is, the sense wires of the sense cells 74a-74f can be laid out not to cross high voltage wires of the lateral IGBTs 72a-72f and the lateral FWDs 73a-73f. Therefore, even when the output voltage (i.e., voltage across the sense resistor Rs) of the sense cell is small, for example, 300 mV or less, the output voltage is not affected by the high voltage wires (e.g., up to 300V) of the lateral IGBTs 72a-72f and the lateral FWDs 73a-73f. Thus, the current can be accurately detected based on the output voltage.

Further, since the effect of reverse recovery currents in the lateral FWD 73a-73f is reduced, and the length of the wiring to the control circuit 71 is minimized, the effect of noise in the lateral IGBTs 72a-72f can be reduced.

Tenth Embodiment

Figure 22:
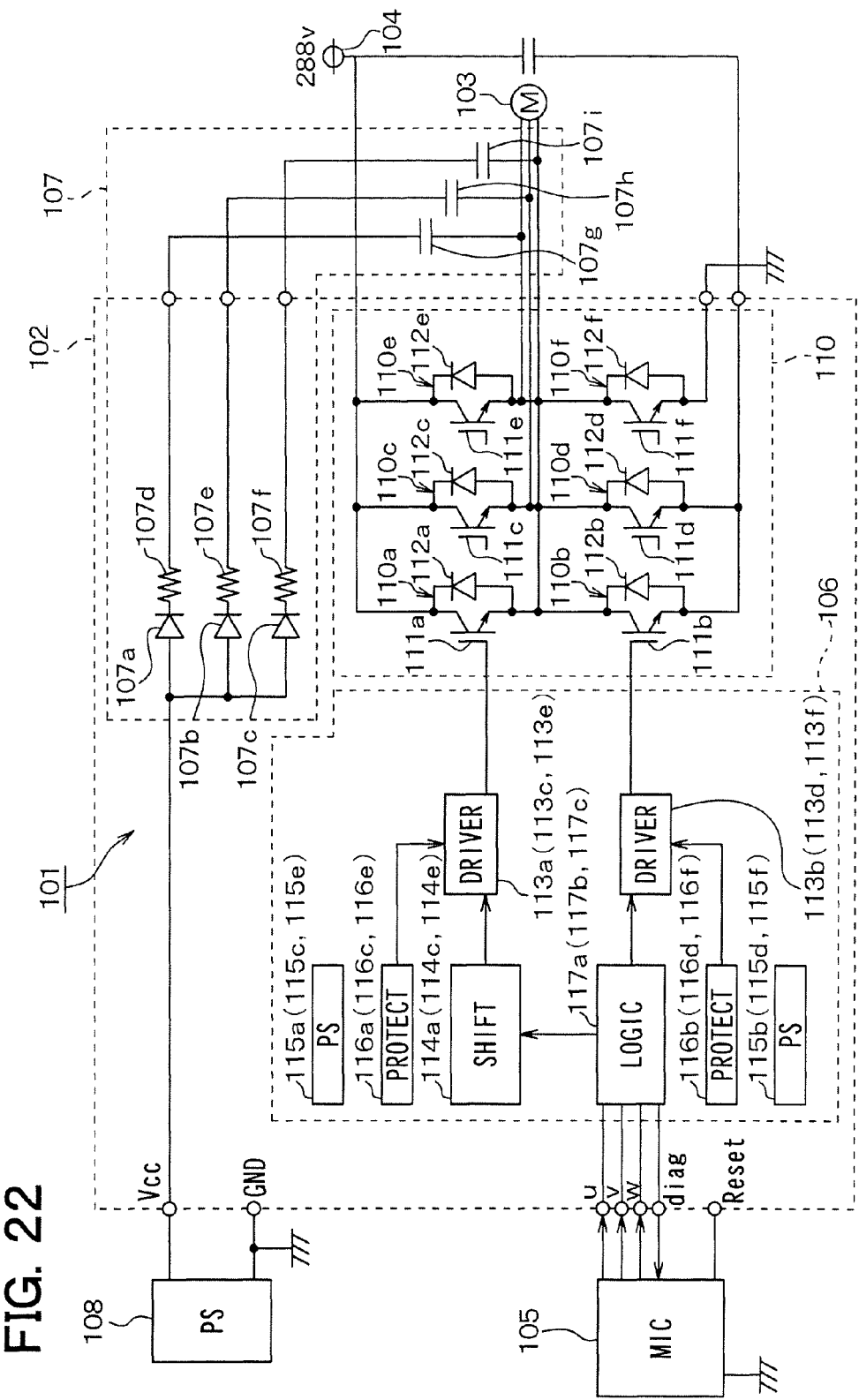
FIG. 22 is a circuit diagram of an inverter circuit according to a tenth embodiment of the present invention.
Figure 23:
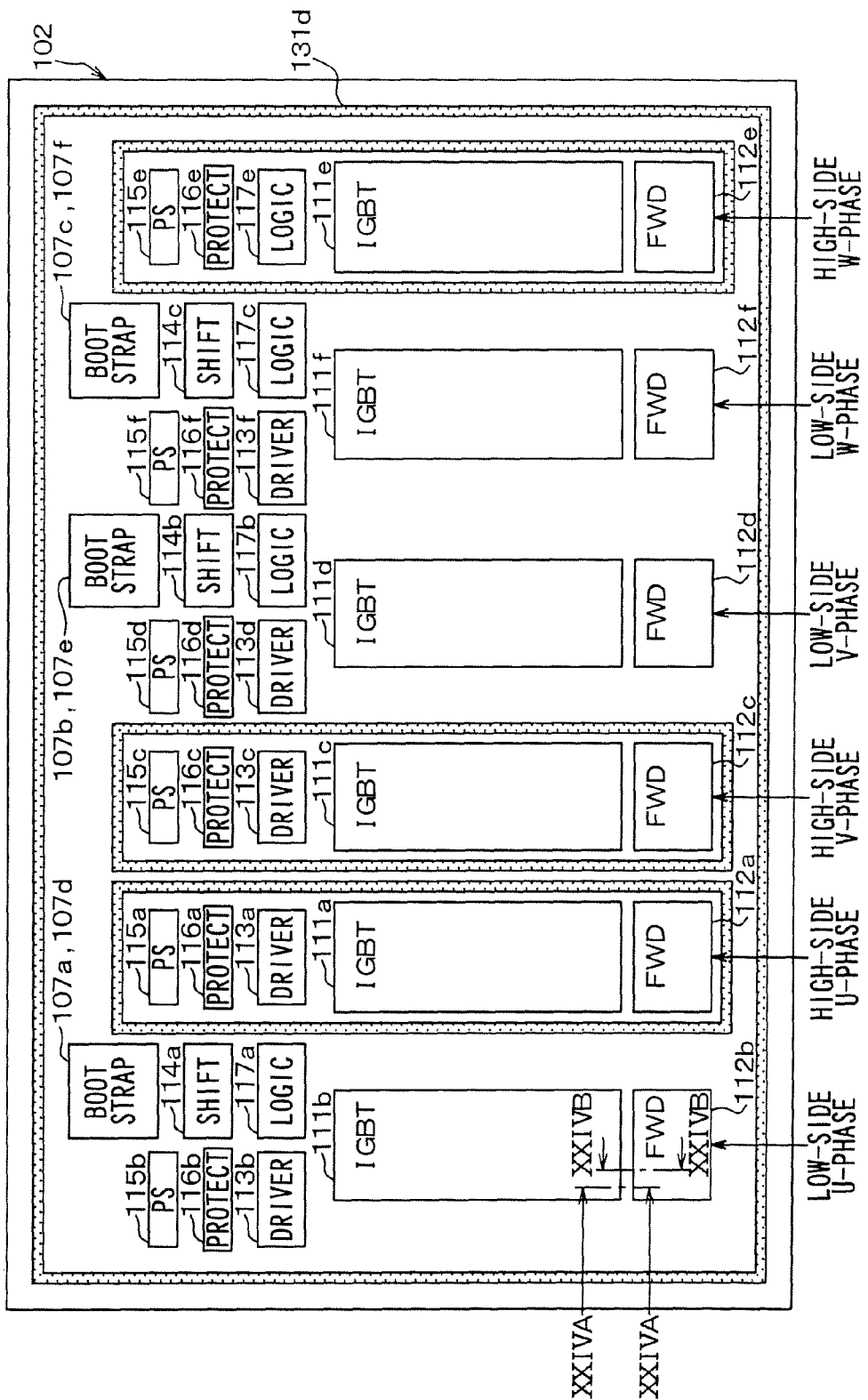
FIG. 23 is a diagram illustrating a top view of a semiconductor device in which the inverter circuit is integrated.

An inverter circuit 101 according to a tenth embodiment of the present invention is described below with reference to FIGS. 22, 23, and 24A and 24B. FIG. 22 is a circuit diagram of the inverter circuit 101. FIG. 23 is a top view of a semiconductor device 102 in which the inverter circuit 101 is integrated. FIG. 24A is a cross-sectional view taken along line XXIVA-XXIVA in FIG. 23, and FIG. 24B is a cross-sectional view taken along line XXIVB-XXIVB in FIG. 23.

The inverter circuit 101 is configured to drive a three-phase motor 103. The inverter circuit 101 is integrated in the semiconductor device 102 so that the semiconductor device 102 can be configured as one-chip inverter driver IC.

As shown in FIG. 22, the inverter circuit 101 drives the three-phase motor 103 based on a high voltage (e.g., 288 volts) supplied from a main power source 104 such a battery. When the three-phase motor 103 is driven, a microcomputer (MIC) 105 controls the inverter circuit 101 in such a manner that an alternating current can be supplied to each phase of the three-phase motor 103 in turn.

The semiconductor device 102 has an inverter output circuit 110, a control circuit 106, and a part of a bootstrap circuit 107. The inverter output circuit 110 includes three phase legs connected in parallel to each other. A u-phase leg of the inverter output circuit 110 consists of a top switch 110a and a bottom switch 110b connected in series with the top switch 110a. A v-phase leg of the inverter output circuit 110 consists of a top switch 110c and a bottom switch 110d connected in series with the top switch 110c. A w-phase leg of the inverter output circuit 110 consists of a top switch 110e and a bottom switch 110f connected in series with the top switch 110e. In FIG. 22, the microcomputer 105 and the remainder of the bootstrap circuit 107 are illustrated as external components of the semiconductor device 102. Alternatively, the microcomputer 105 and the remainder of the bootstrap circuit 107 can be integrated in the semiconductor device 102.

As shown in FIG. 22, the switches 110a-110f have IGBTs 111a-111f and FWDs 112a-112f, respectively. The control circuit 106 controls gate voltages applied to gates of the IGBTs 111a-111f so that midpoint point voltages between the top switches 110a, 110c, 110e and the bottom switches 110b, 110d, 110f can be applied to the u-phase, the v-phase, and the w-phase of the three-phase motor 103 in turn, respectively.

In the semiconductor device 102, the top switches 110a, 110c, and 110e and the bottom switches 110b, 110d, and 110f are alternately arranged in a predetermined pattern. Specifically, in an example shown in FIG. 23, the bottom switch 110b, the top switch 110a, the top switch 110c, the bottom switch 110d, the bottom switch 110f, and the top switch 110e are arranged in this order from the left to the right of FIG. 23. Each of the top switches 110a, 110c, and 110e, which are located on a high voltage side, and corresponding components of the control circuit 106 are surrounded by the trench structure 131d. For example, the IGBT 111a and the FWD 112a of the top switch 110a and a gate driver 113a, a power supply circuit 115a, and a protection circuit 116a of the control circuit 106 are surrounded by the trench structure 131d. Thus, the effects of high voltages of the top switches 110a, 110c, and 110e on the bottom switches 110b, 110d, and 110f, which are located on a low voltage side, can be prevented.

According to the tenth embodiment, as shown in FIGS. 24A and 24B, the IGBT 111a-111f, the FWDs 112a-112f, and the control circuit 106 are formed by using a SOI substrate 131. The SOI substrate 131 includes a supporting substrate 131a, a buried oxide (BOX) layer 131b on the supporting substrate 131a, and an active layer 131c on the BOX layer 131b. For example, the supporting substrate 131a and the active layer 131c can be made of silicon. Trench structures 131d are formed in the active layer 131c to divide the active layer 131c into multiple regions, including an IGBT region and a FWD region, that are electrically isolated from each other. Thus, the IGBT 111a-111f, the FWDs 112a-112f, and the control circuit 106 of the inverter circuit 101 are integrated in one-chip.

The active layer 131c is an n$^-$-type layer and serves as a n$^-$-type drift layer 132 in the IGBT region. Each part of the IGBT 111a-111f is formed in a surface portion of the drift layer 132. The active layer 131c serves as a n$^-$-type cathode layer 150 in the FWD region. Each part of the FWD 112a-112f is formed in the cathode layer 150.

In the IGBT region shown in FIG. 24A, a LOCOS oxide layer 133 is formed on a surface of the drift layer 132. The parts of the IGBTs 111a-111f are electrically insulated from each other by the LOCOS oxide layer 133.

A p$^+$-type collector region 134 is formed in the surface portion of the drift layer 132 and exposed outside the LOCOS oxide layer 133. The collector region 134 is surrounded by a n-type buffer layer 135 having an impurity concentration greater than that of the drift layer 132. A p-channel well layer 136, an n$^+$-type emitter region 137, a p$^+$-type contact layer 138, and a p-type body layer 139 are formed in the surface portion of the drift layer 132 and exposed outside the LOCOS oxide layer 133. The well layer 136, the emitter region 137, the contact layer 138, and the body layer 139 are arranged around the collector region 134.

A surface portion of the well layer 136 serves as a channel region. The well layer 136 is arranged circularly around the collector region 134 (and a collector electrode 142, which is described later) so that the collector region 134 can be singly surrounded by the well layer 136. The emitter region 137 is formed in a surface portion of the well layer 136 and terminated inside the well layer 136. According to the tenth embodiment, one emitter region 137 is located on each side of the contact layer 138.

The contact layer 138 fixes the well layer 136 to an emitter potential and has an impurity concentration greater than that of the well layer 136. The body layer 139 reduces a voltage drop caused by a Hall current flowing from a collector to an emitter. Thus, the body layer 139 reduces or prevents operation of a parasitic npn transistor, which is constructed with the emitter region 137, the well layer 136, and, the drift layer 132. In such an approach, turn-off time can be improved.

A gate electrode 141 is located on a surface of the well layer 136 through a gate insulating layer 140. For example, the gate electrode 141 can be made of doped polysilicon. The surface portion of the well layer 136 becomes the channel region by applying a voltage to the gate electrode 141.

A collector electrode 142 is located on and electrically connected to the collector region 134. An emitter electroder 143 is located on and electrically connected to the emitter region 137 and the contact layer 138.

Further, a resistor layer 144 is formed on the LOCOS oxide layer 133 between the collector and the gate. For example, the resistor layer 144 can be made of doped polysilicon. The resistor layer 144 serves to maintain a uniform potential gradient between the collector and the gate. Specifically, the resistor layer 144 is wound around the collector electrode 142 to form a spiral shape. The resistor layer 144 is electrically connected at one end to the collector electrode 142 and at the other end to the gate electrode 141. The potential of the resistor layer 144 decreases with the distance from the collector electrode 142 due to a voltage drop caused by an internal resistance of the resistor layer 144. Thus, the potential gradient in the resistor layer 144 can be maintained uniform. Accordingly, the potential gradient in the drift layer 132, which is located below the resistor layer 144 across the LOCOS oxide layer 133, can be maintained uniform.

In the FWD region shown in FIG. 24B, the LOCOS oxide layer 133 is formed on a surface of the cathode layer 150. The parts of the FWDs 112a-112f are electrically insulated from each other by the LOCOS oxide layer 133. A n$^+$-type contact layer 151 and a n-type buffer layer 152 are formed in the surface portion of the cathode layer 150 and exposed outside the LOCOS oxide layer 133. The contact layer 151 and the buffer layer 152 are surrounded by a p-type anode layer 153 and a p$^+$-type contact layer 154.

A cathode electrode 155 and an anode electrode 156 are formed on a surface of the SOI substrate 131. The cathode electrode 155 is electrically connected to the contact layer 151. The anode electrode 156 is electrically connected to the contact layer 154 and the anode layer 153. Further, a resistor layer 157 is formed on the LOCOS oxide layer 133 between the anode and the cathode. For example, the resistor layer 157 can be made of doped polysilicon. The resistor layer 157 serves to maintain a uniform potential gradient between the anode and the cathode. Specifically, the resistor layer 157 is wound around the cathode electrode 155 to form a spiral shape. The resistor layer 157 is electrically connected at one end to the cathode electrode 155 and at the other end to the anode electrode 156. The potential of the resistor layer 157 decreases with the distance from the cathode electrode 155 due to a voltage drop caused by an internal resistance of the resistor layer 157. Thus, the potential gradient in the resistor layer 157 can be maintained uniform. Accordingly, the potential gradient in the active layer 131c, which is located below the resistor layer 157 across the LOCOS oxide layer 133, can be maintained uniform.

The control circuit 106 drives the u-phase leg, the v-phase leg, and the w-phase leg of the inverter output circuit 110, thereby controlling the three-phase motor 103. For the sake of simplicity, in FIG. 22, a portion of the control circuit 106 corresponding to the u-phase leg is shown. The control circuit 106 includes gate drivers 113a-113f, level shifters 114a-114c, power supply circuits 115a-115f, protection circuits 116a-116f, and logic circuits 117a-117c.

The gate drivers 113a, 113c, and 113e drive the top switches 110a, 110c, and 110e, respectively. The gate drivers 113b, 113d, and 113f drive the bottom switches 110b, 110d, and 110f, respectively. The gate drivers 113a-113f output the gate voltages to the gates of the IGBTs 111a-111f, respectively, so that the IGBTs 111a-111f can be driven according to the gate voltages. The gate voltages are controlled by the microcomputer 105.

The IGBTs 111a, 111c, and 111e, which are driven by the gate drivers 113a, 113c, and 113e, operate with reference to a high potential. In contrast, the IGBTs 111b, 111d, and 111f, which are driven by the gate drivers 113b, 113d, and 113f, operate with reference to a low potential. Therefore, there is a need to shift a level of the reference potential. The first level shifter 114a is located between the top switch 110a and the bottom switch 110b. The second level shifter 114b is located between the top switch 110c and the bottom switch 110d. The third level shifter 114c is located between the top switch 110e and the bottom switch 110f.

The power supply circuit 115a-115f generate power supply voltages based on which the gate drivers 113a-113f operate.

The protection circuits 116a-116f detect the voltage of the main power source 104 and control the gate voltages, outputted from the gate drivers 113a-113f, based on the detected voltage of the main power source 104. For example, when the voltage of the main power source 104 is reduced below a predetermined threshold, the gate voltages are controlled so that the IGBTs 111a-111f can be turned OFF. In such an approach, the inverter circuit 101 and the three-phase motor 103 can be protected from malfunction.

Further, the protection circuits 116a-116f can detect an overheat condition of the semiconductor device 102. For example, the overheat condition can be detected based on a diode forward voltage Vf, which changes depending on a temperature. When the overheat condition is detected, the gate voltages are controlled so that the IGBTs 111a-111f can be turned OFF. In such an approach, the inverter circuit 101 and the three-phase motor 103 can be protected from malfunction.

The logic circuits 117a-117c receive commands from the microcomputer 105. The commands are used to drive the switches 110a-110f. The logic circuits 117a-117c output gate control signals to the gate drivers 113a-113f according to the commands. The gate drivers 113a-113f outputs the gate voltages according to the gate control signals.

The bootstrap circuit 107 generates a floating power supply from a voltage Vcc that is generated by an external power supply converter 108. The bootstrap circuit 107 includes diodes 107a-107c, resistors 107d-107f, and capacitors 107g-107i. The diode 107a, the resistor 107d, and the capacitor 107g form a first bootstrap circuit for the u-phase. The diode 107b, the resistor 107e, and the capacitor 107h form a second bootstrap circuit for the v-phase. The diode 107c, the resistor 107f, and the capacitor 107i form a third bootstrap circuit for the w-phase. In an initial state, the IGBTs 111b, 111d, and 111f are turned ON so that the capacitors 107g-107i can be charged through the diodes 107a-107c and the resistors 107d-107f. Thus, the floating power supplies can be generated by the capacitors 107g-107i. According to the tenth embodiment, the diodes 107a-107c and the resistors 107d-107f are integrated in the semiconductor device 102.

In this way, the IGBTs 111a-111f, the FWDs 112a-112f, the control circuit 106, and the part of the bootstrap circuit 107 are integrated in the SOI substrate 131 to form the semiconductor device 102 as one-chip inverter driver IC. Thus, the semiconductor device 102 can be reduced in size. Further, wire lengths can be reduced so that parasitic components such as parasitic inductance and parasitic resistance can be reduced.

Although not shown in FIG. 22, the inverter circuit 101 has a current detection circuit. The current detection circuit can be provided to at least one of a top switch set of the switches 110a, 110c, and 110e and a bottom switch set of the switches 110b, 110d, and 110f. According to the tenth embodiment, the current detection circuit is provided to the bottom switch set.

Figure 25:
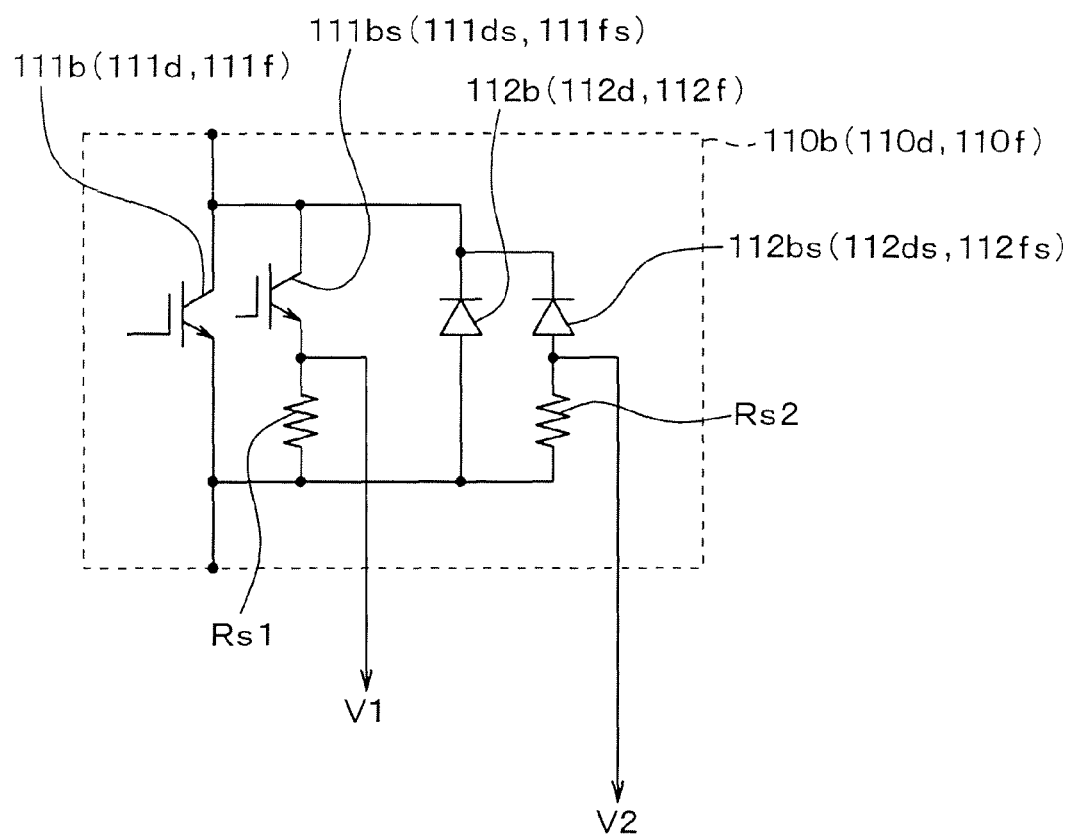
FIG. 25 is a circuit diagram of a bottom switch of the inverter circuit.

FIG. 25 illustrates a detailed circuit diagram of the bottom switch 110b having the current detection circuit. It is noted that each of the bottom switches 110d and 110f has the same configuration as the bottom switch 110b.

The current detection circuit is configured to detect the magnitude and direction of current flowing through the bottom switch 110b. Further, the circuit detection circuit detects an overcurrent condition in the bottom switch 110b. The detection result of the current detection circuit is sent to the microcomputer 105, and the gate voltages outputted from the gate drivers 113a-113f are controlled according to the detection result. For example, when the overcurrent condition is detected, the IGBTs 111a-111f can be turned OFF to protect the inverter circuit 101 and the three-phase motor 103 from malfunction.

Specifically, the current detection circuit includes a sense IGBT 111bs and a sense FWD 112bs. The IGBT 111b and the FWD 112b are hereinafter called the "main cell", and the sense IGBT 111bs and the sense FWD 112bs are hereinafter called the "sense cell". An area of the sense cell is 1/N of an area of the main cell. A current flowing through the sense cell becomes smaller than a current flowing through the main cell depending on the area ratio.

As shown in FIG. 25, a sense resistor Rs1 is connected in series with the sense IGBT 111bs, and a sense resistor Rs2 is connected in series with the sense FWD 112bs. A voltage V1 at a node between the sense resistor Rs1 and the sense IGBT 111bs is inputted to the microcomputer 105. Likewise, a voltage V2 at a node between the sense resistor Rs2 and the sense FWD 112bs is inputted to the microcomputer 105. Thus, the microcomputer 105 detects the magnitude and direction of the current based on the voltages V1 and V2. For example, the sense resisters Rs1, Rs2 can have a high resistance of from hundreds to thousands of ohms ($\Omega/\square$).

A method of detecting the magnitude and direction of the current flowing through the bottom switch 110b is described below with reference to FIGS. 26A-26C. In the bottom switch 110b, a current flows in the following way.

Figure 26A:
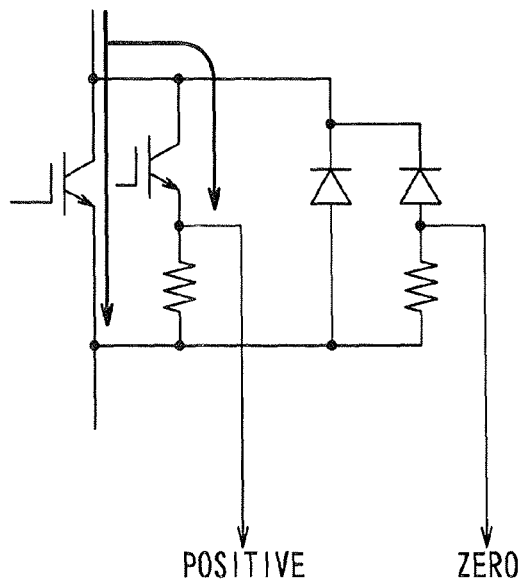
FIGS. 26A-26C are diagrams illustrating a current flow in the bottom switch.

When the IGBT 111b is turned ON, the current flows from the collector to the emitter of the IGBT 111b, as shown in FIG. 26A. Therefore, no current flows through the FWD 112b.

Figure 26B:
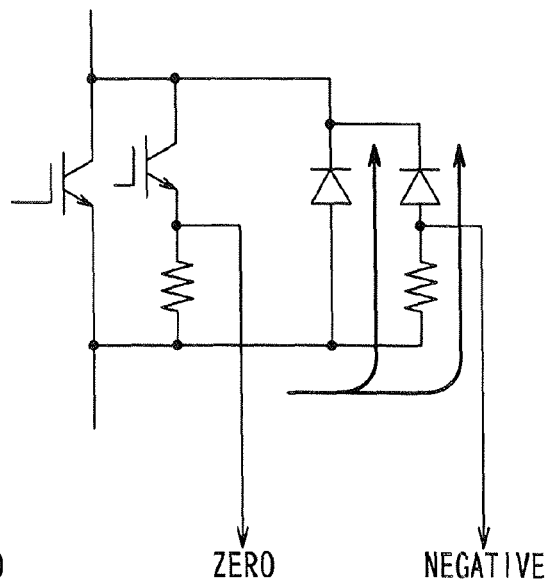

Then, when the IGBT 111b is turned OFF from ON, a reverse recovery current flows through the FWD 112b, as shown in FIG. 26B. Therefore, no current flows through the IGBT 111b, and the recovery current flows from the anode to the cathode of the FWD 112b.

Then, the recovery current becomes zero after a lapse of a certain period of time. As a result, no current flows through the IGBT 111b and the FWD 112b, as shown in FIG. 26C. Such a current flow is detected in the following way.

As shown in FIG. 26A, when the IGBT 111b of the bottom switch 110b is turned ON, the sense IGBT 111bs is turned ON so that a current can flow through the sense resistor Rs1. The voltage V1 appearing at the node between the sense IGBT 111*bs* and the sense resistor Rs1 becomes a value obtained by subtracting an on-voltage of the sense IGBT 111*bs* from the high voltage supplied from the main power source 104. Therefore, the voltage V1 has a positive value. On the other hands, since no current flows through the FWD 112*b*, the voltage V2 appearing at the node between the sense FWD 112*bs* and the sense resistor Rs2 becomes zero. Therefore, the magnitude (absolute value) of the current in the bottom switch 110*b* can be detected based on the voltage V1. Further, when the voltage V1 has a positive value, and the voltage V2 is zero, it is detected that the current flows in a forward direction from a high voltage side to a low voltage side.

Then, as shown in FIG. 26B, when the IGBT 111*b* of the bottom switch 110*b* is turned OFF from ON, the sense IGBT 111*bs* is turned OFF at the same time so that no current can flow through the sense resistor Rs1. As a result, the voltage V1 becomes zero. A reverse recovery current flows through the FWD 112*b* and the sense FWD 112*bs* at the moment when the IGBT 111*b* and the sense IGBT nibs are turned OFF. Therefore, the voltage V2 becomes a value obtained by subtracting a voltage across the sense resistor Rs2 from a ground voltage. Therefore, the voltage V2 has a negative value. Therefore, the magnitude (absolute value) of the current in the bottom switch 110*b* can be detected based on the voltage V2. Further, when the voltage V1 is zero, and the voltage V2 has a negative value, it is detected that the current flows in a backward direction from the low voltage side to the high voltage side.

Figure 26C:
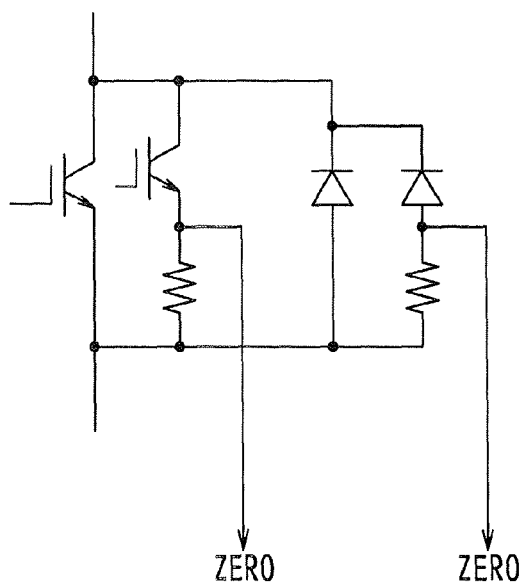

Then, as shown in FIG. 26C, when a certain period of time has been elapsed after the IGBT 111*b* and the sense IGBT 111*bs* are turned OFF, the flow of the recovery current stops. As a result, both the voltage V1 and the voltage V2 become zero. Therefore, when both the voltage V1 and the voltage V2 are zero, it is detected that no current flows in the bottom switch 110*b*.

As described above, according to the tenth embodiment, the sense cell as a current detection circuit is provided to only the bottom switches 110*b*, 110*d*, and 110*f*. The sense resistor Rs1 is connected in series with the sense cell of the lateral IGBT, and the sense resistor Rs2 is connected in series with the sense cell of the lateral FWD. Therefore, the absolute value and direction of the current in each phase can be detected by the voltage V1 across the sense resistor Rs1 and the voltage V2 across the sense resistor Rs2.

Thus, sensorless sinusoidal control of the current in each phase can be achieved so that the three-phase motor 103 can be driven with a low noise level. Since there is no need to use additional current sensor such as a Hall effect sensor, the inverter circuit 101 can be reduced in size and simplified in structure. Accordingly, the manufacturing cost of the inverter circuit 101 can be reduced.

Further, according to the tenth embodiment, the parts of the inverter circuit 101 are integrated in a common semiconductor substrate (i.e., SOI substrate 131) to form a single chip semiconductor device 102. Thus, the size can be reduced, and the wring length can be reduced. The reduction in the wiring length can reduce parasitic components such as parasitic capacitances and parasitic inductances. Therefore, the current can be detected accurately.

Further, according to the tenth embodiment, when the overcurrent condition is detected, the IGBTs 111*a*-111*f* can be turned OFF to protect the inverter circuit 101 and the three-phase motor 103 from malfunction. Likewise, when the over-heat condition is detected, the gate voltages are controlled so that the IGBTs 111*a*-111*f* can be turned OFF to protect the inverter circuit 101 and the three-phase motor 103 from malfunction. In such an approach, the inverter circuit 1 and the three-phase motor 103 can be surely protected from malfunction.

Eleventh Embodiment

An eleventh embodiment of the present invention is described below.

In the inverter circuit 101 according to the tenth embodiment, when an induced voltage produced by operation of the inverter output circuit 110 is in phase with a motor current supplied to the three-phase motor 103, power supplied to the three-phase motor 103 is maximized.

Figure 27A:
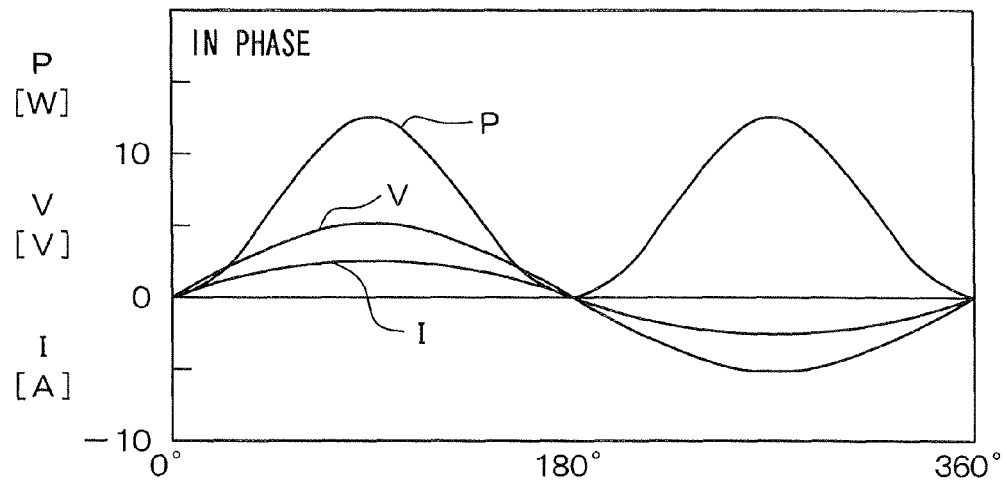
FIG. 27A is a diagram illustrating a waveform of a power when a motor current and an induced voltage are in phase.
Figure 27B:
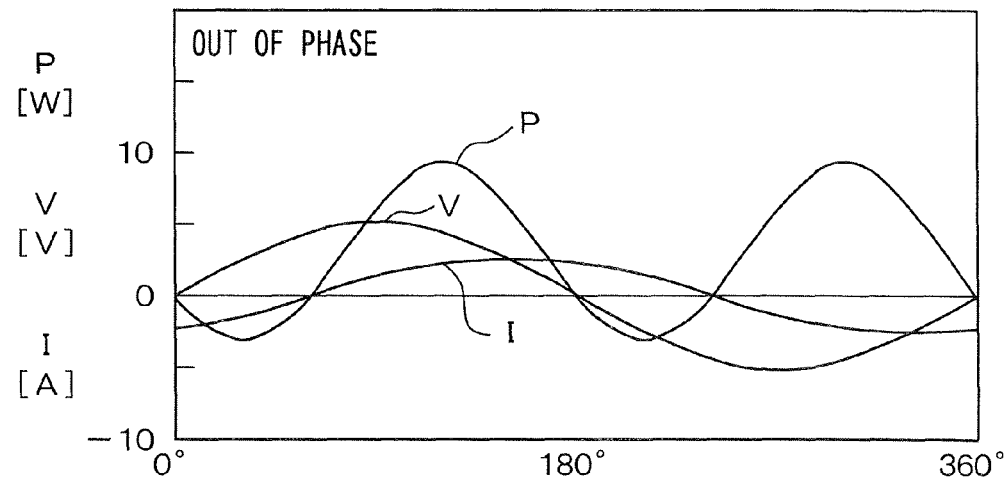
FIG. 27B is a diagram illustrating the waveform of the power when the motor current and the induced voltage are out of phase.

FIG. 27A is a diagram illustrating a waveform of the power when the induced voltage is in phase with the motor current. FIG. 27B is a diagram illustrating a waveform of the power when the induced voltage is out of phase with the motor current. As can be seen from comparing FIGS. 27A and 27B, the output power is greater when the induced voltage is in phase with the motor current than when the induced voltage is out of phase with the motor current. According to the eleventh embodiment, the phases of the induced voltage and the motor current are detected by using the current detection circuit provided to the bottom switches 110*b*, 110*d*, and 110*f*, and the microcomputer 105 controls the IGBTs 111*a*-111*f* so that the induced voltage and the motor current can be in phase with each other.

Specifically, the phases of the induced voltage and the motor current can be detected in the following ways.

Regarding the phase of the motor current, a zero-crossing occurs when the polarity of the current detected by the current detection circuit changes. Therefore, when the zero-crossing occurs, it can be determined that the phase of the motor current is 0°, 180°, or 360°.

Figure 28:
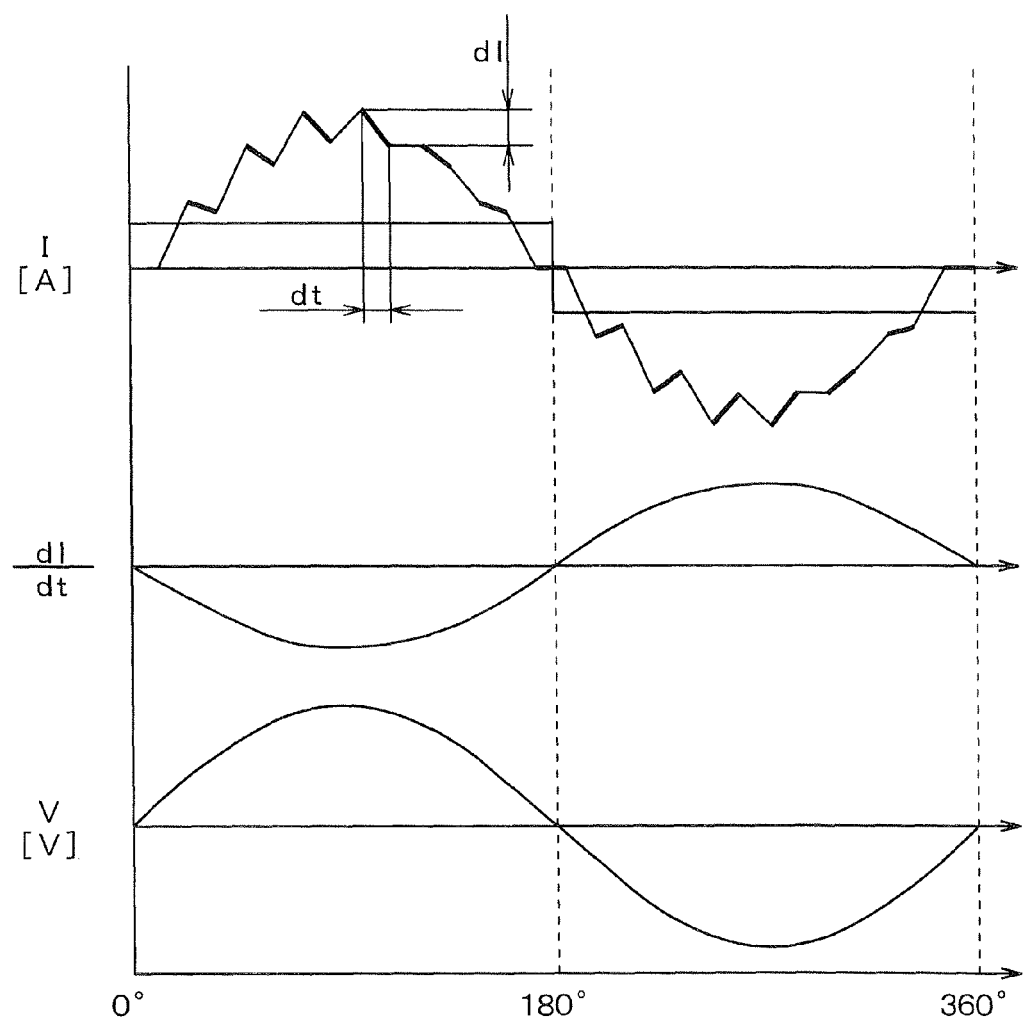
FIG. 28 is a diagram illustrating a waveform of the motor current, a waveform of a change in the motor current with time, and a waveform of the induced voltage.

The phase of the induced voltage can be detected based on the change in the motor current. Specifically, an equation about the induced voltage is given as follows: $\omega \cdot \phi_{max} \cdot \sin \theta + L \cdot dI/dt = 0$, where $\theta$ is a phase of the induced voltage, $\omega$ is an angular velocity, L is an inductance, $\phi_{max}$ is an interlinkage magnetic flux, and dI/dt is a change in the motor current. The change in the motor current is discussed in detail below with reference to FIG. 28.

The ON and OFF operation of the IGBTs 111*a*-111*f* is controlled by pulse width modulation (PWM) technique. In this case, the change in the motor current is not uniform due to the ON and OFF operation of the IGBTs 111*a*-111*f*. Specifically, as shown n FIG. 28, the change in the motor current varies depending on the phase. For example, the change in the motor current is large at a peak and a trough of the motor current but almost zero at the zero-crossing point. Thus, the phase of the induced voltage, specifically, the zero-crossing point of the induced voltage can be detected based on the change in the motor current.

In this way, the phase of the motor current can be detected based on the polarity of the motor current. Further, the phase of the induced voltage can be detected based on the change in the motor current by a known technique, for example, as disclosed in JP 4396762.

However, as mentioned above, the change in the motor current is not uniform due to the ON and OFF operation of the IGBTs 111*a*-111*f*. Therefore, there is a possibility that the phase of the induced voltage is not accurately detected, if the motor current is detected at the timing of switching of the IGBTs 111*a*-111*f*. To prevent this problem, according to the eleventh embodiment, the motor current is detected in accordance with a timing chart shown in FIG. 29.

Figure 29:
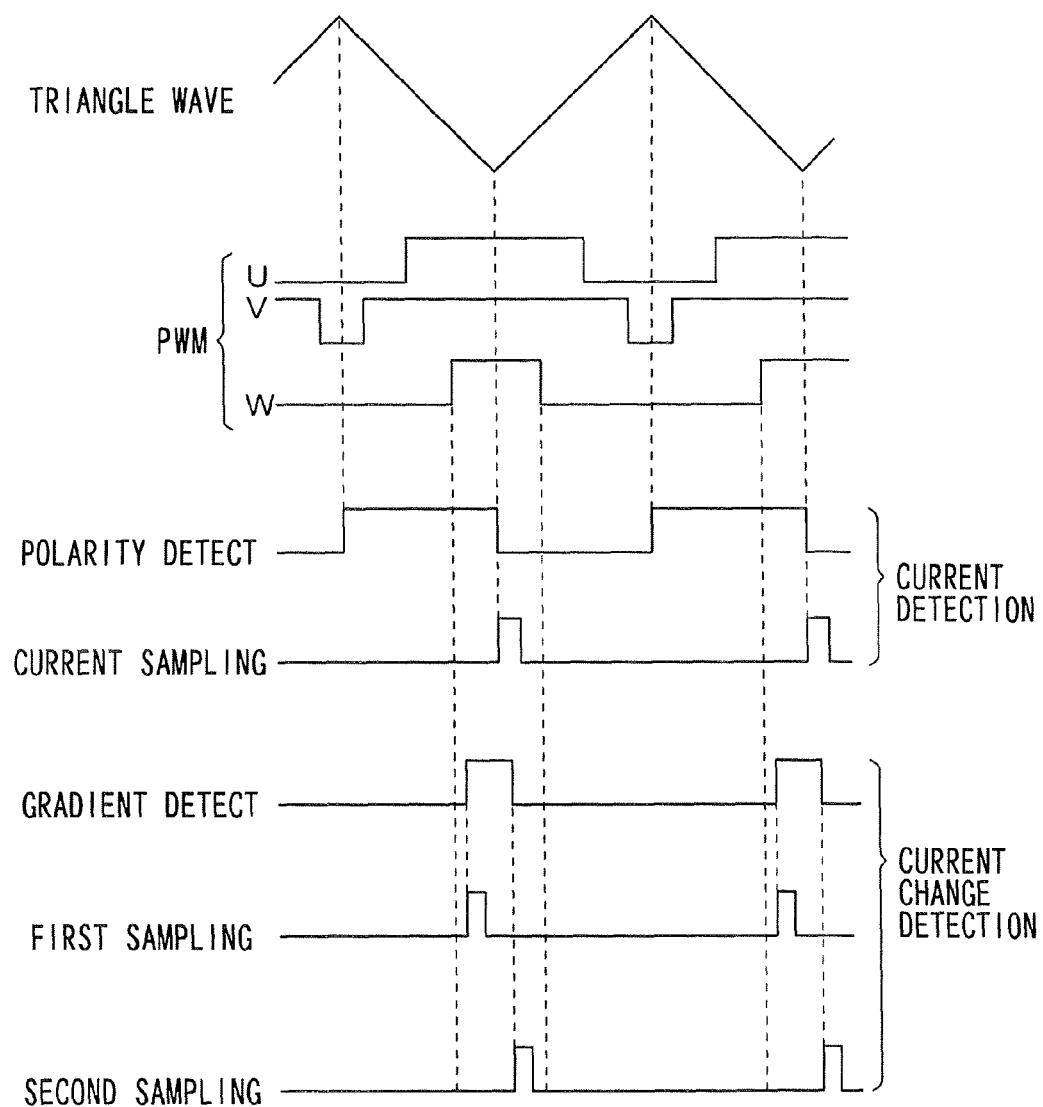
FIG. 29 is a timing chart illustrating a current detection timing and a current change detection timing.

FIG. 29 illustrates a triangle wave signal, ON/OFF conditions of the IGBTs 111b, 111d, and 111f, a polarity detection timing signal, a current sampling pulse, a gradient detection timing signal, a first sampling pulse, and a second sampling pulse.

The triangle wave signal is used as a reference threshold of the PWM control. The polarity detection timing signal is outputted from the microcomputer 105 according to a change between a peak and a trough of the triangle wave signal. The current sampling pulse determines a detection timing of the motor current. According to the eleventh embodiment, the motor current is detected when the current sampling pulse becomes a high level. The gradient detection timing signal is outputted from the microcomputer 105 and used to generate the first and second sampling pulses. The first and second sampling pulses determine a detection timing of the change in the motor current. The first sampling pulse is outputted at a rising edge of the gradient detection timing signal, and the second sampling pulse is outputted at a falling edge of the gradient detection timing signal. A first value of the motor current is held in response to the first sampling pulse, and a second value of the motor current is held in response to the second sampling pulse. Then, the first value is compared with the second value to detect the change in the motor current during a period from when the first sampling pulse is outputted to when the second sampling pulse is outputted. The current sampling pulse, the first sampling pulse, and the second sampling pulse are generated by an external logic circuit (not shown) based on the polarity detection timing signal and the gradient detection timing signal that are outputted from the microcomputer 105. The timing at which the current sampling pulse becomes a high level corresponds to a first determination timing in claims. The timing at which the first and second sampling pulses become a high level corresponds to a second determination timing in claims.

As shown in FIG. 29, the IGBTs 111b, 111d, and 111f are turned ON and OFF at a frequency of the triangle wave signal. At a switching timing at which the IGBTs 111b, 111d, and 111f are turned ON and OFF, a switching surge (i.e., noise) is superimposed on the motor current. Therefore, there is a need to detect the motor current and the change in the motor current at a timing other than the switching timing.

For the above reasons, according to the eleventh embodiment, the motor current and the change in the motor current are detected within a period when all the IGBTs 111b, 111d, and 111f are ON.

Specifically, the current sampling pulse becomes a high level at a falling edge of the polarity detection timing signal. In other words, the current sampling pulse becomes a high level at the trough of the triangle wave signal. The motor current is detected when the current sampling pulse becomes a high level.

As can be seen from FIG. 29, the gradient detection timing signal becomes a high level with a predetermined delay after all phases (i.e., u-phase, v-phase, and w-phase) are turned ON. The gradient detection timing signal is kept high for a predetermined period. Then, after the predetermined period is elapsed, the gradient detection timing signal becomes a low level. The first sampling pulse becomes a high level at the riding edge of the gradient detection timing signal. The motor current is detected when the first sampling pulse becomes a high level. In contrast, the second sampling pulse becomes a high level at the falling edge of the gradient detection timing signal. The motor current is detected when the second sampling pulse becomes a high level. The change in the polarity of the motor current, i.e., the change in the polarity of the induced voltage can be calculated based on a difference between the motor current detected when the first sampling pulse becomes a high level and the motor current detected when the second sampling pulse becomes a high level. Specifically, the change in the polarity of the motor current can be calculated based on the polarity of the difference between the detected motor currents.

Figure 30:
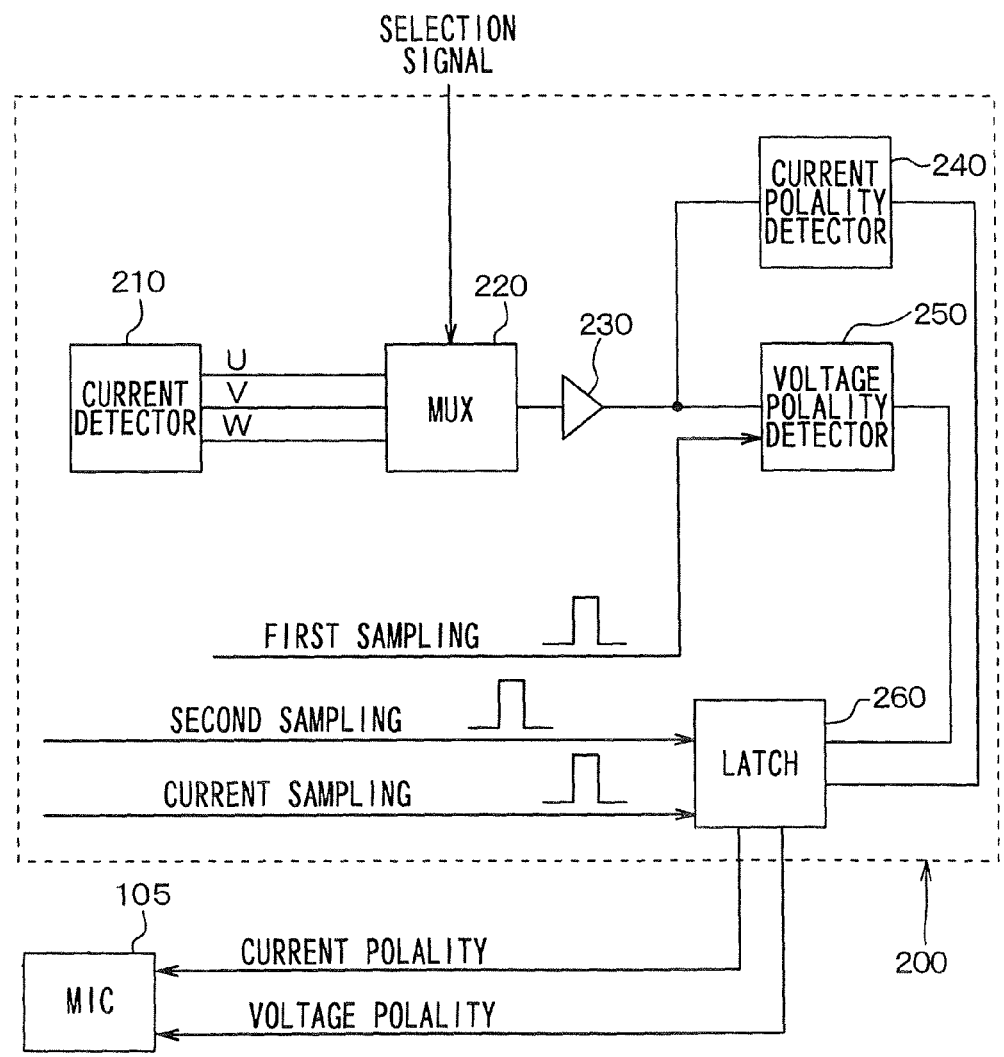
FIG. 30 is a block diagram of a phase detection circuit for allowing the motor current and the change in the motor current to be detected at the timings of FIG. 29.

FIG. 30 is a block diagram of a phase detection circuit 200 for detecting the motor current and the change in the motor current. The phase detection circuit 200 selects one of the three phases (i.e., u-phase, v-phase, and w-phase) based on a selection signal from the microcomputer 105 and detects the motor current and the change in the motor current based on the voltages V1, V2 received from the current detection circuit of the selected phase.

As shown in FIG. 30, the phase detection circuit 200 includes a current detector 210, a multiplexer (MUX) 220, an amplifier 230, a current polarity detector 240, an induced voltage polarity detector 250, and a latch 260.

The current detector 210 outputs a current detection signal corresponding to the voltages V1, V2. The multiplexer 220 selects one of the current detection signals of the three phases and outputs the selected current detection signal. The selected current detection signal is amplified by the amplifier and then inputted to each of the current polarity detector 240 and the induced voltage polarity detector 250.

The current polarity detector 240 detects the polarity of the motor current based on the amplified selected current detection signal. For example, the current polarity detector 240 detects the polarity of the motor current by comparing a voltage indicated by the amplified selected current detection signal with a reference voltage. The current polarity detector 240 generates a first signal depending on the detected polarity of the motor current and outputs the first signal to the latch 260. For example, when the detected polarity of the motor current is a positive, the first signal can be a high level signal, and when the detected polarity of the motor current is a negative, the first signal can be a low level signal.

The induced voltage polarity detector 250 detects the polarity of the induced voltage based on the amplified selected current detection signal. For example, the induced voltage polarity detector 250 can include a capacitor and a comparator. The capacitor starts to be charged based on the amplified selected current detection signal, when the first sampling pulse is outputted. The comparator compares a voltage of the charged capacitor with a voltage indicated by the amplified selected current detection signal. The induced voltage polarity detector 250 detects the polarity of the induced voltage based on whether the voltage of the charged capacitor is greater than the voltage indicated by the amplified selected current detection signal. Then, the induced voltage polarity detector 250 generates a second signal depending on the detected polarity of the induced voltage and outputs the second signal to the latch 260. For example, when the detected polarity of the induced voltage is a positive, the second signal can be a high level signal, and when the detected polarity of the induced voltage is a negative, the second signal can be a low level signal.

The latch 260 holds the first signal outputted from the current polarity detector 240 and outputs the first signal to the microcomputer 105. Likewise, the latch 260 holds the second signal outputted from the induced voltage polarity detector 250 and outputs the second signal to the microcomputer 105. According to the eleventh embodiment, the latch 260 includes two D-latch circuits. One D-latch circuit holds the first signal in response to the current sampling pulse. The other D-latch circuit holds the second signal in response to the second sampling pulse. Thus, the latch 260 outputs the first signal to the microcomputer 105 when the current sampling pulse becomes a high level, and outputs the second signal to the microcomputer 105 when the second sampling pulse becomes a high level. Therefore, the first signal inputted to the microcomputer 105 indicates the polarity of the motor current at the rising edge of the current sampling pulse, i.e., at the peak of the triangle wave signal. The second signal inputted to the microcomputer 105 indicates the result of comparison between the voltage of the capacitor charged during the high level period of the first sampling pulse and the voltage indicated by the amplified selected current detection signal at the rising edge of the second sampling pulse.

In this way, the first signal indicative of the polarity of the motor current and the second signal indicative of the polarity of the induced voltage are inputted to the microcomputer 105. In the microcomputer 105, the commands for PWM controlling the IGBTs 111a-111f are adjusted based on the first signal and the second signal so that the motor current and the induced voltage can be in phase with each other. In such an approach, the power supplied to the three-phase motor 103 can be maximize.

Figure 31:
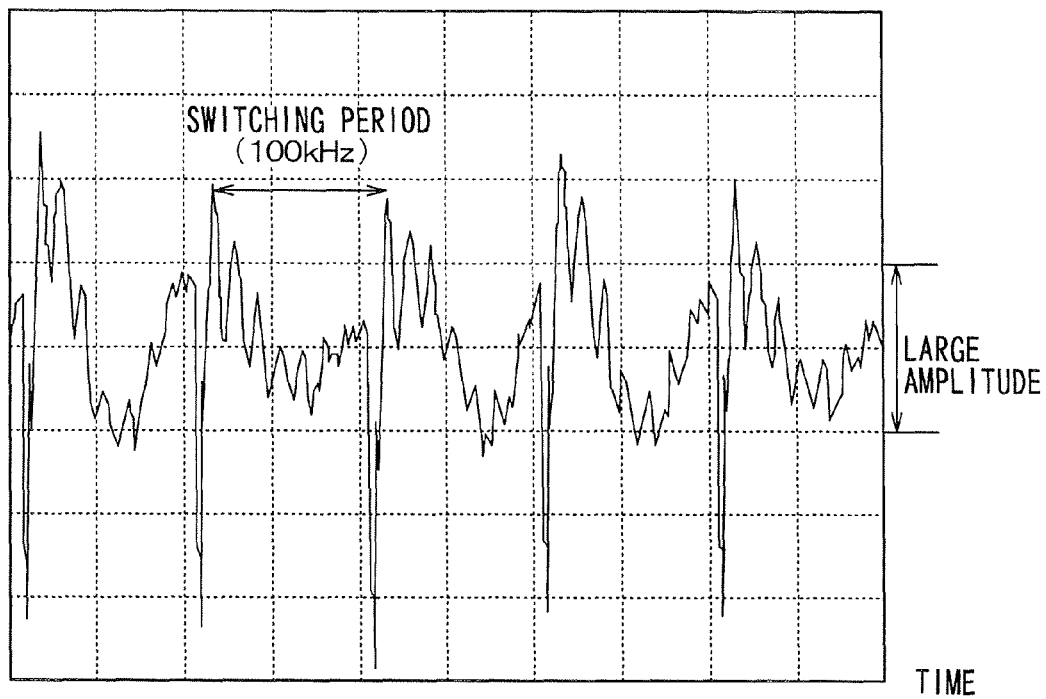
FIG. 31 is a diagram illustrating a waveform of a reference voltage.

In the phase detection circuit 200, a constant voltage (e.g., 5V), which is used as a reference voltage for the amplifier circuit 230, is generated from the voltage Vcc (e.g., 15V) that is generated by the power supply converter 8. The voltage Vcc is generated by stepping down the high voltage supplied from the main power source 104. Specifically, the power supply converter 108 has a power semiconductor element (i.e., power MOSFET 320 shown in FIG. 32) as an output transistor, and the power semiconductor element is turned ON and OFF by PWM control to generate the voltage Vcc. If the voltage Vcc varies due to a switching surge caused by the power semiconductor element of the power supply converter 108, the reference voltage for the amplifier 230 varies as shown in FIG. 31. As can be seen from FIG. 31, the reference voltage varies largely in synchronization with a switching period (e.g., 100 kHz) of the power semiconductor element of the power supply converter 108. Due to the variation in the reference voltage, the current polarity and the induced voltage polarity may be inaccurately detected. To prevent this problem, according to the eleventh embodiment, the switching of the power semiconductor element of the power supply converter 108 is prevented at the timings when the current polarity and the induced voltage polarity are detected.

Figure 32:
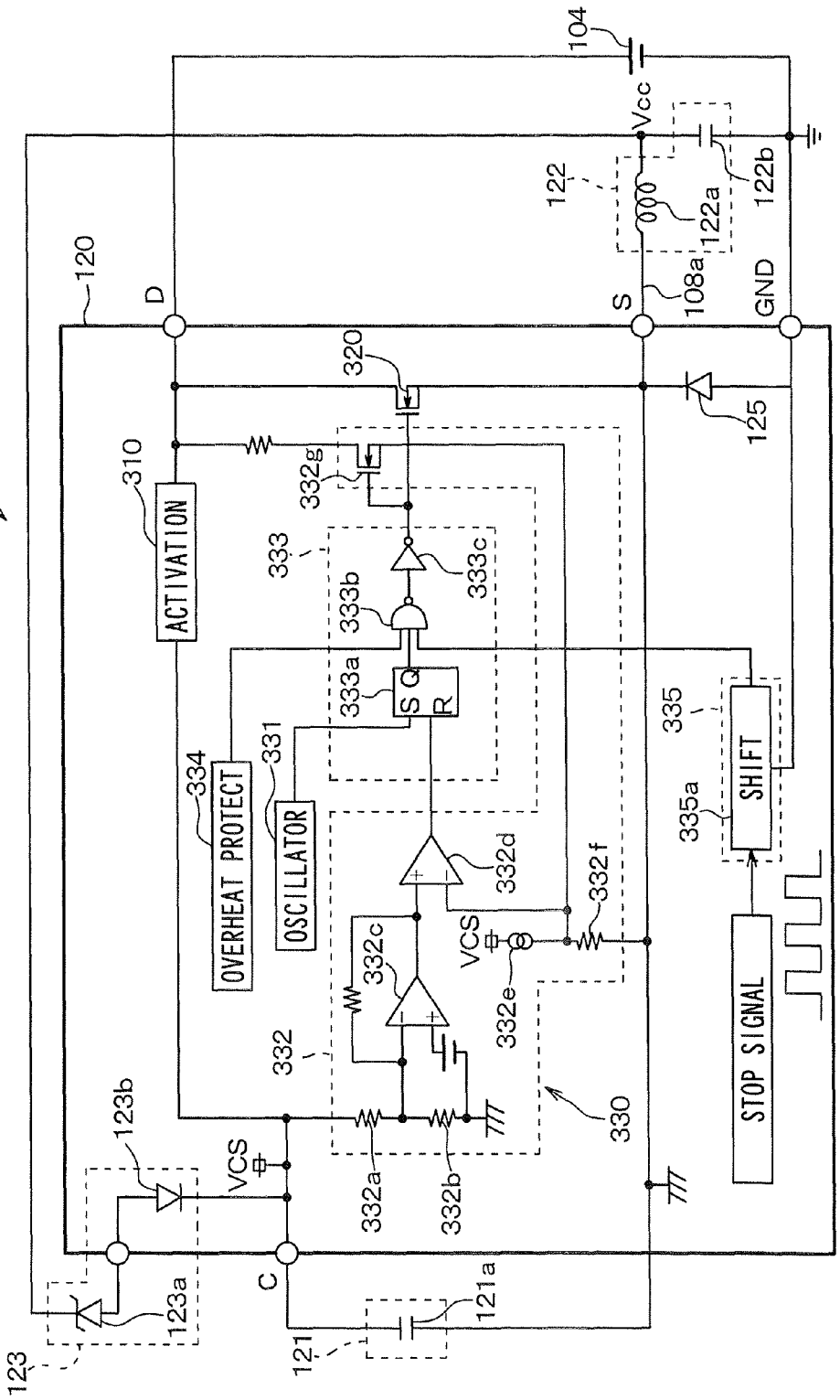
FIG. 32 is a circuit diagram of a power supply converter.
Figure 33:
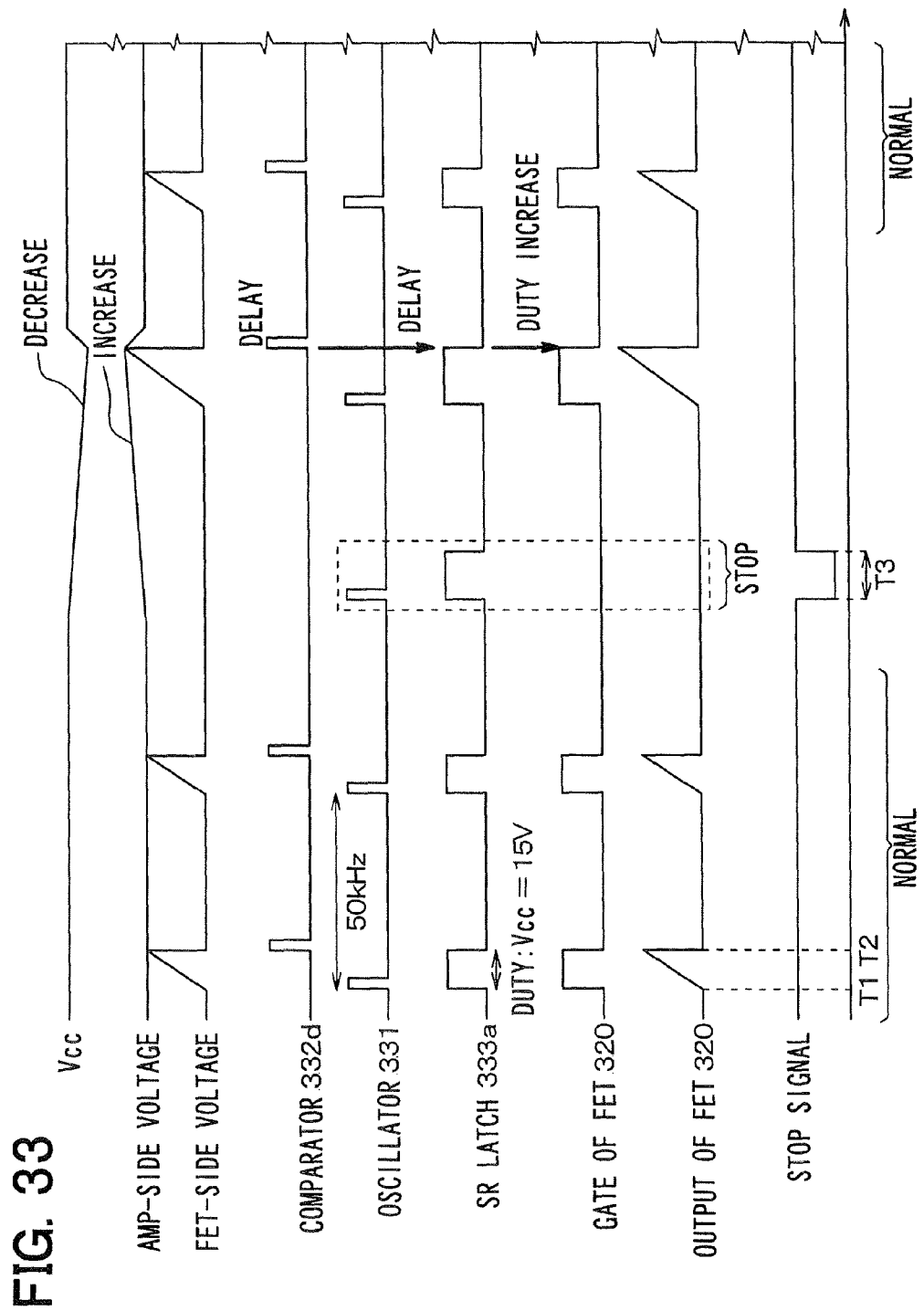
FIG. 33 is a timing chart of the power supply converter.

FIG. 32 is a detailed view of the power supply converter 108, and FIG. 33 is a timing chart of the power supply converter 108.

The power supply converter 108 is a DC-DC converter and generates the voltage Vcc from the high voltage (e.g., 288V) supplied from the main power source 104. Specifically, as shown in FIG. 32, the power supply converter 108 includes an intelligence power device (IPD) 120, a reference voltage generator 121, a smoothing circuit 122, and a monitor voltage generator 123.

The IPD 120 performs control for generating a stable voltage Vcc (e.g., 15V) from the high voltage. As described in detail later, a semiconductor power element incorporated in the IPD 120 is turned ON and OFF to stabilize the voltage Vcc. According to the eleventh embodiment, the IPD 120 has a power MOSFET 320 as the semiconductor power element. When the power supply converter 108 is activated, a drain of the power MOSFET 320 is connected to the main power source 104, and a source of the power MOSFET 320 is connected to the reference voltage generator 121. The IPD 120 has a D-terminal, a S-terminal, and a C-terminal. The D-terminal is connected to the drain of the power MOSFET 320 and serves as a power supply terminal. The S-terminal is connected to the source of the power MOSFET 320 and serves as an output terminal. The C-terminal is connected to the monitor voltage generator 123 so that a monitor voltage generated by the monitor voltage generator 123 can be inputted to the IPD 120. In the IPD 120, the power MOSFET 320 is controlled based on the monitor voltage so that the voltage Vcc can be stabilized. That is, the C-terminal serves as a control terminal for controlling the voltage Vcc.

The reference voltage generator 121 includes a capacitor 121a. The capacitor 121a is connected to a power supply line 108a that is connected to the S-terminal. When the IPD 120 is activated, the capacitor 121a is charged to generate a reference voltage. The reference voltage is used as a reference for the monitor voltage. Further, the reference voltage is used as a power supply voltage for the IPD 120.

The smoothing circuit 122 is configured as a LC circuit including a inductor 122a and a capacitor 122b. The inductor 122a is connected in series with the power supply line 108a. The capacitor 122b is connected in parallel with the power supply line 108a. The smoothing circuit 122 smoothes a voltage of the power supply line 108a to prevent the voltage of the power supply line 108a from varying due to noise. Further, the capacitor 122b is charged to generate the voltage Vcc. A rectifier diode 125 is connected between a high-voltage side of the inductor 122a and a ground (GND) line.

The monitor voltage generator 123 includes a Zener diode 123a and a diode 123b. The monitor voltage generator 123 generates the monitor voltage appearing at the C-terminal of the IPD 120. The monitor voltage depends on the voltage Vcc. Specifically, the monitor voltage is calculated by subtracting a voltage across the Zener diode 123a and a forward voltage Vf of the diode 123b from the voltage Vcc. For example, the monitor voltage can be 6.2V. The IPD 120 determines, based on the monitor voltage, whether the voltage Vcc is a predetermined voltage (e.g., 15V). The power MOSFET 320 is turned ON and OFF based on a result of the determination. In an example shown in FIG. 32, the diode 123b is located in the IPD 120. Alternatively, the diode 123b can be located outside the IPD 120.

In this way, the IPD 120 is configured as a DC-DC converter for generating a stable voltage Vcc from the high voltage supplied from the main power source 104.

Next, the IPD 120 is discussed in detail below. The IPD 120 includes an activation circuit 310, the power MOSFET 320, and a PWM chopper circuit 330.

The activation circuit 310 activates the IPD 120 by generating a predetermined voltage from the high voltage that is applied by the main power source 104 to the D-terminal. Specifically, the activation circuit 310 charges the capacitor 121a of the reference voltage generator 121 based on current supply from an incorporated constant current source, thereby generating the reference voltage. It is noted that the capacitor 121a is connected between the C-terminal and the S-terminal of the IPD 120. When the reference voltage reaches a predetermined value, the current supply from the constant current source is stopped. Thus, the reference voltage having the predetermined value remains applied to the C-terminal and used as an internal power supply voltage VCS for each part of the IPD 120.

The power MOSFET 320 is turned ON and OFF by the PWM chopper circuit 330. Specifically, a gate voltage of the power MOSFET 320 is controlled by the PWM chopper circuit 330 to control an output current of the power MOSFET 320 flowing though the S-terminal. Thus, the voltage Vcc is controlled to a predetermined voltage (e.g., 15V).

The PWM chopper circuit 330 converts the voltage Vcc into a constant voltage by adjusting a pulse width (i.e., duty ratio) of PWM control for the power MOSFET 220. Specifically, the pulse width is adjusted so that the monitor voltage inputted to the C-terminal connected to the PWM chopper circuit 330 can become a predetermined voltage (e.g., 6.2V). For example, the pulse width can be determined by a well-known technique such as detecting a peak of a current flowing through the inductor 122*a*.

Specifically, the PWM chopper circuit 330 includes an oscillator 331, an overcurrent protection circuit 332, a logic circuit 333, an overheat protection circuit 334, and a switching stop circuit 335.

The oscillator 331 outputs a pulse signal having a predetermined period depending on a period of the PWM control. The pulse signal outputted from the oscillator 331 is used as a set signal for a SR latch 333*a*, which is described later. When the PWM control is performed, the power MOSFET 320 is turned ON and OFF with the period of the pulse signal outputted from the oscillator 331.

The overcurrent protection circuit 332 turns OFF the power MOSFET 320, when the output current of the power MOSFET 320 exceeds an overcurrent threshold. According to the eleventh embodiment, the overcurrent protection circuit 332 sets the overcurrent threshold based on the reference voltage inputted to the C-terminal. The overcurrent protection circuit 332 determines that an overcurrent condition occurs, when the output current of the power MOSFET 320 exceeds the overcurrent threshold.

The logic circuit 333 outputs a gate control signal for controlling the gate voltage applied to the gate of the power MOSFET 320 based on logic levels of outputs of the oscillator 331, the overcurrent protection circuit 332, the overheat protection circuit 334, and the switching stop circuit 335.

The overheat protection circuit 334 turns OFF the power MOSFET 320, when an overheat condition is detected. Further, when the overheat condition is removed, the overheat protection circuit 334 allows the power MOSFET 320 to be PWM controlled. According to the eleventh embodiment, when the overheat condition is detected, the overheat protection circuit 334 outputs a low level signal to turn OFF the power MOSFET 320.

The switching stop circuit 335 outputs a switching stop signal for stopping the switching of the power MOSFET 320 in response to a stop command from the microcomputer 105. As mentioned previously, the current polarity detection and the induced voltage polarity detection performed by the phase detection circuit 100 may result in inaccurate results, if the power MOSFET 320 of the power supply converter 108 is switched at the timings of the current polarity detection and the induced voltage polarity detection. To prevent this problem, when the current sampling pulse, the first sampling pulse, and the second sampling pulse are outputted, the microcomputer 105 outputs the stop command to the switching stop circuit 335 so that the switching stop circuit 335 can output the switching stop signal. Specifically, according to the eleventh embodiment, when the output signal of the switching stop circuit 335 becomes a low level, the switching of the power MOSFET 320 is stopped. The switching stop circuit 335 includes a level shifter 335*a*. The output signal of the switching stop circuit 335 is level-shifted to a reference potential of the source of the power MOSFET 320 and then inputted to the IPD 120.

In the IPD 120, the reference voltage inputted to the C-terminal is divided by resistors 332*a* and 332*b*, and the divided reference voltage is converted by an error amplifier 332*c* into an error amp-side voltage that depends on the reference voltage. Specifically, the divided reference voltage is inputted to an inverting input terminal of the error amplifier 332*c*. Therefore, the error amp-side voltage increases with a decrease in the divided reference voltage. The error amp-side voltage is inputted to a non-inverting input terminal of a comparator 332*d*.

A voltage (hereinafter called the "power MOSFET-side voltage") inputted to an inverting input of the comparator 332*d* changes with a current flowing through the power MOSFET 320. A constant current generated by a constant current source 332*e* flows through a resistor 332*f* so that a voltage can occur across the resistor 332*f*. The power MOSFET-side voltage basically depends on the voltage across the resistor 332*f*. A power MOSFET 332*g* is configured as a sense cell for the power MOSFET 320 so that a current flowing though the power MOSFET 332*g* can be proportional to the current flowing through the power MOSFET 320. Further, the current flowing through the power MOSFET 332*g* flows through the resistor 332*f*. Therefore, the power MOSFET-side voltage changes according to the ON and OFF operation of the MOSFET 332*g*, i.e., the ON and OFF operation of the power MOSFET 320.

The comparator 332*d* compares the error amp-side voltage with the power MOSFET-side voltage. If the error amp-side voltage is greater than the power MOSFET-side voltage, the comparator 332*d* outputs a high level signal. In contrast, if the error amp-side voltage is smaller than the power MOSFET-side voltage, the comparator 332*d* outputs a low level signal. Therefore, when the output signal of the comparator 332*d* becomes a high level, it is detected that the overcurrent condition occurs.

It is noted that the output signal of the comparator 332*d* is used as a reset signal for the SR latch 333*a*. When the power MOSFET-side voltage becomes greater than the error amp-side voltage, the SR latch 333*a* is reset so that the voltage Vcc can have a predetermined value (e.g., 15V).

Then, output signals of the SR latch 333*a*, the overheat protection circuit 334, and the switching stop circuit 335 are inputted to an NAND gate 333*b*.

In normal conditions, the output signals of the overheat protection circuit 334 and the switching stop circuit 335 are high. Therefore, an output signal of the NAND gate 333*b* depends on the output signal of the SR latch 333*a*. The output signal of the NAND gate 333*b* is reversed by a NOT gate 333*c* as a driver circuit and then applied to the gate of the power MOSFET 320. Thus, the power MOSFET 320 is turned ON and OFF according to the output signal of the SR latch 333*a*.

In contrast, if at least one of the output signals of the overheat protection circuit 234 and the switching stop circuit 335 becomes a low level, the output signal of the NAND gate 333*b* becomes a high level regardless of whether the output signal of the SR latch 333*a* is high or low. Therefore, the output signal of the driver circuit 333*c* becomes a low level so that the power MOSFET 320 can be turned OFF. Thus, the power MOSFET 320 is turned OFF regardless of whether the output signal of the SR latch 333*a* is high or low.

Operations of the power supply converter 108 are discussed in detail below with reference to FIG. 33.

The power supply converter 108 operates in the normal conditions as follows. At a time T1 where the pulse signal of the oscillator 331 becomes high, the output signal of the comparator 332*d* is low, because the power MOSFET-side voltage is less than the error amp-side voltage. Therefore, the output signal of the NAND gate 333*b* becomes low according to the output signal of the SR latch 333*a*, unless the overheat condition is detected by the overheat protection circuit 334. As a result, the output signal of the driver circuit 333*c* becomes high so that the power MOSFET 320 can be turned ON. Thus, the output current of the power MOSFET 200 increases so that the power MOSFET-side voltage can increase.

Then, at a time T2 where the power MOSFET-side voltage reaches the error amp-side voltage, the output signal of the comparator 332d becomes high. As a result, the SR latch 333a is reset so that the output signal of the SR latch 333a can become low. In this way, the power MOSFET 320 remains ON during the high period of the output signal of the SR latch 333a.

Then, during a time period T3 where the switching stop circuit 335 outputs the switching stop signal in response to the stop command from the microcomputer 105, the output signal of the NAND gate 333b remains low regardless of the output level of the SR latch 333a. As a result, the power MOSFET 320 is kept OFF during the time period T3. In this way, the switching operation of the power MOSFET 320 is stopped by the switching stop signal so as to prevent the power MOSFET 320 from being switched when the polarity of the current and the polarity of the induced voltage are detected.

It is noted that the stopping of the switching operation of the power MOSFET 320 results in a decrease in the voltage Vcc. The voltage of the C-terminal decreases with the decrease in the voltage Vcc so that the error amp-side voltage can increase. Therefore, a period necessary for the power MOSFET-side voltage to reach the error amp-side voltage after an elapse of the period T3 is increased. Accordingly, when the power MOSFET 320 is turned ON after the elapse of the period T3, the power MOSFET 320 is kept ON for an increased time period. Thus, the amount of the decrease in the voltage Vcc is cancelled so that the predetermined voltage can become the average of the voltage Vcc. Therefore, the stopping of the switching of the power MOSFET 320 does not cause new problem.

As described above, according to the eleventh embodiment, the IGBTs 111a-111f are PWM controlled so that the motor current and the induced voltage can be in phase with each other. In such an approach, the power supplied to the three-phase motor 103 can be maximized. Further, the switching of the power MOSFET 320 of the power supply converter 108 is stopped at the timings of the current polarity detection and the induced voltage polarity detection. In such an approach, the current polarity detection and the induced voltage polarity detection are not affected by the switching surge of the power MOSFET 320. Thus, the current polarity detection and the induced voltage polarity detection can be accurately performed.

(Modifications)

The above embodiments can be modified in various ways, for example, as follows.

The SOI substrates 1, 21 can be replaced with another type of substrate such as a simple semiconductor substrate. The structures of the lateral IGBT and the lateral FWD can vary. For example, the resistor layers 14, 30 can be omitted. The other end of the resistor layer 14 can be connected to the emitter electrode 13 instead of the gate electrode 11. The trench structures 1d, 21d can be replaced with another type of isolation structure.

In the embodiments, the lateral IGBT is of n-channel type. Alternatively, the lateral IGBT can be of p-channel type by inverting conductivity types of components (e.g., drift layer 2) of the lateral IGBT.

The semiconductor device can have another type of lateral semiconductor element such as a lateral power MOSFET in addition to or instead of the lateral IGBT and the lateral FWD.

In the embodiments, the sense cell and the sense resistor are provided to the bottom switches. Alternatively, the sense cell and the sense resistor can be provided to the top switches.

In is noted that when the sense cell and the sense resistor are provided to the top switches, a reference ground is needed to detect the current. Therefore, it is preferable that the sense cell and the sense resistor should be provided to the bottom switches.

In the embodiments, the sense resistor is connected to the low side of the sense cell. Alternatively, the sense resistor can be connected to the high side of the sense cell.

In the embodiments, the IGBTs 111a-111f are of lateral type and used as power elements. Alternatively, the IGBTs 111a-111f can be replaced with another type of power element such as a lateral or vertical power MOSFET.

In the embodiments, the inverter circuit 101 is taken as an example. The present invention can be applied to another type of circuit.

The eleventh embodiment can be combined with any of the other embodiments.

In the embodiments, the polarity of the motor current (i.e., phase of the motor current) and the polarity of the induced voltage (i.e., phase of the induced voltage) are detected based on the motor current and the change in the motor current in each phase. Alternatively, the polarity of the motor current and the polarity of the induced voltage can be detected based on a line-to-line current, which is a difference between line currents of two phases of the three phases.

In the embodiments, the microcomputer 105 and the power supply converter 108 are not integrated with the semiconductor device 102. Alternatively, the microcomputer 105 and the power supply converter 108 can be at least partially integrated with the semiconductor device 102 to form a single chip semiconductor device 102.

Such changes and modifications are to be understood as being within the scope of the present invention as defined by the appended claims.

What is claimed is:

1. A semiconductor device having a lateral semiconductor element, the semiconductor device comprising:
    a semiconductor substrate;
    a first electrode on a surface of the substrate;
    a second electrode on the surface of the substrate;
    an isolation structure located in the substrate to divide the substrate into a first island and a second island, the first and second islands electrically insulated from each other; and
    a sense resistor (Rs, Rs1, Rs2), wherein
    the lateral semiconductor element includes a main cell located in the first island and a sense cell located in the second island,
    the main cell causes a first current to flow between the first electrode and the second electrode so that the first current flows in a lateral direction along the surface of the substrate,
    the first current is detected by detecting a second current flowing though the sense cell,
    the sense resistor is connected to the sense cell so that a voltage (V1, V2) is produced by the second current at a connection point between the sense resistor and a sense cell,
    the second circuit is detected based on the voltage, and
    the sense resistor is located at a region that is electrically isolated from the main cell in the sense cell.

2. The semiconductor device according to claim 1, wherein the voltage is at least 0.7 volts.

3. The semiconductor device according to claim 1, wherein
the lateral semiconductor element comprises a lateral switching element and a lateral diode,
the sense resistor comprises a first resistor and a second resistor,
the main cell and the sense cell of the lateral switching element are electrically isolated from each other by the isolation structure,
the main cell and the sense cell of the lateral diode are electrically isolated from each other by the isolation structure,
the first electrode of the lateral switching element is connected to the second electrode of the lateral diode,
the second electrode of the main cell of the lateral switching element and the first electrode of the main cell of the lateral diode are connected through the first resistor to the second electrode of the sense cell of the lateral switching element,
the second electrode of the main cell of the lateral switching element and the first electrode of the main cell of the lateral diode are connected through the second resistor to the first electrode of the sense cell of the lateral diode,
the lateral switching element and the lateral diode are connected in parallel to form a current path,
a change in polarity of an electric current in the current path and a change in the a mount of the electric current are detected based on a first voltage across the first resistor and a second voltage across the second resistor.

4. The semiconductor device according to claim 3, wherein:
the sense cell of the lateral switching element, the sense cell of the lateral diode, and the first sense resistor are arranged in a line.

5. The semiconductor device according to claim 4, wherein:
the first sense resistor and the second sense resistor are located between the sense cell of the lateral switching element and the sense cell of the lateral diode.

6. The semiconductor device according to claim 4, wherein:
the main cell of the lateral switching element is spaced from the main cell of the lateral diode, and
the sense cell of the lateral switching element, the sense cell of the lateral diode, and the first sense resistor are located between the main cell of the lateral switching element and the main cell of the lateral diode.

7. The semiconductor device according to claim 4, further comprising:
a buffer circuit configured to amplify the first voltage and the second voltage, wherein
the main cell of the lateral switching element is spaced from the main cell of the lateral diode, and
the buffer circuit is located between the main cell of the lateral switching element and the main cell of the lateral diode.

8. The semiconductor device according to claim 3, further comprising:
a control circuit configured to turn ON and OFF the lateral switching element, wherein
the control circuit includes a comparator, and
the comparator is constructed with only a CMOS.

9. The semiconductor device according to claim 1, wherein
the main cell is divided to provide another sense cell,
the main cell and the other sense cell are located in the first island, and
the other sense cell is located in the main cell in a predetermined direction.

10. The semiconductor device according to claim 1, wherein
the sense resistor is an external resistor located outside the semiconductor substrate.

11. The semiconductor device according to claim 10, wherein
the sense resistor is located on the surface of the semiconductor substrate.

12. A semiconductor device having a lateral IGBT for controlling supply of an electric current to a load, the semiconductor device comprising:
a semiconductor substrate having a first conductivity-type drift layer;
a second conductivity-type collector region located in a surface portion of the drift layer and having a longitudinal direction;
a second conductivity-type channel layer located in the surface portion of the drift layer and having a straight portion extending parallel to the collector region;
an emitter region located in a surface portion of the channel layer and terminated inside the collector region, the emitter region having a straight portion extending in the longitudinal direction;
a gate insulating layer located on a Channel region of the channel layer, the channel region being located between the emitter region and the drift layer;
a gate electrode located on the gate insulating layer;
a first electrode electrically connected to the collector region; and a second electrode electrically connected to the emitter region and the channel layer, wherein
the emitter region is divided to form a main cell and a sense cell, each of which has the lateral IGBT,
the lateral IGBT of die main cell is configured to control the supply of the electric current to the load,
the lateral IGBT of the sense cell is identical in structure to the lateral IGBT of the main cell and configured as a current detector, and
the main cell is located on each side of the sense cell so that the sense cell is located in the main cell in the longitudinal direction.

13. The semiconductor device according to claim 12, further comprising:
a second conductivity-type body layer located in the channel layer, the body layer having an impurity concentration higher than an impurity concentration of the channel layer, wherein
the body layer is divided into the main cell and the sense cell, and
the body layer of the main cell is junction isolated from the body layer of the sense cell.

14. The semiconductor device according to claim 12, wherein:
the sense cell is located in the center of the main cell in the longitudinal direction.

15. The semiconductor device according to claim 12, further comprising:
a second conductivity type contact layer located in the channel layer, the contact layer having an impurity concentration higher than an impurity concentration of the channel layer, wherein
the contact layer has an isolation layer extending from an end of the contact layer toward an end of the emitter region.

16. The semiconductor device according to claim 12, wherein each of the straight portions of the channel layer and the emitter region is located on each side of the collector region, the channel layer has an ellipse shape with rounded corners that surround ends of the corrector region, the main cell comprises a plurality of main cells that are arranged in a direction perpendicular to the longitudinal direction, and the emitter region of the outermost main cell in the longitudinal direction is divided to form the sense cell.

17. The semiconductor device according to claim 12, further comprising:

a wiring layer located on the semiconductor substrate through an interlayer insulation layer, the wiring layer configured as a top layer of the semiconductor substrate and including a sense wire; and a sense resister electrically connected to the second electrode that is connected to the emitter region of the sense cell, wherein the sense wire is directly electrically connected to each of the second electrode and the sense resistor.

18. The semiconductor device according to claim 17, further comprising:

a collector wire electrically connected to the first electrode that is electrically connected to the collector region, wherein the sense wire extends away from the collector region not to cross the collector wire.

19. The semiconductor device according to claim 17, further comprising:

a main wire electrically connected to the second electrode that is connected to the emitter region of the main cell, wherein the sense resister is connected between the sense wire and the main wire.

20. The semiconductor device according to claim 19, wherein, the sense resister is connected between the sense wire and the main wire on each side of the sense wire.

21. The semiconductor device according to claim 12, wherein, the semiconductor substrate is a SOI substrate including a supporting substrate, a buried oxide layer on the supporting substrate, and an active layer on the buried oxide layer, and the lateral IGBT is formed in the active layer.

22. A current sensor for detecting an electric current in a current path connected to a load, the current sensor comprising:

a power element located in the current path and turned ON and OFF to control the electric current, the electric current flowing through the power element in a forward direction when the power element is turned ON;

a freewheeling diode located in the current path and connected in antiparallel with the power element, the electric current flowing through the freewheeling diode in a backward direction when the power element is turned OFF from ON;

a first sense cell connected to the power element in such a manner that the electric current flowing through the first sense cell is in proportional to the electric current flowing through the power element;

first sense resistor connected in series with the first sense cell;

a second sense cell connected to the freewheeling diode in such a manner that the electric current flowing through the second sense cell is in proportional to the electric current flowing through the freewheeling diode; and a second sense resistor connected in series with the second sense cell.

23. The current sensor according to claim 22, wherein an absolute value and direction of the electric current are detected based on a first voltage across the first sense resistor and a second voltage across the second sense resistor.

24. The current sensor according to claim 23, wherein when the first voltage is positive, and the second voltage is zero, the absolute value is detected based on the first voltage, and the direction is detected as the forward direction, and when the first voltage is zero, and the second voltage is negative, the absolute value is detected based on the second voltage, and the direction is detected as the backward direction.

25. An inverter circuit comprising:

the current sensor defined in claim 22;

a plurality of top switches, each of which has the power element and the freewheeling diode; and a plurality of bottom switches, each of which has the power element and the freewheeling diode, wherein each of the plurality of top switches is connected to a corresponding one of the plurality of bottom switches to form a of phase legs for converting the electric current into an alternating current, and the first sense cell, the first sense resistor, the second sense cell, and the second sense resistor are provided to either the plurality of top switches or the plurality of bottom switches.

26. The inverter circuit according to claim 25, wherein the first sense cell, the first sense resistor, the second sense cell, and the second sense resistor are provided to only the plurality of bottom switches.

27. The inverter circuit according to claim 25, wherein the current sensor, the plurality of top switches, and the plurality of switches are integrated in a common semiconductor substrate and implemented as a single chip.

28. The inverter circuit according to claim 25, further comprising:

a power supply converter including an output transistor and controlling a voltage charged to a reference voltage generator by turning ON and OFF the output transistor so as to generate a predetermined voltage;

a control circuit configured to turn ON and OFF the power element by using the predetermined voltage;

a current polarity detector configured to detect a phase of the electric current by detecting a polarity of the electric current at a first timing;

a voltage polarity detector configured to detect a phase of an induced voltage by detecting a change in the polarity of the electric current at a second timing, the induced voltage produced when the power element is turned ON and OFF; and a switching stop circuit configured to prevent the output transistor from being turned ON and OFF at the first timing and the second timing, wherein the control circuit turns ON and OFF the power element based on the detected phases of the electric current and the induced voltage in such a manner that the electric current and the induced voltage are in phase.

* * * * *